United States Patent
Chino et al.

(10) Patent No.: US 11,942,495 B2
(45) Date of Patent: Mar. 26, 2024

(54) SEMICONDUCTOR DEVICE, IMAGING APPARATUS, AND METHOD FOR MANUFACTURING SEMICONDUCTOR DEVICE

(71) Applicant: SONY SEMICONDUCTOR SOLUTIONS CORPORATION, Kanagawa (JP)

(72) Inventors: Daisuke Chino, Kanagawa (JP); Hiroyuki Shigeta, Kanagawa (JP); Shigekazu Ishii, Kanagawa (JP); Koyo Hosokawa, Kanagawa (JP); Hirohisa Yasukawa, Kanagawa (JP); Mitsuhito Kanatake, Kanagawa (JP); Kosuke Hareyama, Kanagawa (JP); Yutaka Ootaki, Kanagawa (JP); Kiyohisa Sakai, Kanagawa (JP); Atsushi Tsukada, Kanagawa (JP); Hirotaka Kobayashi, Kanagawa (JP); Ninao Sato, Kanagawa (JP); Yuki Yamane, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 487 days.

(21) Appl. No.: 17/250,478

(22) PCT Filed: Jun. 21, 2019

(86) PCT No.: PCT/JP2019/024685
§ 371 (c)(1),
(2) Date: Jan. 26, 2021

(87) PCT Pub. No.: WO2020/026639
PCT Pub. Date: Feb. 6, 2020

(65) Prior Publication Data
US 2021/0233949 A1   Jul. 29, 2021

(30) Foreign Application Priority Data

Aug. 3, 2018   (JP) .................................. 2018-147163

(51) Int. Cl.
*H01L 27/146*   (2006.01)
*H01L 31/024*   (2014.01)

(52) U.S. Cl.
CPC .. *H01L 27/14618* (2013.01); *H01L 27/14636* (2013.01); *H01L 27/14683* (2013.01); *H01L 31/024* (2013.01)

(58) Field of Classification Search
None
See application file for complete search history.

(56) References Cited

U.S. PATENT DOCUMENTS

| 5,552,635 | A  | * | 9/1996 | Kim ........................ H01L 23/42 |
| | | | | 257/E23.09 |
| 6,549,411 | B1 | * | 4/2003 | Herbert ................. H01L 23/367 |
| | | | | 257/E23.102 |

(Continued)

FOREIGN PATENT DOCUMENTS

| CN | 101459167 A | 6/2009 |
| CN | 103634514 A | 3/2014 |

(Continued)

OTHER PUBLICATIONS

International Search Report and Written Opinion of PCT Application No. PCT/JP2019/024685, dated Aug. 27, 2019, 09 pages of ISRWO.

*Primary Examiner* — Evren Seven
(74) *Attorney, Agent, or Firm* — CHIP LAW GROUP

(57) ABSTRACT

A semiconductor device includes a semiconductor chip, a circuit board, a heat releasing plate, an adhesive member, and a conductive member. The circuit board transmits a signal of the semiconductor chip. The heat releasing plate (Continued)

has the semiconductor chip disposed thereon, and has an opening in a region on the outer side of a semiconductor chip placement region that is a region in which the semiconductor chip is disposed. The adhesive member is disposed in a region on the outer side of the opening on a different surface of the heat releasing plate from the surface on which the semiconductor chip is disposed, and bonds the circuit board and the heat releasing plate to each other. The conductive member connects the semiconductor chip and the circuit board to each other via the opening.

26 Claims, 43 Drawing Sheets

(56) References Cited

U.S. PATENT DOCUMENTS

| | | | | |
|---|---|---|---|---|
| 6,882,041 | B1* | 4/2005 | Cheah | H01L 23/3737 257/667 |
| 8,786,084 | B2* | 7/2014 | Coffy | H01L 24/97 257/676 |
| 11,646,302 | B2* | 5/2023 | Chen | H01L 23/24 257/680 |
| 2005/0184404 | A1* | 8/2005 | Huang | H01L 31/0203 257/E31.117 |
| 2006/0234023 | A1 | 10/2006 | Endou et al. | |
| 2007/0040261 | A1* | 2/2007 | Hetzel | H01L 23/3128 257/E25.023 |
| 2008/0266808 | A1* | 10/2008 | Aberg | H01L 23/4338 361/709 |
| 2009/0153684 | A1 | 6/2009 | Yoshida et al. | |
| 2011/0149537 | A1* | 6/2011 | Kurosawa | H01L 23/3675 361/760 |
| 2014/0055670 | A1 | 2/2014 | Hongo | |
| 2016/0155927 | A1 | 6/2016 | Kabasawa et al. | |
| 2016/0372441 | A1 | 12/2016 | Kobayashi et al. | |
| 2017/0280561 | A1* | 9/2017 | Haney | H05K 1/0218 |
| 2017/0309756 | A1* | 10/2017 | Hokari | H01L 27/14683 |
| 2018/0047697 | A1* | 2/2018 | Lüdeke | H01L 24/84 |

FOREIGN PATENT DOCUMENTS

| | | |
|---|---|---|
| CN | 105247331 A | 1/2016 |
| EP | 1720203 A2 | 11/2006 |
| EP | 2993442 A1 | 3/2016 |
| JP | 2007-59862 A | 3/2007 |
| JP | 2009-147685 A | 7/2009 |
| JP | 2014-45304 A | 3/2014 |
| JP | 2017-10994 A | 1/2017 |
| KR | 10-2006-0110219 A | 10/2006 |
| TW | 200644757 A | 12/2006 |
| TW | 200931953 A | 7/2009 |
| WO | 2014/178163 A1 | 11/2014 |
| WO | 2016/052217 A1 | 4/2016 |

* cited by examiner

SEMICONDUCTOR DEVICE, IMAGING APPARATUS, AND METHOD FOR MANUFACTURING SEMICONDUCTOR DEVICE

CROSS REFERENCE TO RELATED APPLICATIONS

This application is a U.S. National Phase of International Patent Application No. PCT/JP2019/024685 filed on Jun. 21, 2019, which claims priority benefit of Japanese Patent Application No. JP 2018-147163 filed in the Japan Patent Office on Aug. 3, 2018. Each of the above-referenced applications is hereby incorporated herein by reference in its entirety.

TECHNICAL FIELD

The present disclosure relates to a semiconductor device, an imaging apparatus, and a method for manufacturing the semiconductor device. More particularly, the present disclosure relates to a semiconductor device in which a heat releasing plate and a circuit board are disposed, an imaging apparatus, and a method for manufacturing the semiconductor device.

BACKGROUND ART

Conventionally, an imaging apparatus that is a semiconductor device containing a semiconductor chip such as an imaging device is used. In this imaging apparatus, the amount of heat generated by the imaging device is increasing due to an increase in the number of pixels and an increase in speed, and therefore, it is necessary to improve the heat release properties of the imaging device. On the other hand, to make the imaging device smaller in size, the circuit board connected to the imaging device needs to be disposed in the vicinity of the imaging device. Therefore, a semiconductor device in which a semiconductor chip is mounted on the front surface of a heat releasing plate including a metal or the like, and a circuit board is disposed on the back surface of the heat releasing plate is used (see Patent Document 1, for example).

In this semiconductor device, the semiconductor chip is die-bonded to the front surface of the heat releasing plate, and a circuit board is bonded to and disposed on the back surface of the heat releasing plate. The semiconductor chip and the circuit board are connected by wire bonding via holes formed in the heat releasing plate. Further, the semiconductor chip is enclosed and sealed in a cap and a cover glass bonded to the heat releasing plate, and thus, is designed as a semiconductor package.

CITATION LIST

Patent Document

Patent Document 1: WO 2016/052217 A

SUMMARY OF THE INVENTION

Problems to be Solved by the Invention

The conventional technology described above has a problem that the semiconductor chip is deformed. The circuit board includes an organic material or the like, and has a relatively large thermal expansion coefficient. Therefore, the circuit board expands and contracts with changes in ambient temperature. On the other hand, the semiconductor chip and the like have a relatively small thermal expansion coefficient, and therefore, a difference in expansion and contraction causes warpage of the semiconductor device. As a result, the semiconductor chip is deformed. The semiconductor chip is also warped by changes in the pressure in the semiconductor package. In the imaging apparatus using the imaging device, a captured image is distorted, and image quality is degraded.

The present disclosure has been made in view of the above problems, and aims to prevent deformation of a semiconductor chip in a semiconductor device in which a heat releasing plate and a circuit board are disposed.

Solutions to Problems

The present disclosure has been made to solve the above problems, and a first aspect thereof is a semiconductor device that includes: a semiconductor chip; a circuit board that transmits a signal of the semiconductor chip; a heat releasing plate on which the semiconductor chip is disposed, the heat releasing plate having an opening in a region on the outer side of a semiconductor chip placement region, the semiconductor chip placement region being the region in which the semiconductor chip is disposed; an adhesive member that bonds the circuit board and the heat releasing plate to each other, the adhesive member being disposed in a region on the outer side of the opening on a surface of the heat releasing plate, the surface of the heat releasing plate being different from the surface on which the semiconductor chip is disposed; and a conductive member that connects the semiconductor chip and the circuit board to each other via the opening.

Also, in the first aspect, an air gap may be formed between the heat releasing plate and the circuit board.

Further, in the first aspect, the circuit board may include an electronic circuit that receives and transmits the transmitted signal.

Also, in the first aspect, the circuit board may contain an element forming the electronic circuit.

Further, in the first aspect, the circuit board may have a recess in which an element forming the electronic circuit is disposed.

Also, in the first aspect, the circuit board may have the recess having an opening in a surface close to the heat releasing plate.

Further, in the first aspect, the semiconductor device may further include a lid unit that is bonded to the heat releasing plate and covers the semiconductor chip.

Also, in the first aspect, the semiconductor device may further include a lid locking portion that locks the semiconductor chip placement region to the lid unit.

Further, in the first aspect, the heat releasing plate may have the semiconductor chip placement region in contact with the circuit board.

Also, in the first aspect, the semiconductor device may further include: a lid unit that is bonded to the heat releasing plate and covers the semiconductor chip; and an elastic member that is disposed between the lid unit and the heat releasing plate, and presses the heat releasing plate, to bring the semiconductor chip placement region into contact with the circuit board.

Further, in the first aspect, the heat releasing plate may have a beam portion that is the region connecting a region on the outer side of the opening and a region on the inner side of the opening, the beam portion being obliquely positioned to bring the semiconductor chip placement region into contact with the circuit board.

Also, in the first aspect, the heat releasing plate may include a protrusion that locks the semiconductor chip placement region to the circuit board, to bring the semiconductor chip placement region into contact with the circuit board.

Further, in the first aspect, the circuit board may have a thick-film pad having a shape protruding from a surface, and the conductive member may be connected to the thick-film pad.

Also, in the first aspect, the conductive member may be formed with a metallic wire.

Further, in the first aspect, the semiconductor device may further include a protective portion disposed on at least one of the connecting portion between the conductive member and the semiconductor chip, or the connecting portion between the conductive member and the circuit board.

Also, in the first aspect, the conductive member may be connected to the semiconductor chip after being connected to the circuit board.

Further, in the first aspect, the conductive member may be formed with a flexible wiring plate.

Also, in the first aspect, the semiconductor device may further include a circuit board locking portion that locks the semiconductor chip placement region to the circuit board.

Further, in the first aspect, the heat releasing plate may have a heat releasing portion disposed on a different surface from the surface on which the semiconductor chip is disposed in the semiconductor chip placement region.

Also, in the first aspect, the heat releasing portion may be formed with a plurality of irregularities formed on the heat releasing plate.

Further, in the first aspect, the heat releasing portion may be formed by roughening a surface of the heat releasing plate.

Also, in the first aspect, the heat releasing plate may have a blackened portion formed on a surface thereof.

Further, in the first aspect, the circuit board may have a blackened portion formed on the surface facing the heat releasing plate.

Also, in the first aspect, the heat releasing plate may further have a second opening in the region in which the semiconductor chip is disposed.

Further, in the first aspect, the heat releasing plate may further include a vibration damping portion that reduces vibration of the semiconductor chip placement region.

Also, in the first aspect, the semiconductor device may further include a buffer portion disposed between the semiconductor chip placement region and the circuit board.

Further, a second aspect of the present disclosure is an imaging apparatus that includes: an imaging device; a circuit board that transmits a signal of the imaging device; a heat releasing plate on which the imaging device is disposed, the heat releasing plate having an opening in a region on the outer side of a semiconductor chip placement region, the semiconductor chip placement region being the region in which the imaging device is disposed; an adhesive member that bonds the circuit board and the heat releasing plate to each other, the adhesive member being disposed in a region on the outer side of the opening on a surface of the heat releasing plate, the surface of the heat releasing plate being different from the surface on which the imaging device is disposed; and a conductive member that connects the imaging device and the circuit board to each other via the opening.

Further, a third aspect of the present disclosure is a method for manufacturing a semiconductor device, and the method includes: a bonding step of bonding a circuit board and a heat releasing plate with an adhesive member, the circuit board exchanging signals with a semiconductor chip, the semiconductor chip being disposed on the heat releasing plate, the heat releasing plate having an opening in a region on the outer side of the region in which the semiconductor chip is disposed, the adhesive member being disposed in a region on the outer side of the opening on a different surface of the heat releasing plate from the surface on which the semiconductor chip is disposed; a semiconductor chip placing step of placing the semiconductor chip on the bonded heat releasing plate; and a connecting step of connecting the semiconductor chip and the circuit board with a conductive member via the opening.

Effects of the Invention

According to the present disclosure, it is possible to achieve a great effect to prevent deformation of a semiconductor chip in a semiconductor device in which a heat releasing plate and a circuit board are disposed.

MODES FOR CARRYING OUT THE INVENTION

Figure 1:
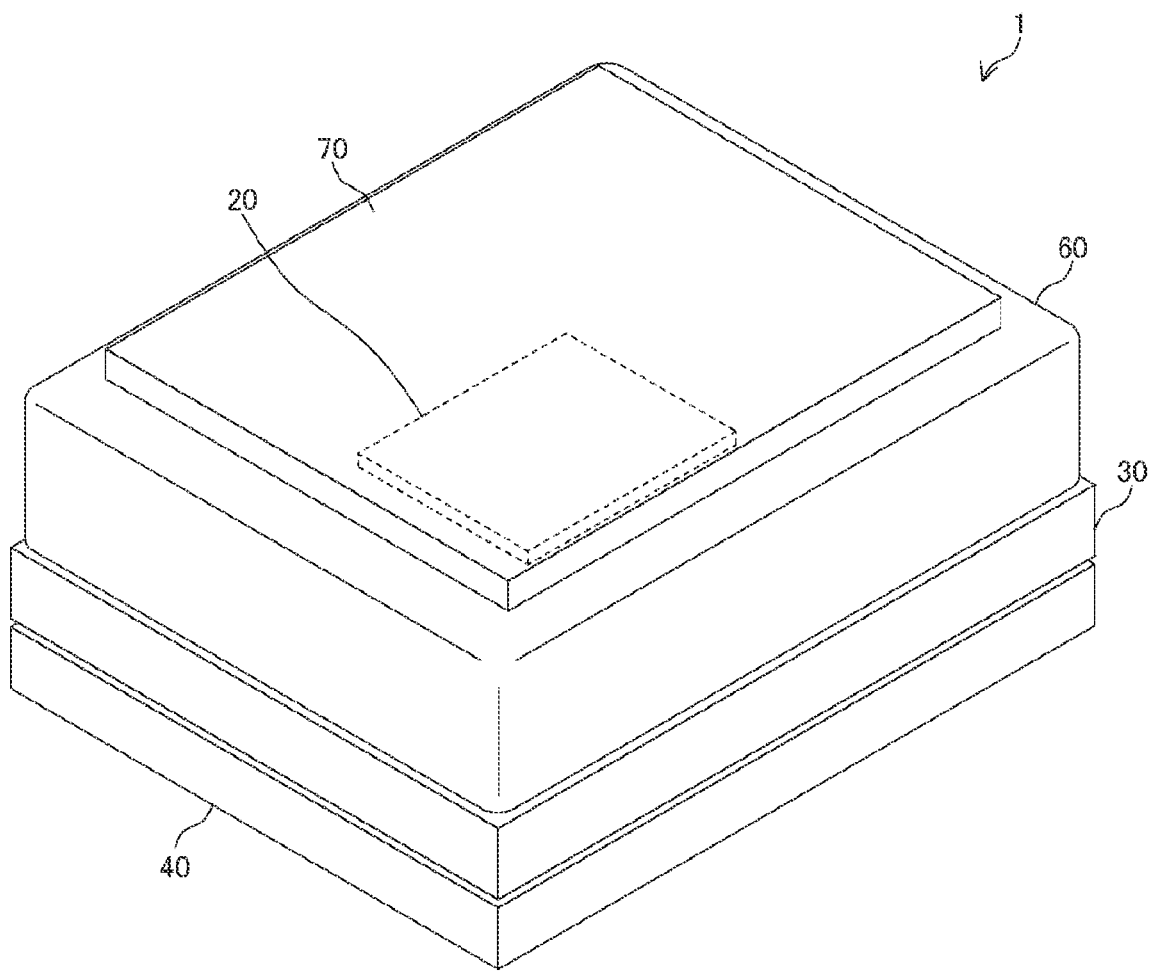
FIG. 1 is a diagram showing an example configuration of an imaging apparatus according to an embodiment of the present disclosure.

Next, modes for carrying out the present disclosure (the modes will be hereinafter referred to as embodiments) are described with reference to the drawings. In the drawings mentioned below, the same or similar components are denoted by the same or similar reference numerals. However, the drawings are schematic, and the dimensional ratios and the like of the respective components do not always match the actual ones. Further, it is needless to say that the dimensional relationships and ratios may differ between the drawings. Further, explanation of the embodiments will be made in the following order.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment 10. Tenth Embodiment
11. Eleventh Embodiment
12. Twelfth Embodiment
13. Thirteenth Embodiment
14. Fourteenth Embodiment
Fifteenth Embodiment
16. Sixteenth Embodiment
17. Seventeenth Embodiment
18. Eighteenth Embodiment
19. Nineteenth Embodiment
20. Configuration of an imaging device
21. Example application to a camera 1. First Embodiment

[External Shape of an Imaging Apparatus]

FIG. 1 is a diagram showing an example configuration of an imaging apparatus according to an embodiment of the present disclosure. This drawing is a diagram showing an example of the external shape of an imaging apparatus 1 including an imaging device as a semiconductor chip. A semiconductor device according to the present disclosure is now described, with the imaging apparatus 1 in the drawing being taken as an example. The imaging apparatus 1 in the drawing has an imaging device 20 enclosed in a semiconductor package. In this semiconductor package, a heat releasing plate 30 and a circuit board 40 are stacked, and the imaging device 20 is mounted on the heat releasing plate 30. A frame 60 and a cover glass 70 constitute a lid unit, and are arranged so as to cover the imaging device 20. The circuit board 40 and the heat releasing plate 30 are bonded to each other with an adhesive member 11 (not shown).

[Configuration of an Imaging Apparatus]

Figure 2:
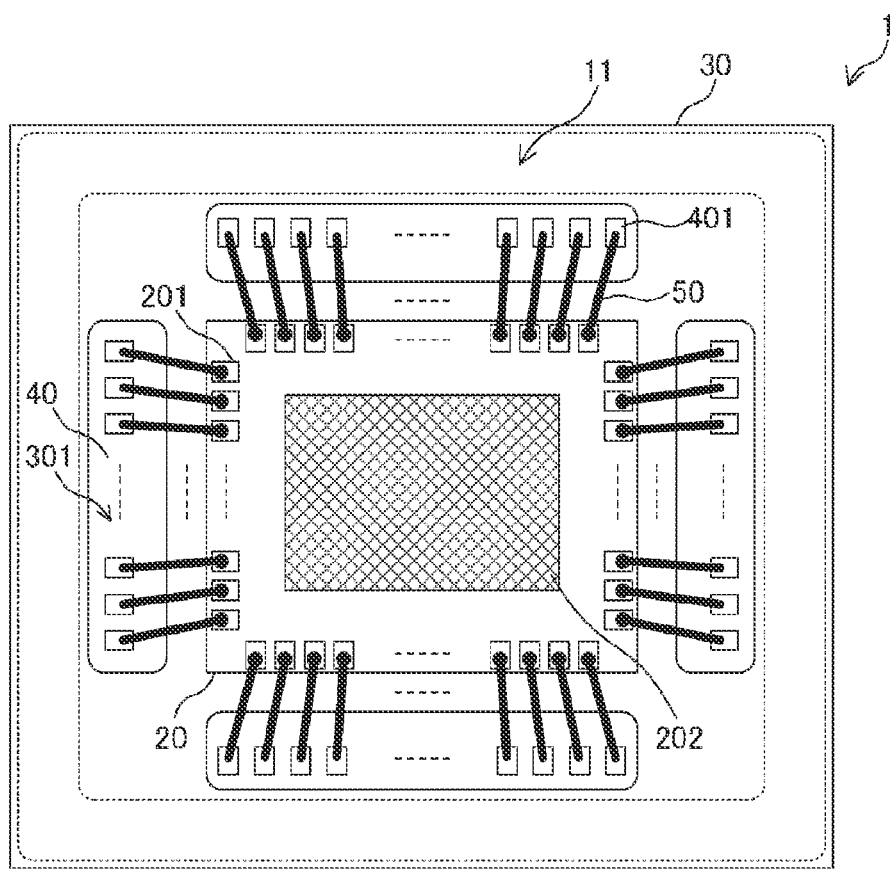
FIG. 2 is a plan view showing an example configuration of an imaging apparatus according to a first embodiment of the present disclosure.

FIG. 2 is a plan view showing an example configuration of an imaging apparatus according to a first embodiment of the present disclosure. This drawing is a diagram showing example configurations of the circuit board 40, the heat releasing plate 30, and the imaging device 20.

The imaging device 20 is a semiconductor device that captures an image of an object, and is a semiconductor device formed in the shape of a semiconductor chip. In this imaging device 20, pixels that generate image signals depending on light from the object are arranged in a two-dimensional grid pattern. The plurality of pixels forms a pixel array unit 202. The pixels generate and output image signals on the basis of an input control signal. The control signal is input from the circuit board 40 to the imaging device 20, and the image signals are output from the imaging device 20 to the circuit board 40. Pads 201 that are electrodes for transmitting signals are disposed around the imaging device 20. Note that the imaging device 20 is an example of the semiconductor chip disclosed in the claims.

The heat releasing plate 30 has the imaging device 20 disposed thereon, and releases heat from the imaging device 20. As will be described later, the imaging device 20 can be disposed on (bonded to) the heat releasing plate 30 by die bonding. The imaging device 20 generates heat during operation. Particularly, in a high-resolution imaging device 20, it is necessary to generate and output, at high speed, image signals generated by a large number of pixels, which leads to an increase in power consumption. As a result, the amount of heat generated by the imaging device 20 increases. Therefore, the imaging device 20 is disposed on the heat releasing plate 30 for heat release, so that the imaging device 20 can be cooled. Meanwhile, the imaging device 20 and the circuit board 40 need to exchange signals. This signal exchange can be performed through openings 301 formed in the heat releasing plate 30. This drawing shows an example in which four openings 301 are formed along the sides of the imaging device 20.

The four openings 301 separate the region in which the imaging device 20 is disposed from the peripheral portions, and the region in the heat releasing plate 30 in which the imaging device 20 is disposed is suspended by four beam-like regions. Hereinafter, the region in the heat releasing plate 30 in which the imaging device 20 is disposed will be referred to as the semiconductor chip placement region. The heat releasing plate 30 preferably includes a metal such as copper (Cu). This is because a metal has a relatively low thermal resistance, and heat release properties will improve accordingly. Note that the heat releasing plate 30 can also include a resin.

As described above, the circuit board 40 transmits signals such as control signals and image signals to the imaging device A semiconductor device such as the imaging device 20 is used while being connected to electronic circuits, and exchanges signals with the electronic circuits. In the imaging device 20, a control signal generated by a control circuit is input to the pixels, and the image signals output from the pixels are processed by a processing circuit. The control circuit and the processing circuit correspond to the electronic circuits. Such electronic circuits can be mounted on the circuit board 40. Also, signals may be relayed between the imaging device 20, and the control circuit and the processing circuit disposed outside the imaging apparatus 1, for example. Like the imaging device the circuit board 40 also has pads (pads 401) disposed thereon. The pads 201 and the pads 401 can be connected by conductive wires 50. The circuit board 40 may be a circuit board formed by stacking an insulating layer including a resin such as epoxy or ceramics and a wiring layer including a metal such as Cu, for example. Signals are transmitted through this wiring layer.

The adhesive member 11 bonds the circuit board 40 to the heat releasing plate 30. This adhesive member 11 is disposed in a region on the outer side of the openings 301 in the heat releasing plate 30, to perform bonding. The adhesive member 11 may be an adhesive such as resin, for example. Note that the drawing shows an example in which the adhesive member 11 is disposed on the entire circumference of the edge portion of the heat releasing plate 30.

The conductive wires 50 electrically connect the imaging device 20 and the circuit board 40. The conductive wires 50 connect the pads 201 of the imaging device 20 to the pads 401 of the circuit board 40 via the openings 301 of the heat releasing plate 30. The conductive wires 50 may be formed with gold (Au) wires, for example. Also, the connecting of the conductive wires 50 can be performed by wire bonding, for example. The conductive wires 50 connect the pads 201 and the pads 401 on a one-on-one basis. Note that the conductive wires 50 are an example of the conductive member disclosed in the claims.

Figure 3:
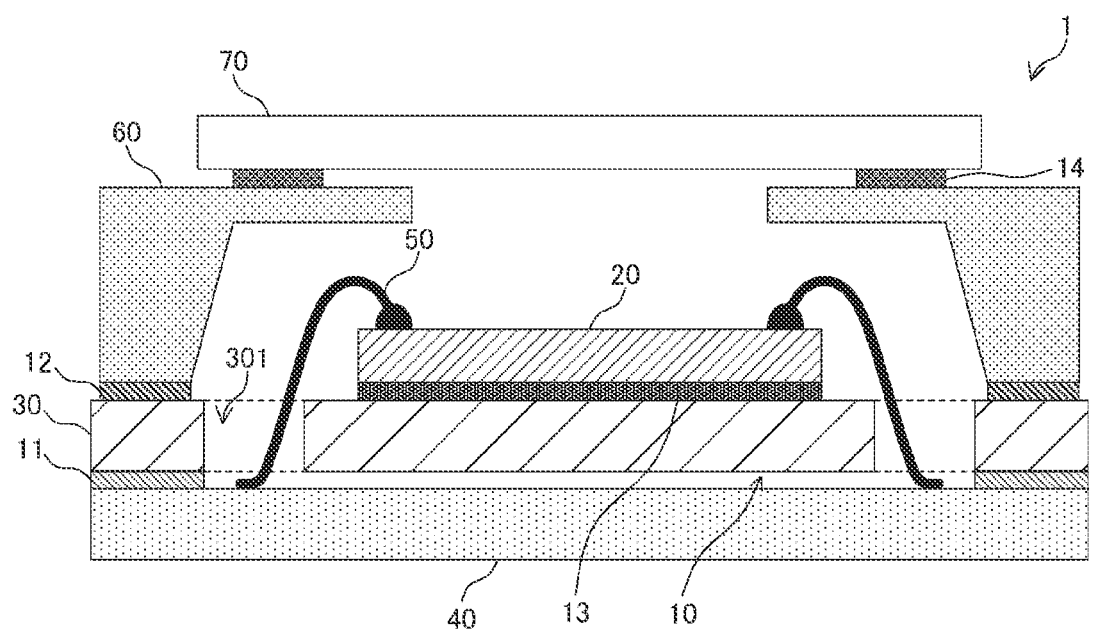
FIG. 3 is a cross-sectional view showing an example configuration of an imaging apparatus according to the first embodiment of the present disclosure.

FIG. 3 is a cross-sectional view showing an example configuration of an imaging apparatus according to the first embodiment of the present disclosure. This drawing is a cross-sectional view showing an example configuration of the imaging apparatus 1. As shown in the drawing, the imaging device 20 is bonded to and disposed on the heat releasing plate 30 with a die bond material 13.

The frame 60 is formed in the shape of a wall surrounding the imaging device 20, and seals the imaging device 20 together with the cover glass 70. This frame 60 is bonded to the heat releasing plate 30 with an adhesive 12. The frame 60 can include a metal or a resin.

The cover glass 70 is a transparent plate that seals the imaging device 20. Light from the object is emitted to the imaging device 20 through the cover glass 70. The cover glass 70 and the frame 60 are bonded to each other with an adhesive 14.

In this manner, the circuit board 40, the heat releasing plate 30, the frame 60, and the cover glass 70 constitute a semiconductor package having a sealed structure. With this semiconductor package, the imaging device 20 can be hermetically sealed.

As shown in the drawing, the openings 301 are formed in the heat releasing plate 30 on the outer side of the semiconductor chip placement region. Further, the adhesive member 11 is disposed on the surface on which the imaging device 20 is not disposed on the heat releasing plate 30 on the outer side of the region in which the openings 301 are formed, and the circuit board 40 and the heat releasing plate 30 are bonded to each other. Therefore, the heat releasing plate 30 and the circuit board 40 are disposed in a non-fixed state in the region to which the imaging device 20 is bonded. That is, in the vicinity of the region to which the imaging device 20 is bonded, the heat releasing plate 30 is placed movably with respect to the circuit board 40. The drawing also shows an example in which an air gap 10 is formed between the heat releasing plate 30 and the circuit board 40 in the vicinity of the region to which the imaging device 20 is bonded. This air gap 10 is a gap formed depending on the thickness and the like of the adhesive member 11, and may have a thickness of 20 µm, for example.

[Method for Manufacturing an Imaging Apparatus]

FIGS. 4A, 4B, 4C, 4D, 5A, and 5B are diagrams showing an example of a method for manufacturing an imaging apparatus according to the first embodiment of the present disclosure. FIGS. 4A, 4B, 4C, 4D, 5A, and 5B are diagrams showing the process of manufacturing the imaging apparatus 1.

Figure 4A:
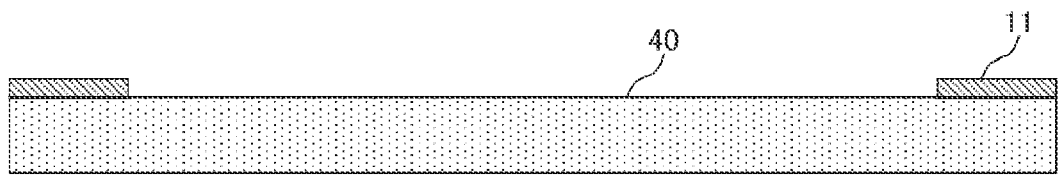
FIGS. 4A, 4B, 4C, and 4D are diagrams showing an example of a method for manufacturing an imaging apparatus according to the first embodiment of the present disclosure.
Figure 4B:
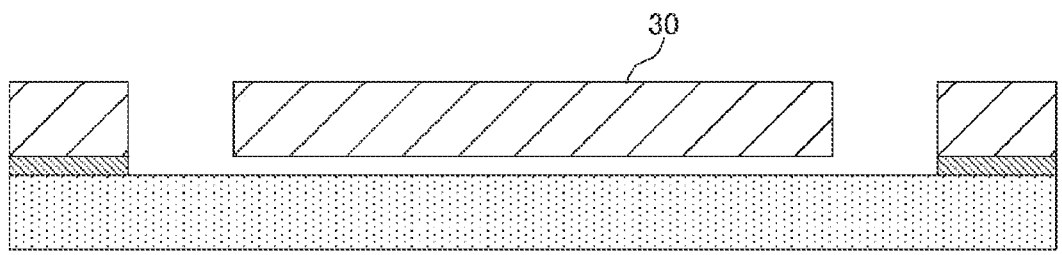

First, the adhesive member 11 is disposed on the circuit board 40. At this stage, the adhesive member 11 is disposed in the region on the outer side of the openings 301 of the heat releasing plate 30 (FIG. 4A). Next, the heat releasing plate 30 is placed on top of the adhesive member 11, to harden the adhesive member 11 (FIG. 4B). As a result, the circuit board 40 and the heat releasing plate 30 are bonded to each other. This process corresponds to a bonding process.

Figure 4C:
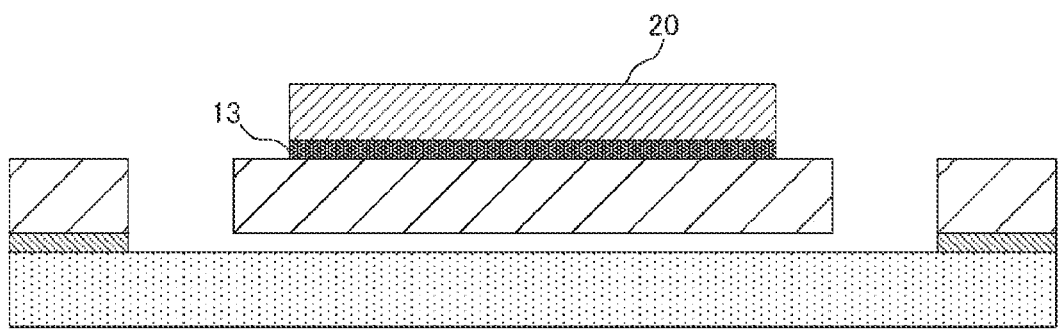

Next, the imaging device 20 is disposed on the heat releasing plate 30. This can be done by bonding the imaging device 20 to the heat releasing plate 30 with the die bond material 13 (FIG. 4C). This process corresponds to a semiconductor chip placement process.

Figure 4D:
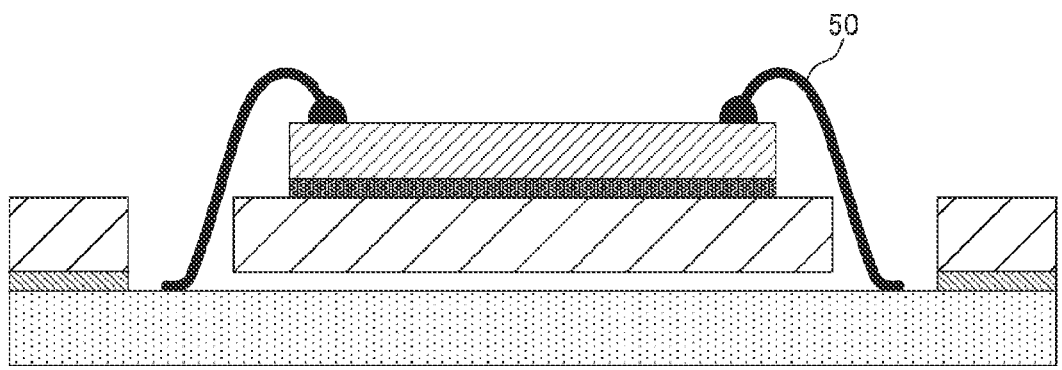

Next, the imaging device 20 and the circuit board 40 are connected to each other with the conductive wires 50 via the openings 301. This can be done by performing wire bonding (FIG. 4D). This process corresponds to a connecting process.

Figure 5A:
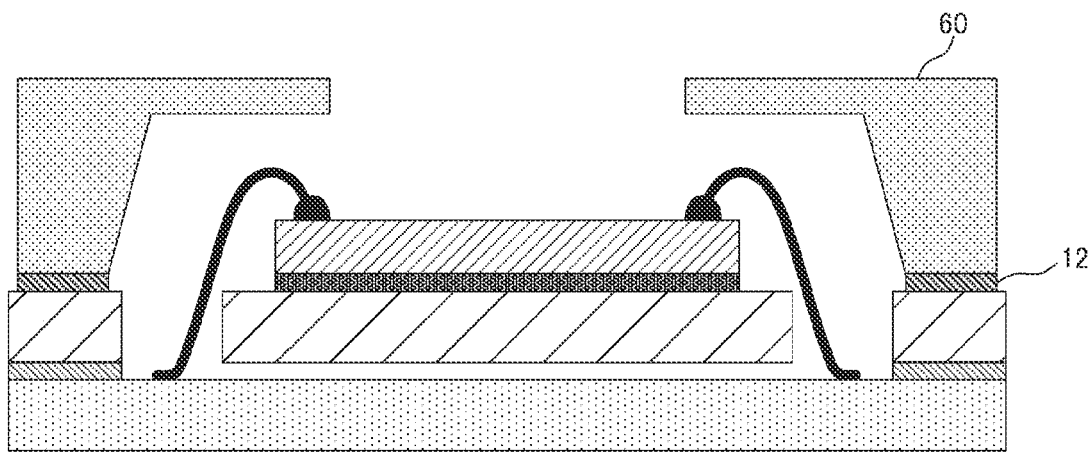
FIGS. 5A and 5B are diagrams showing an example of a method for manufacturing an imaging apparatus according to the first embodiment of the present disclosure.
Figure 5B:
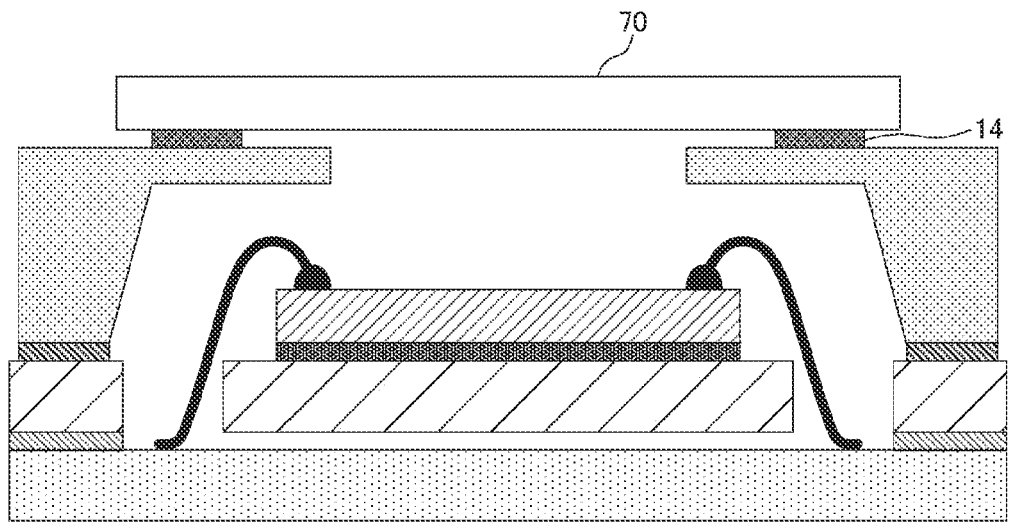

Next, the frame 60 is bonded to the heat releasing plate 30 with the adhesive 12 (FIG. 5A). Next, the cover glass 70 is bonded to the frame 60 with the adhesive 14 (FIG. 5B). Through the process described above, the imaging apparatus 1 can be manufactured.

[Wire Bonding Method]

Figure 6:
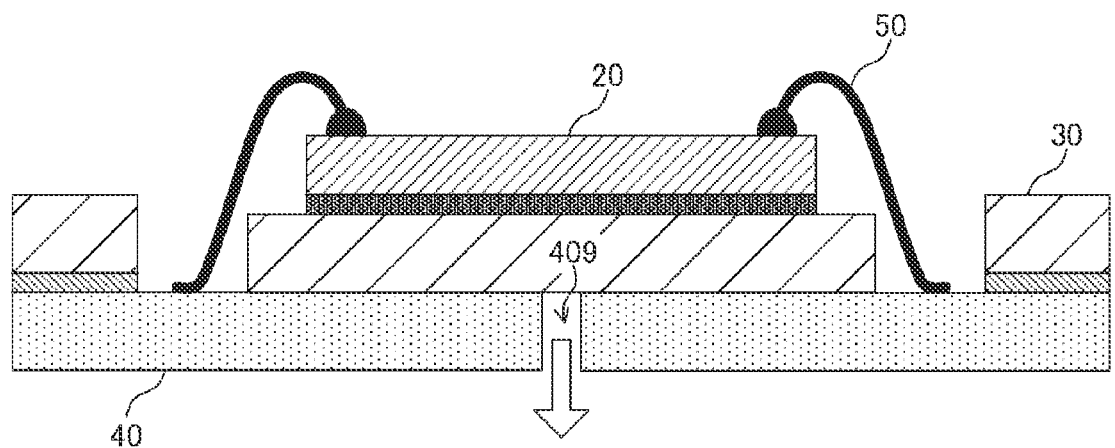
FIG. 6 is a diagram showing an example of wire bonding according to the first embodiment of the present disclosure.

FIG. 6 is a diagram showing an example of wire bonding according to the first embodiment of the present disclosure. This drawing is a diagram for explaining the wire bonding described in FIG. 4D. As described above, the air gap 10 is formed between the heat releasing plate 30 and the circuit board 40. Therefore, there are cases where the imaging device 20 moves during the wire bonding, which may cause a positional shift in the bonding. In view of this, the heat releasing plate 30 is brought into close contact with the circuit board 40. Specifically, a hole 409 is formed in the circuit board 40, and the heat releasing plate 30 is sucked through the hole 409, so that the region of the heat releasing plate 30 in which the imaging device 20 is placed is brought into close contact with the circuit board 40. The white arrow in the drawing indicates the suction of the heat releasing plate 30. As a result, the heat releasing plate 30 is fixed to the circuit board 40, and a positional shift during the wire bonding can be prevented. Note that, after the wire bonding, the hole 409 can be closed with a resin or the like.

[Modifications]

Figure 7:
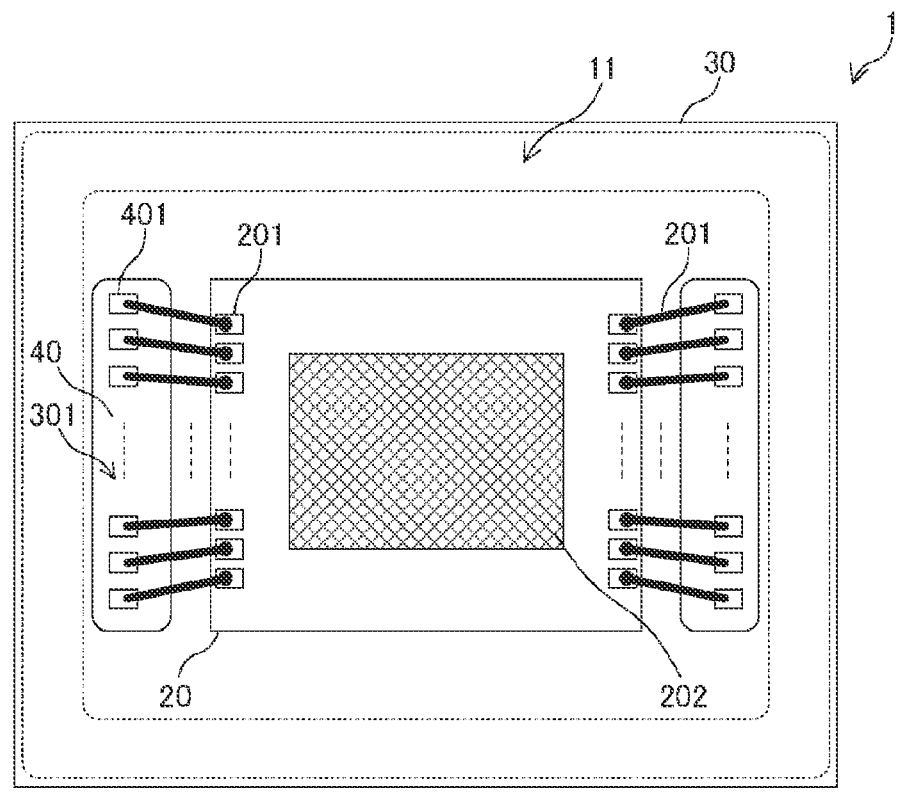
FIG. 7 is a plan view showing an example configuration of an imaging apparatus according to a modification of the first embodiment of the present disclosure.

FIG. 7 is a plan view showing an example configuration of an imaging apparatus according to a modification of the first embodiment of the present disclosure. The imaging apparatus 1 in the drawing shows an example in which the pads 201 are disposed on the two short sides of the imaging device 20. Two openings 301 are formed in the heat releasing plate 30, and are arranged adjacent to the two short sides of the imaging device 20.

Figure 8A:
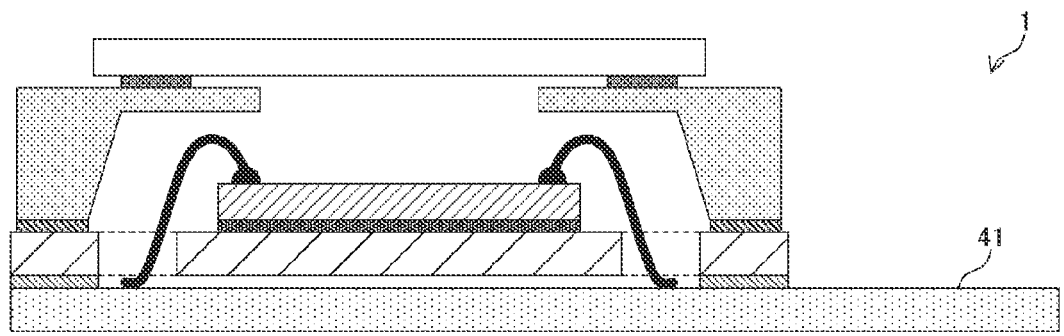
FIGS. 8A, 8B, 8C, and 8D are cross-sectional views showing other example configurations of imaging apparatuses according to modifications of the first embodiment of the present disclosure.

FIGS. 8A, 8B, 8C, and 8D are cross-sectional views showing other example configurations of imaging apparatuses according to modifications of the first embodiment of the present disclosure. In the drawing, FIG. 8A indicates an example in which a circuit board 41 formed with a flexible board is used in place of the circuit board 40. As shown in FIG. 8A in the drawing, the circuit board 41 can be formed in a shape having a portion extended from a lower portion of the heat releasing plate 30. The extended portion of the circuit board 41 can be used as a flexible connector, for example.

Figure 8B:
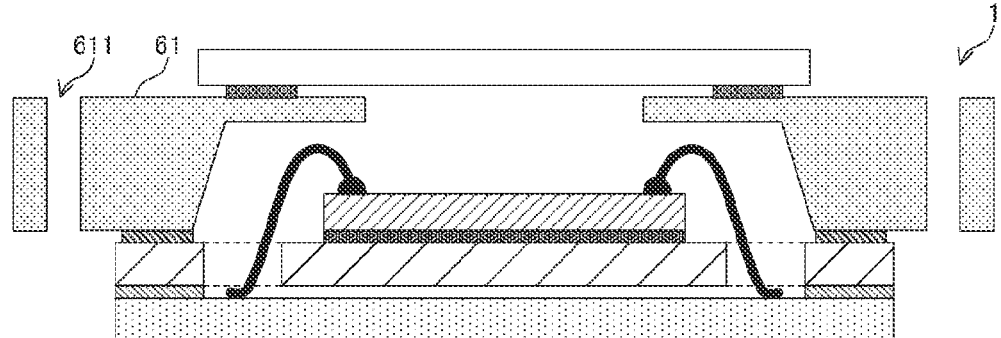
Figure 8C:
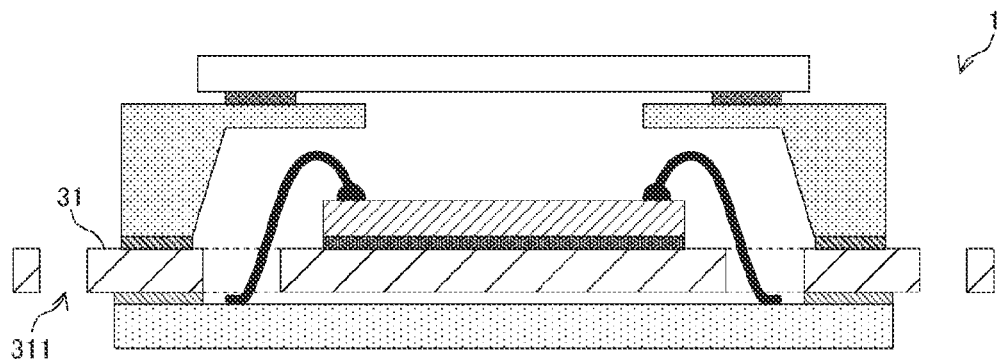

In the drawing, FIG. 8B indicates an example in which a frame 61 having mounting holes 611 formed therein is used. Meanwhile, FIG. 8C in the drawing indicates an example of a heat releasing plate 31 in which mounting holes 311 are formed. These mounting holes 611 and 311 are holes for screwing the imaging apparatus 1 to the housing or the heat releasing plate of the apparatus or the like that use the imaging apparatus 1.

Figure 8D:
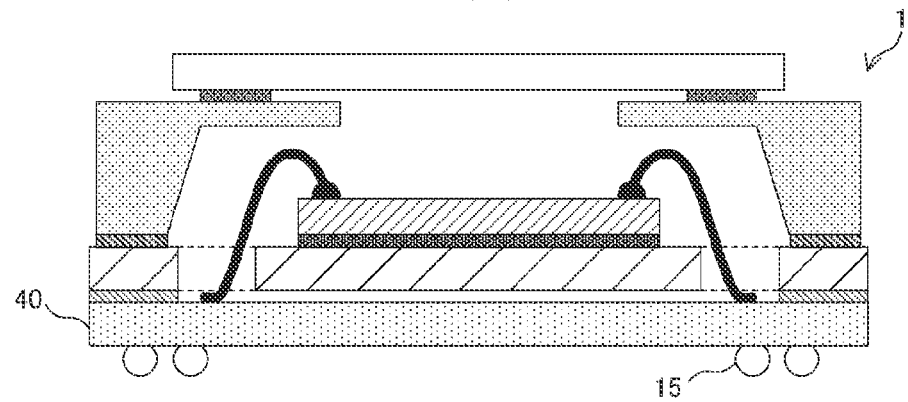

Further, FIG. 8D in the drawing indicates an example in which solder balls 15 are disposed on the bottom of the circuit board 40. With the solder balls 15, the imaging apparatus 1 can be mounted on the circuit board of the apparatus that uses the imaging apparatus 1.

Effects

Figure 9A:
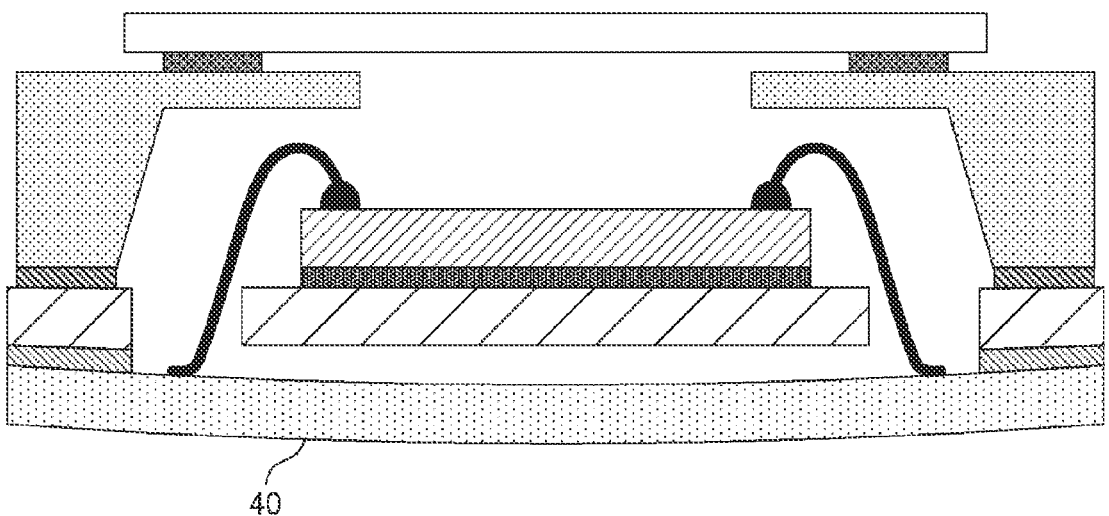
FIGS. 9A and 9B are diagrams for explaining the effects of an embodiment of the present disclosure.
Figure 9B:
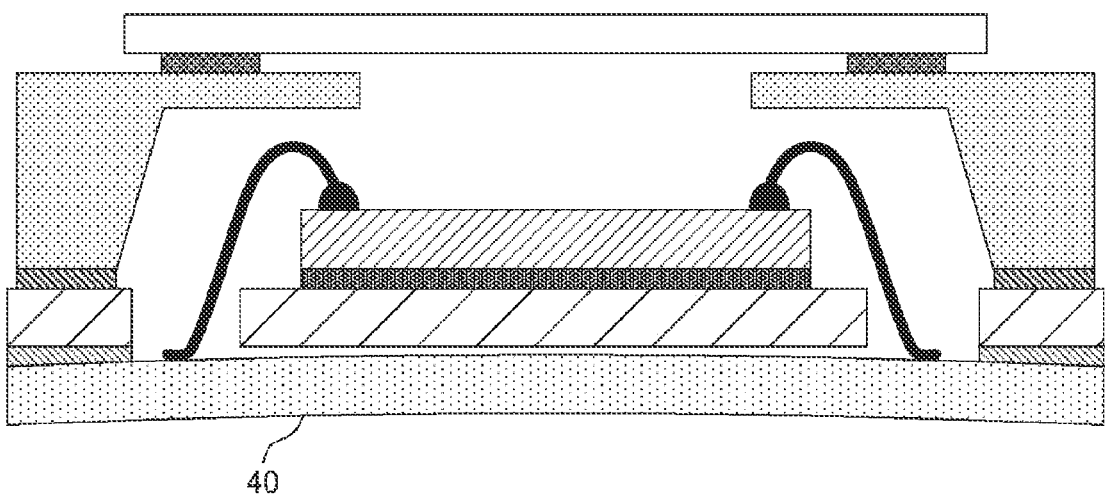

FIGS. 9A and 9B are diagrams for explaining the effects of an embodiment of the present disclosure. This drawing is diagrams showing cases where the circuit board 40 is warped. In the drawing, FIGS. 9A and 9B show cases where the circuit board 40 is curved downward and upward, respectively, to cause warpage in the imaging apparatus 1.

The circuit board 40 including an organic material such as a resin has a greater linear expansion coefficient than those of the imaging device 20 and the heat releasing plate 30, and the distortion due to a change in temperature becomes larger. Further, changes in humidity cause expansion and contraction of the circuit board 40. Since the circuit board 40 has a lower rigidity than those of the heat releasing plate 30 and the like, the circuit board 40 is warped due to such a change in the shape of the circuit board 40 with respect to the heat releasing plate and the like. Further, since the semiconductor package of the imaging apparatus 1 has a closed structure, the internal pressure changes due to fluctuations in atmospheric pressure. In this case, the circuit board 40 is also warped.

Even in such a case, it is possible to prevent the imaging device 20 from being deformed due to the influence of warpage of the circuit board 40. This is because the heat releasing plate is not fixed to the circuit board 40 in the semiconductor chip placement region, and the warping stress of the circuit board 40 is not directly applied to the heat releasing plate 30 in the semiconductor chip placement region. The warping stress of the circuit board 40 is applied to the heat releasing plate via the adhesive member 11. At this stage, stress in the tensile or compressive direction is applied to the heat releasing plate 30 in the semiconductor chip placement region. Accordingly, the amount of warpage of the imaging device 20 can be made substantially zero.

Further, as described above with reference to FIG. 3, in the imaging apparatus 1 in the drawing, the air gap 10 is formed between the heat releasing plate 30 and the circuit board 40. Accordingly, even in a case where the circuit board 40 shown in FIG. 9B in the drawing warps toward the inside of the imaging apparatus 1, deformation of the imaging device 20 can be prevented.

On the other hand, in a case where the heat releasing plate and the circuit board 40 in the region adjacent to the imaging device 20 are bonded to each other, the heat releasing plate 30 and the imaging device 20 are warped due to warpage of the circuit board 40. As an image is distorted, the distance between the imaging lens disposed on the outer side of the imaging apparatus 1 and the surface (the light receiving surface) of the imaging device 20 changes, resulting in blurring of the image.

As described above, in the imaging apparatus 1 of the first embodiment of the present disclosure, the heat releasing plate 30 having the imaging device 20 disposed thereon and the circuit board 40 are stacked, and the imaging device 20 and the circuit board 40 are connected via the openings 301 formed in the heat releasing plate 30. As the heat releasing plate 30 and the circuit board 40 are bonded to each other with the adhesive member 11 in the region on the outer side of the openings 301, deformation of the imaging device 20 due to warpage of the circuit board 40 can be reduced. As a result, degradation of image quality can be prevented.

2. Second Embodiment

The imaging apparatus 1 of the first embodiment described above includes the circuit board 40 disposed therein. On the other hand, a second embodiment of the present disclosure differs from the above imaging apparatus 1 in including electronic components in the circuit board 40.

As described above, the imaging device 20 requires electronic circuits such as a circuit that generates a control signal and a circuit that processes an image signal. In a case where such electronic circuits are included in the imaging device 20, there is a problem that the configuration of the imaging device 20 becomes complicated. On the other hand, in a case where electronic circuits are mounted on the surface of the circuit board 40 or on a board outside the imaging apparatus 1, there is a problem that the area occupied by the imaging apparatus 1 including the attached electronic circuits becomes larger. Therefore, the electronic circuits are included in the circuit board 40. This allows the electronic circuits to be disposed in the vicinity of the imaging device 20, or, for example, immediately below the imaging device 20.

[Configuration of an Imaging Apparatus]

Figure 10:
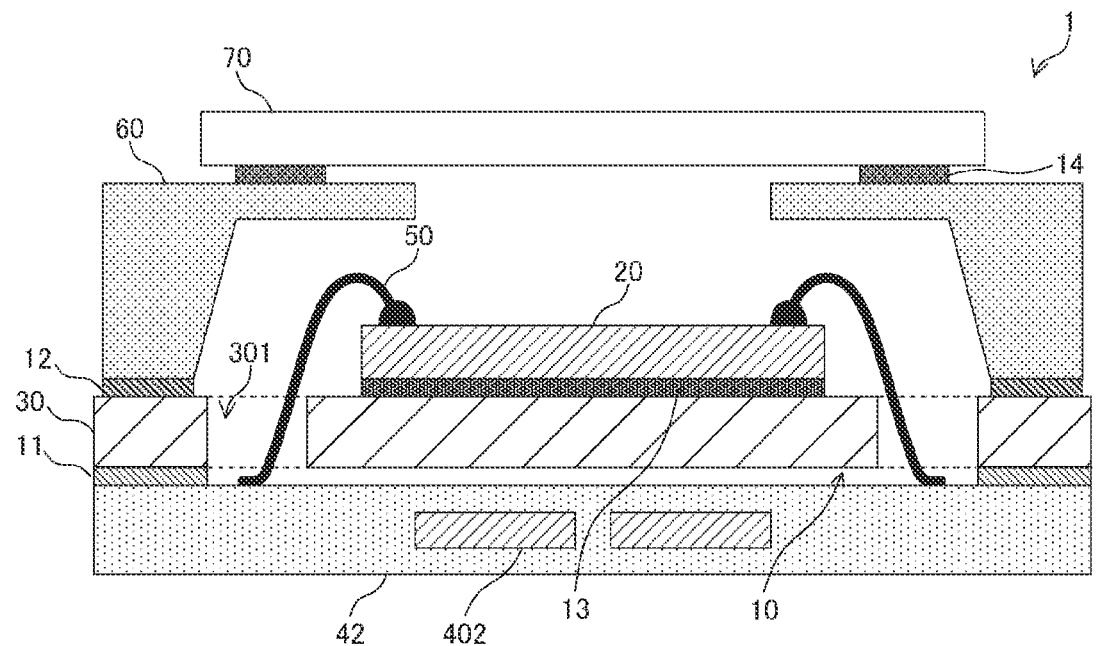
FIG. 10 is a cross-sectional view showing an example configuration of an imaging apparatus according to a second embodiment of the present disclosure.

FIG. 10 is a cross-sectional view showing an example configuration of an imaging apparatus according to the second embodiment of the present disclosure. The imaging apparatus 1 in the drawing differs from the imaging apparatus 1 described above with reference to FIG. 3 in including a circuit board 42 in place of the circuit board 40.

The circuit board 42 is a circuit board containing semiconductor chips 402. The semiconductor chips 402 are devices that form the electronic circuits connected to the imaging device 20. The semiconductor chips 402 may be an analog-to-digital converter that converts an image signal generated by a pixel of the imaging device 20 into a digital image signal, and a memory that stores the digital image signal, for example.

Such a circuit board 42 can be manufactured by stacking an insulating layer and a wiring layer on both surfaces of a core substrate that is the circuit board having the semiconductor chips 402 mounted on its surface, for example.

The analog-to-digital converter and the memory mentioned above operate at high speed, and therefore, consume a large amount of power. As a result, when such semiconductor chips 402 are disposed in the circuit board 40, the temperature of the circuit board 40 rises, and warpage occurs. However, the imaging apparatus 1 in the drawing can reduce deformation of the imaging device 20 even in a case where the circuit board 40 is warped.

Figure 11:
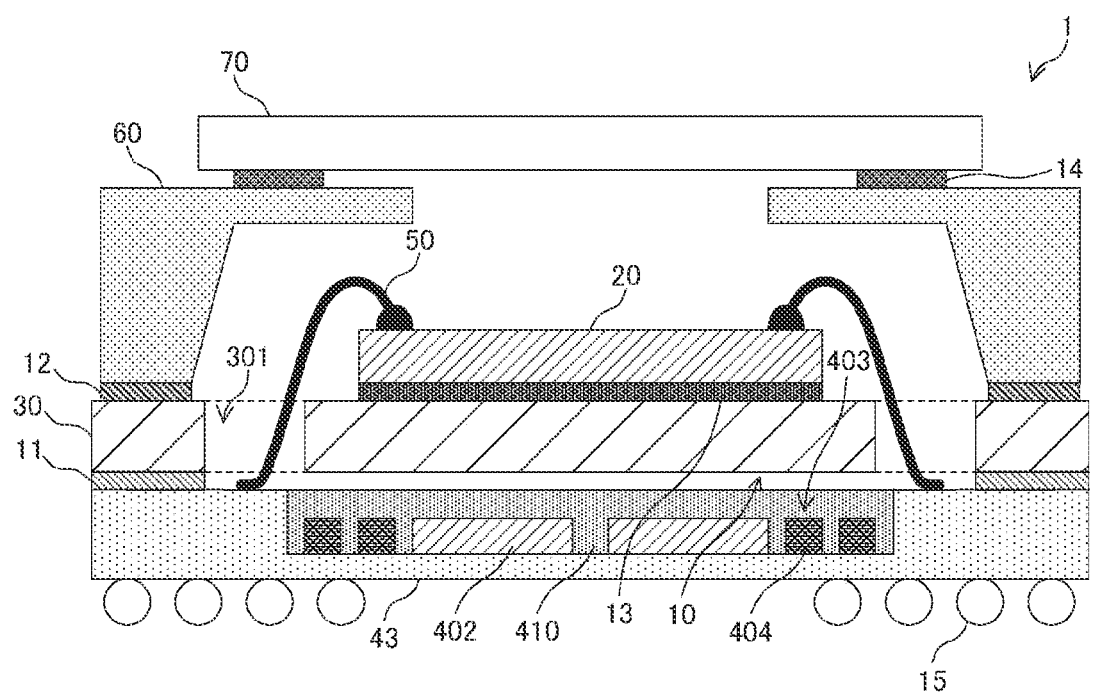
FIG. 11 is a cross-sectional view showing another example configuration of an imaging apparatus according to the second embodiment of the present disclosure.

FIG. 11 is a cross-sectional view showing another example configuration of an imaging apparatus according to the second embodiment of the present disclosure. The imaging apparatus 1 in the drawing differs from the imaging apparatus 1 described above with reference to FIG. 3 in including a circuit board 43 in place of the circuit board 40. Further, solder balls 15 are disposed on the bottom of the circuit board 43.

The circuit board 43 has recesses 403 for mounting the elements of electronic circuits. Elements 404 such as chip resistors forming electronic circuits other than the semiconductor chips 402 can be disposed in the recesses 403, and be mounted by soldering or the like. After that, the semiconductor chips 402 and the like can be sealed with a sealing resin 410. As a result, the scale of the electronic circuits to be mounted can be made larger than those of the circuit board 42 described above, and elements having different thicknesses can be mounted.

The recesses 403 can be formed in the front surface of the circuit board 43 on which the imaging device 20 is disposed, or in the back surface, which is a different surface from the surface on which the imaging device 20 is disposed. In a conventional imaging apparatus in which the imaging device 20 is disposed on a circuit board without the heat releasing plate 30, in a case where the recesses 403 are formed in the front surface, the recesses 403 need to be designed to be smaller in size than the imaging device 20. This is to prevent hindrance in the wire bonding of the imaging device 20. Therefore, the restrictions on the scale of the electronic circuits mounted in the recesses 403 become greater. Further, since the imaging device 20 is disposed on the circuit board in which the recesses 403 are formed, there are also problems that the contact area between the imaging device 20 and the circuit board becomes smaller, and heat release from the imaging device 20 is not sufficient. In a case where the recesses 403 are formed in the back surface of the circuit board, on the other hand, there is a problem that the region on the back surface of the circuit board on which the solder balls 15 are disposed becomes narrower.

Meanwhile, in the imaging apparatus 1 in the drawing, the heat releasing plate 30 is disposed between the imaging device and the circuit board 43, and the imaging device 20 and the circuit board 43 are connected to each other with the conductive wires 50 via the openings 301 in the heat releasing plate 30. As a result, in a case where the recesses 403 are formed in the front surface of the circuit board 43, the recesses 403 can be designed to have a larger area than the imaging device 20. This is because the recesses 403 can be widened to the region to which the conductive wires 50 are connected. Further, being formed in a different surface from the back surface on which the solder balls 15 are disposed, the recesses 403 can be located at positions overlapping the regions in which the solder balls 15 are disposed. Thus, the regions in which the solder balls 15 are disposed can be easily ensured. In this manner, the heat releasing plate 30 is disposed in the imaging apparatus 1, and the imaging device 20 and the circuit board 43 are connected to each other via the openings 301 in the heat releasing plate 30. Thus, relatively large-scale electronic circuits can be mounted on the circuit board 43.

Further, the heat releasing plate 30 and the circuit board 43 are bonded to each other with the adhesive member 11 in the region on the outer side of the openings 301. Thus, even in a case where the circuit board 43 is warped, deformation of the imaging device 20 can be reduced, as in the imaging apparatus 1 described above with reference to FIG. 11. Note that the recesses 403 can be formed in the back surface of the circuit board 43. Further, the recesses 403 can be formed on both surfaces (the front surface and the back surface) of the circuit board 43.

The other components of the imaging apparatus 1 are similar to the components of the imaging apparatus 1 described in the first embodiment of the present disclosure, and therefore, explanation of them is not made herein.

As described above, in the imaging apparatus 1 of the second embodiment of the present disclosure, the elements of the electronic circuits connected to the imaging device 20 are included in the circuit board 43, and thus, the imaging apparatus 1 can be made smaller in size.

3. Third Embodiment

In the imaging apparatus 1 of the first embodiment described above, the heat releasing plate 30 in the region in which the imaging device 20 is disposed is not bonded to the circuit board 40, and the imaging device 20 is movably placed. On the other hand, an imaging apparatus 1 of a third embodiment of the present disclosure differs from the first embodiment described above in that restrictions are put on vertical movement of the heat releasing plate 30 in the region in which the imaging device 20 is disposed.

The imaging device 20 is disposed on the heat releasing plate 30, and the heat releasing plate 30 having the imaging device 20 disposed thereon can move with respect to the circuit board 40. However, when the imaging device 20 moves in a vertical direction, the optical path length from the imaging lens disposed outside the imaging apparatus 1 varies, and therefore, the focal position shifts. As a result, an image is blurred. Therefore, the heat releasing plate 30 in the region in which the imaging device 20 is disposed is fixed. This has the effect to restrict vertical movement of the heat releasing plate 30 in the region in which the imaging device 20 is disposed.

[Configurations of Imaging Apparatuses]

Figure 12A:
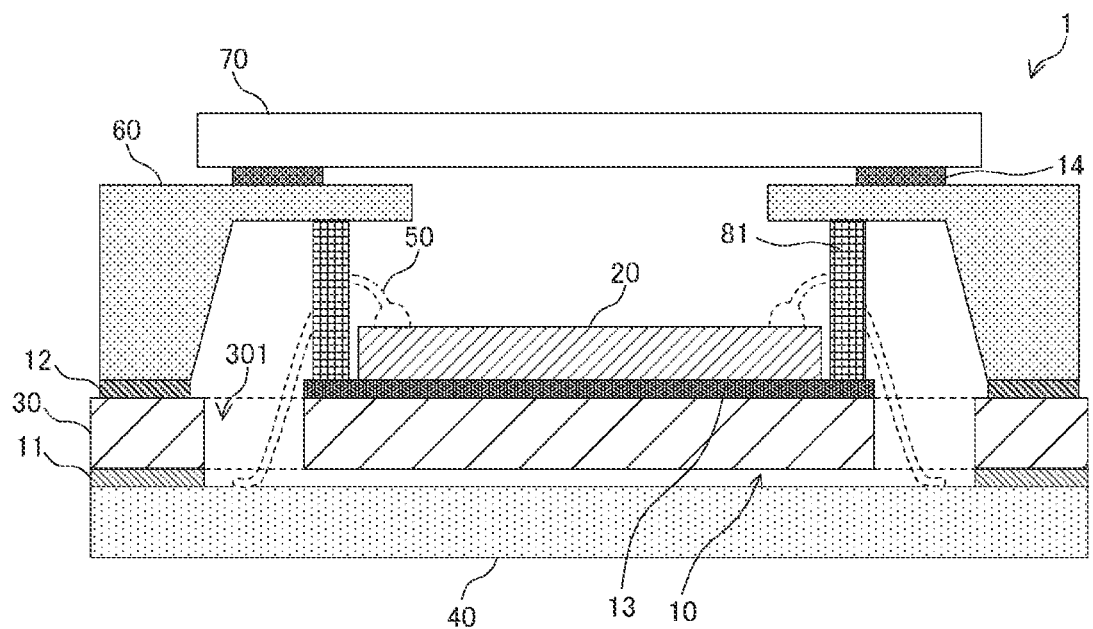
FIGS. 12A and 12B are cross-sectional views showing example configurations of imaging apparatuses according to a third embodiment of the present disclosure.
Figure 12B:
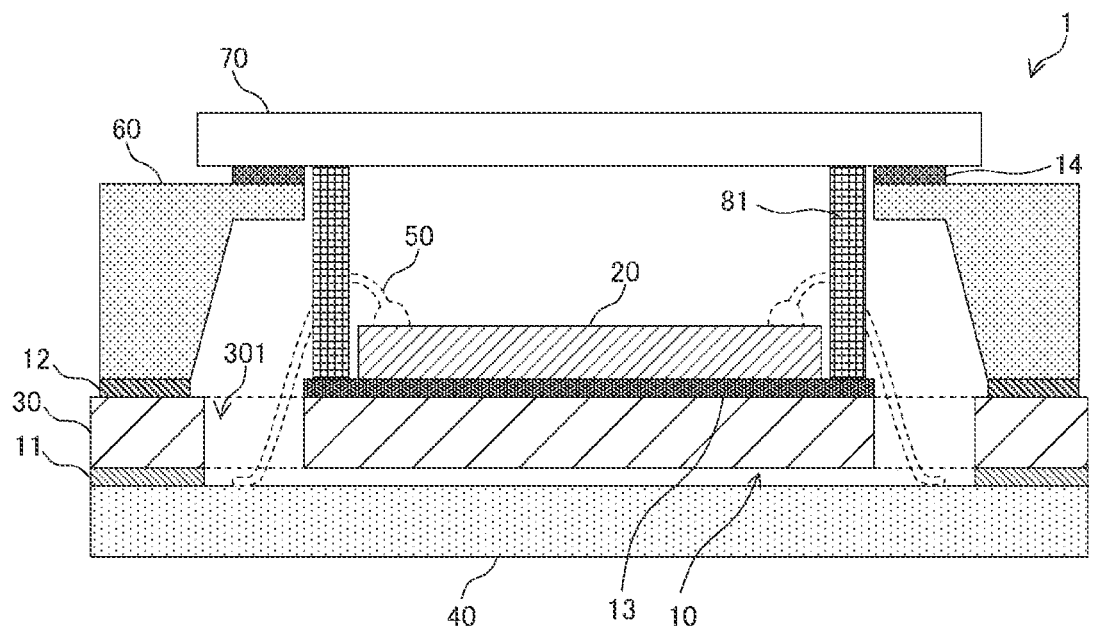

FIGS. 12A and 12B are cross-sectional views showing example configurations of imaging apparatuses according to the third embodiment of the present disclosure. The imaging apparatuses 1 in the drawing differ from the imaging apparatus 1 described above with reference to FIG. 3 in including locking portions 81.

The locking portions 81 are designed to lock the semiconductor chip placement region in the heat releasing plate 30. As the heat releasing plate 30 in the region is locked, vertical movement of the imaging device 20 can be restricted. Here, the vertical direction is a direction perpendicular to the surface of the imaging device 20 irradiated with incident light.

In the drawing, FIG. 12A is a diagram showing an example of the locking portions 81 disposed between the frame 60 and the heat releasing plate 30. The upper ends of the locking portions 81 are bonded to the brim portion of the frame 60, and the lower ends of the locking portions 81 are bonded to the heat releasing plate 30. At this stage, the locking portions 81 can be bonded to the heat releasing plate 30 with the die bond material 13, as shown in the drawing. In the drawing, FIG. 12B is a diagram showing an example of the locking portions 81 disposed between the cover glass 70 and the heat releasing plate 30. In FIG. 12B in the drawing, the upper ends of the locking portions 81 are bonded to the cover glass 70. The locking portions 81 can include a metal or a resin, for example. Note that the locking portions 81 may be bonded to the heat releasing plate 30 with an adhesive different from the die bond material 13.

[Arrangement of Locking Portions]

Figure 13:
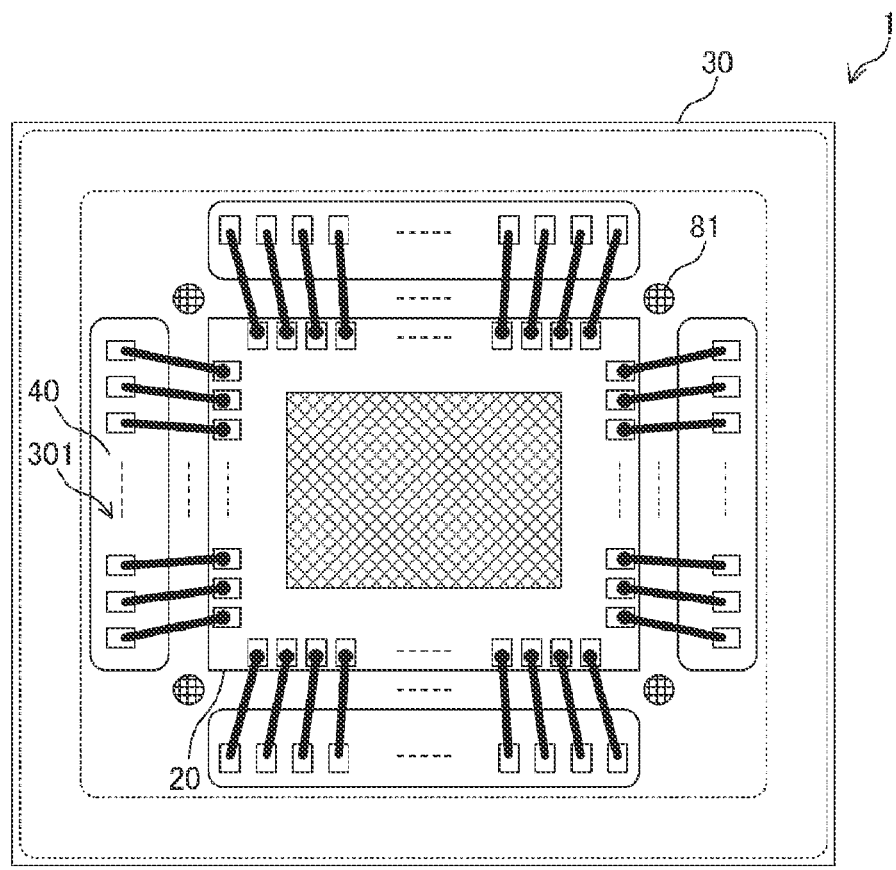
FIG. 13 is a plan view showing an example configuration of locking portions according to the third embodiment of the present disclosure.

FIG. 13 is a plan view showing an example configuration of locking portions according to the third embodiment of the present disclosure. This drawing is a diagram showing an example arrangement of the locking portions 81. As shown in the drawing, the locking portions 81 can be disposed in the vicinity of the four respective corners of the imaging device 20.

A method for manufacturing an imaging apparatus 1 including the locking portions 81 is now described, with reference to the imaging apparatus 1 in FIG. 12A as an example. The locking portions 81 are bonded to the heat releasing plate 30 after the wire bonding described above with reference to FIG. 4D is performed. Next, an adhesive is applied to the upper ends of the locking portions 81. After that, when the frame 60 described above with reference to FIG. 5A is bonded to the heat releasing plate 30, the upper ends of the locking portions 81 are bonded to the brim portion of the frame 60. At this stage, in a case where the hole 409 described above with reference to FIG. 6 is formed in the circuit board 40, the adhesive is hardened while the lower surface of the heat releasing plate 30 is pushed upward with a stick-like protruding object via the hole 409. Thus, the locking portions 81 can be bonded to the frame 60 without fail.

Note that the locking portions 81 may be bonded to the frame 60 first, and the lower ends of the locking portions 81 may be bonded to the heat releasing plate 30 when the frame 60 is bonded to the heat releasing plate 30.

[Another Configuration of an Imaging Apparatus]

Figure 14:
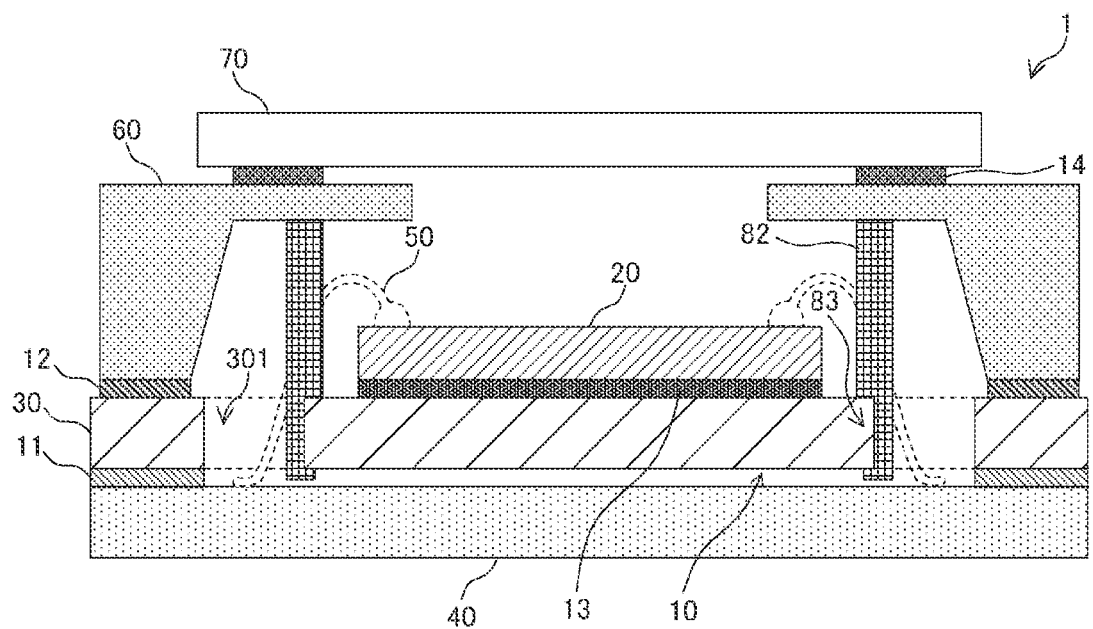
FIG. 14 is a cross-sectional view showing another example configuration of an imaging apparatus according to the third embodiment of the present disclosure.

FIG. 14 is a cross-sectional view showing another example configuration of an imaging apparatus according to the third embodiment of the present disclosure. The imaging apparatus 1 in this drawing differs from the imaging apparatus 1 shown in FIGS. 12A and 12B, in including locking portions 82 in place of the locking portions 81.

The locking portions 82 each include a hook-like protrusion 83 at the bottom. The locking portions 82 hook, with the protrusions 83, the heat releasing plate 30 having the imaging device 20 disposed thereon.

[Another Arrangement of Locking Portions]

Figure 15:
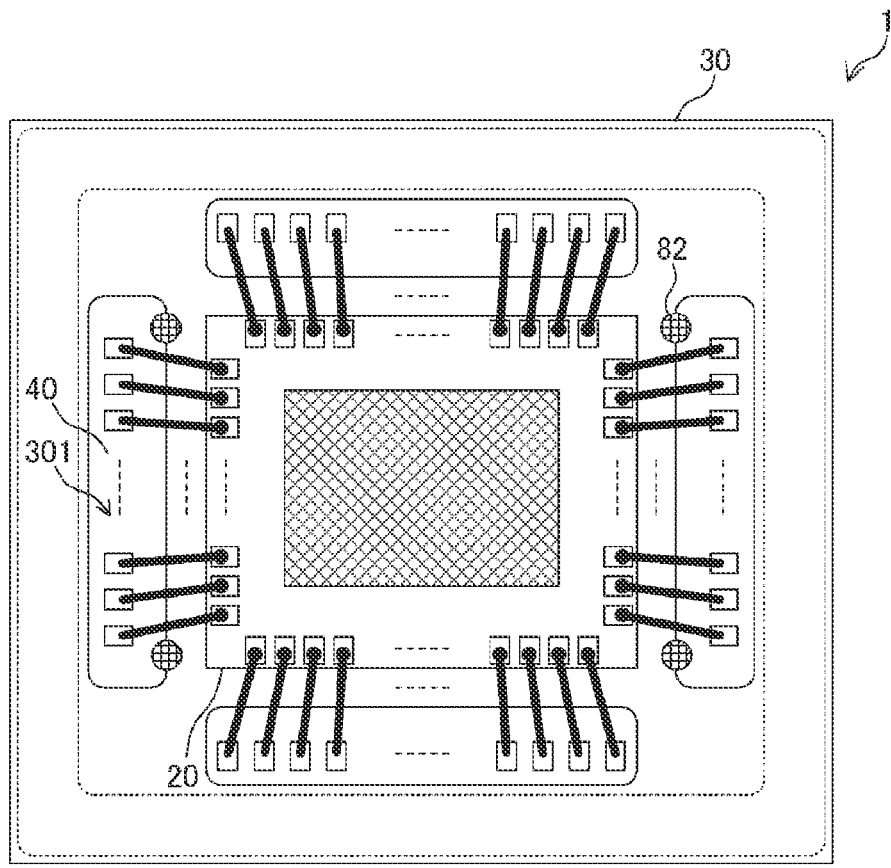
FIG. 15 is a plan view showing another example configuration of locking portions according to the third embodiment of the present disclosure.

FIG. 15 is a plan view showing another example configuration of locking portions according to the third embodiment of the present disclosure. As shown in this drawing, the locking portions 82 are disposed at positions where the locking portions 82 partially overlap with the openings 301.

Note that the locking portions 81 and 82 are examples of the lid locking portion disclosed in the claims.

The other components of the imaging apparatus 1 are similar to the components of the imaging apparatus 1 described in the first embodiment of the present disclosure, and therefore, explanation of them is not made herein.

As described above, in the imaging apparatus 1 of the third embodiment of the present disclosure, the region of the heat releasing plate 30 on which the imaging device 20 is disposed is locked to the lid unit with locking portions. Thus, the imaging device 20 can be prevented from moving in a vertical direction, and degradation of image quality can be avoided.

4. Fourth Embodiment

In the imaging apparatus 1 of the third embodiment described above, the heat releasing plate 30 in the semiconductor chip placement region is locked to the lid unit. On the other hand, an imaging apparatus 1 of a fourth embodiment of the present disclosure differs from the third embodiment described above in that the heat releasing plate 30 in the region in which the imaging device 20 is disposed is brought into contact with the circuit board 40.

[Configuration of an Imaging Apparatus]

Figure 16:
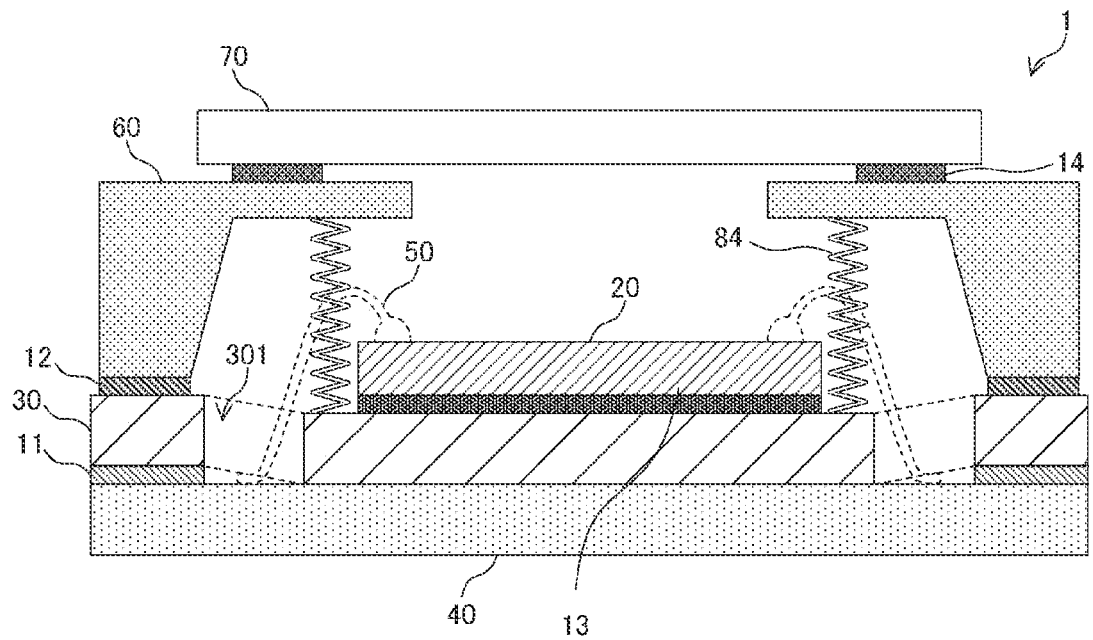
FIG. 16 is a cross-sectional view showing an example configuration of an imaging apparatus according to a fourth embodiment of the present disclosure.

FIG. 16 is a cross-sectional view showing an example configuration of an imaging apparatus according to the fourth embodiment of the present disclosure. The imaging apparatus 1 in this drawing differs from the imaging apparatus 1 described above with reference to FIG. 3 in including elastic members 84 in place of the locking portions 81.

The elastic members 84 are designed to bring the heat releasing plate 30 in the semiconductor chip placement region into contact with the circuit board 40. The elastic members 84 are disposed between the frame 60 and the heat releasing plate 30, and press the heat releasing plate 30 against the circuit board 40, to bring the heat releasing plate 30 in the semiconductor chip placement region into contact with the circuit board 40. The drawing shows an example in which spring-like elastic members 84 are used. As the elastic members 84 are compressed and are disposed between the frame 60 and the heat releasing plate 30, the heat releasing plate 30 can be pressed.

As the heat releasing plate 30 is brought into contact with the circuit board 40, it is possible to restrict vertical movement of the imaging device 20 disposed on the heat releasing plate 30. Further, the heat releasing plate 30 comes into contact with the circuit board 40, but is not fixed to the circuit board 40. Accordingly, even in a case where the circuit board 40 is expanded, the heat releasing plate 30 slides on the surface of the circuit board 40, so that the stress in the tensile direction to be applied from the circuit board 40 to the heat releasing plate 30 is reduced. Deformation of the imaging device 20 can be reduced.

The other components of the imaging apparatus 1 are similar to the components of the imaging apparatus 1 described in the first embodiment of the present disclosure, and therefore, explanation of them is not made herein.

As described above, in the imaging apparatus 1 of the fourth embodiment of the present disclosure, the region of the heat releasing plate 30 in which the imaging device 20 is disposed is brought into contact with the circuit board 40 with the elastic members 84. Thus, vertical movement of the imaging device 20 can be restricted, and degradation of image quality can be prevented.

5. Fifth Embodiment

In the imaging apparatus 1 of the fourth embodiment described above, the heat releasing plate 30 in the semiconductor chip placement region is brought into contact with the circuit board 40 with the elastic members 84. On the other hand, an imaging apparatus 1 of a fifth embodiment of the present disclosure differs from the fourth embodiment described above in that the shape of the heat releasing plate is changed to bring the heat releasing plate into contact with the circuit board 40.

[Configuration of an Imaging Apparatus]

Figure 17:
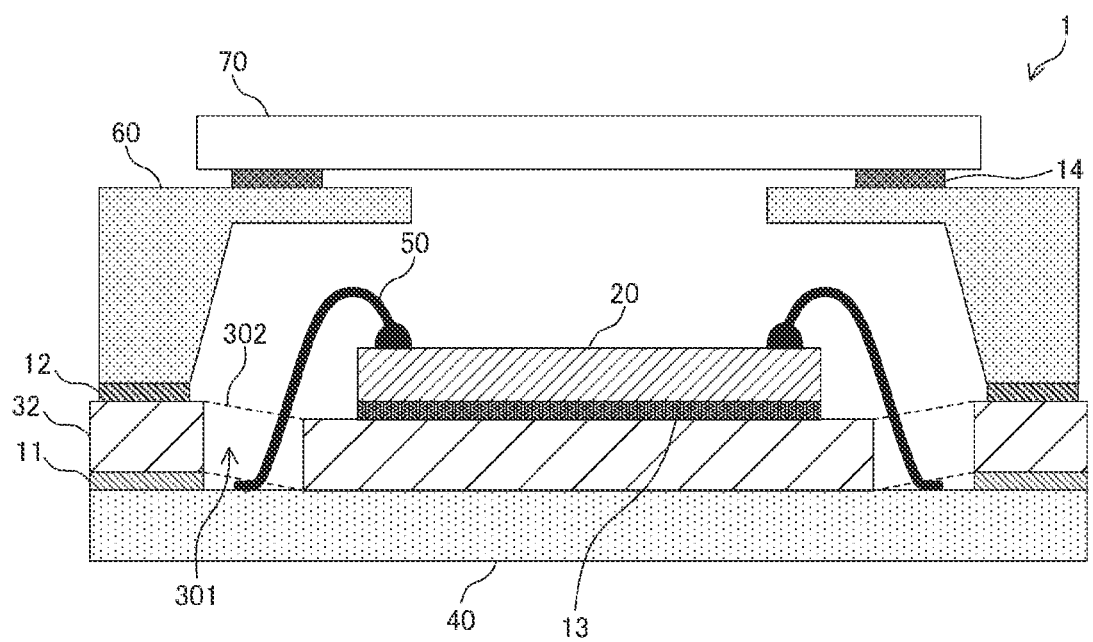
FIG. 17 is a cross-sectional view showing an example configuration of an imaging apparatus according to a fifth embodiment of the present disclosure.

FIG. 17 is a cross-sectional view showing an example configuration of an imaging apparatus according to the fifth embodiment of the present disclosure. The imaging apparatus 1 in this drawing differs from the imaging apparatus 1 described above with reference to FIG. 16 in that the elastic members 84 are eliminated, and the heat releasing plate 30 is replaced with a heat releasing plate 32.

The heat releasing plate 32 includes beam portions 302. The beam portions 302 are beam portions obliquely provided in the direction in which the circuit board 40 is disposed. Here, the beam portions are beam-like regions connecting the region on the outer side of the openings 301 in the heat releasing plate to the region on the inner side of the openings 301. As the beam portions are obliquely provided, the heat releasing plate in the region in which the imaging device 20 is disposed can be brought into contact with the circuit board 40.

[Another Configuration of an Imaging Apparatus]

Figure 18:
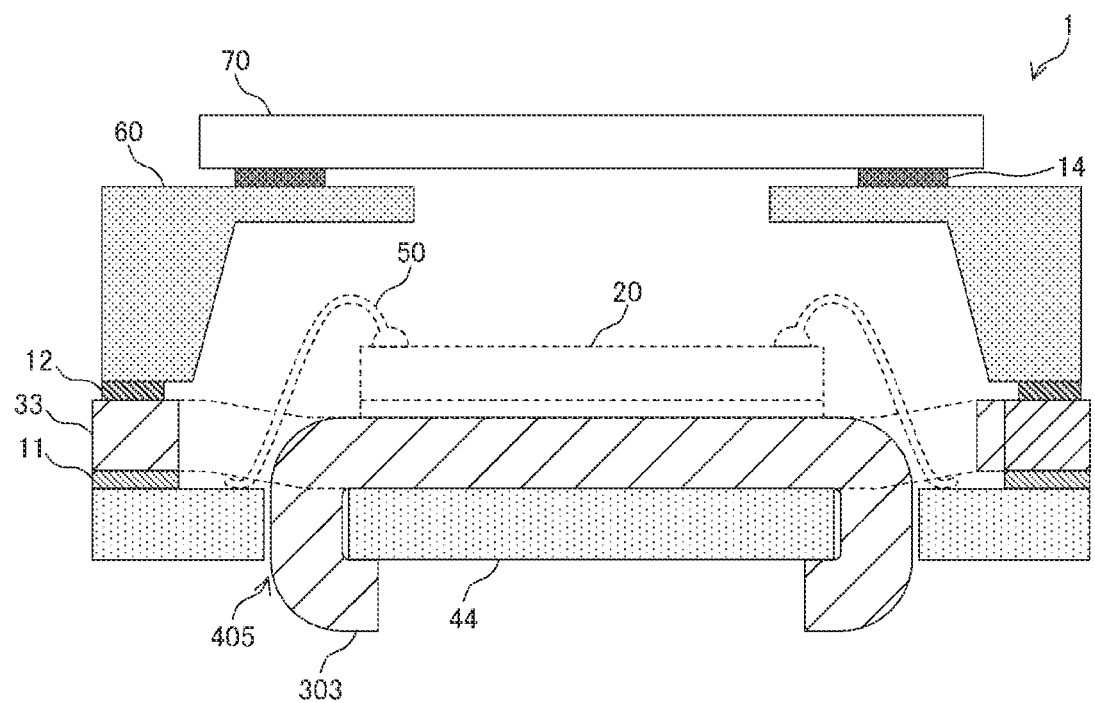
FIG. 18 is a cross-sectional view showing another example configuration of an imaging apparatus according to the fifth embodiment of the present disclosure.

FIG. 18 is a cross-sectional view showing another example configuration of an imaging apparatus according to the fifth embodiment of the present disclosure. The imaging apparatus 1 in this drawing differs from the imaging apparatus 1 described above with reference to FIG. 17 in including a heat releasing plate 33 and a circuit board 44 in place of the heat releasing plate 32 and the circuit board 40.

The heat releasing plate 33 is a heat releasing plate including protrusions 303. Meanwhile, the circuit board 44 is a circuit board having holes 405.

The protrusions 303 are designed to lock the semiconductor chip placement region to the circuit board 44, and bring the semiconductor chip placement region into contact with the circuit board 44. The protrusions 303 can be formed by bending part of the heat releasing plate 33 in the direction toward the circuit board 44. The holes 405 are holes into which the protrusions 303 are inserted.

[Configuration of a Heat Releasing Plate]

Figure 19:
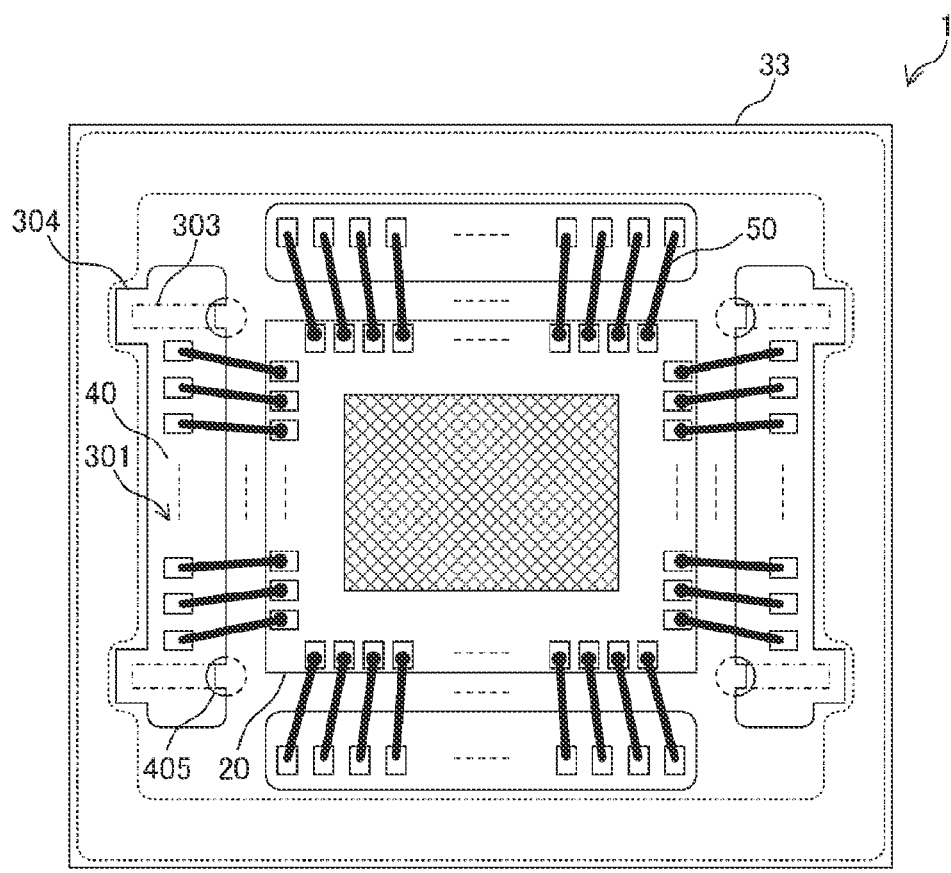
FIG. 19 is a plan view showing an example configuration of a heat releasing plate imaging apparatus according to the fifth embodiment of the present disclosure.

FIG. 19 is a plan view showing an example configuration of a heat releasing plate according to the fifth embodiment of the present disclosure. This drawing is a diagram showing an example configuration of the heat releasing plate 33. Dot-and-dash lines in the drawing indicate the protrusions 303 before the protrusions 303 are bent in the direction toward the circuit board 44 described above. Recesses 304 for securing the protrusions 303 are formed in the openings 301 in the drawing.

[Method for Manufacturing an Imaging Apparatus]

Figure 20A:
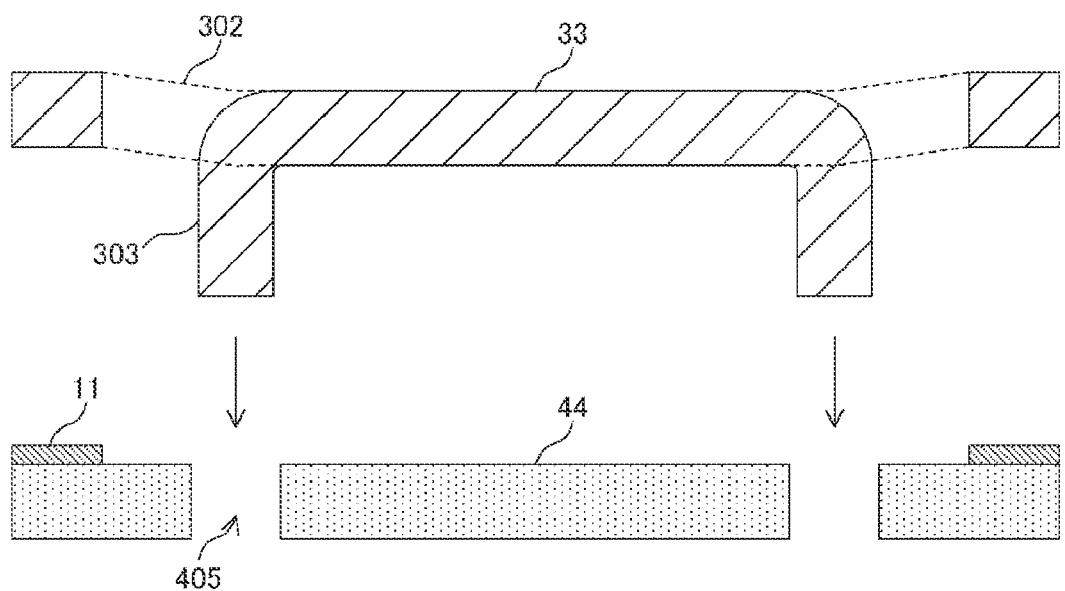
FIGS. 20A and 20B are diagrams showing an example of a method for manufacturing an imaging apparatus according to the fifth embodiment of the present disclosure.
Figure 20B:
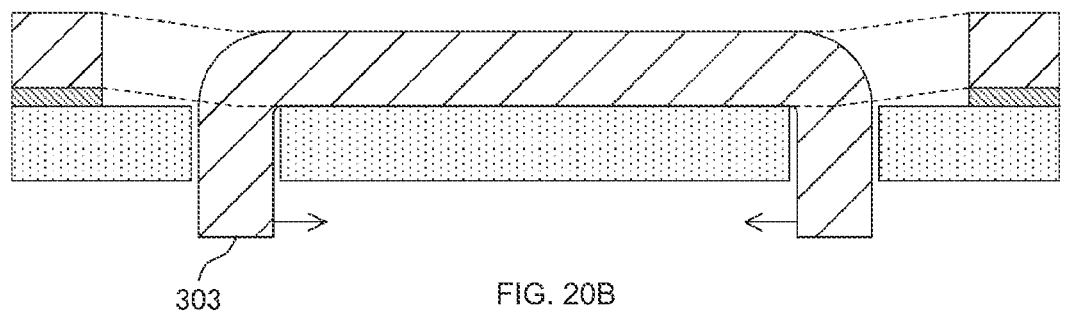

FIGS. 20A and 20B are diagrams showing an example of a method for manufacturing an imaging apparatus according to the fifth embodiment of the present disclosure. These diagrams are diagrams showing the process of manufacturing the imaging apparatus 1 described above with reference to FIG. 19.

When the heat releasing plate 33 is bonded to the circuit board 44, the protrusions 303 are inserted into the holes 405 (FIG. 20A). After the adhesive member 11 is hardened, the tips of the protrusions 303 are bent in the direction in which the circuit board 44 is hooked while the semiconductor chip placement region is brought into contact with the circuit board 40 (FIG. 20B). Thus, the semiconductor chip placement region can be brought into contact with the circuit board 44.

The other components of the imaging apparatus 1 are similar to the components of the imaging apparatus 1 described in the first embodiment of the present disclosure, and therefore, explanation of them is not made herein.

As described above, in the imaging apparatus 1 of the fifth embodiment of the present disclosure, the shape of the heat releasing plate 30 is changed, to bring the semiconductor chip placement region into contact with the circuit board 40. Thus, vertical movement of the imaging device 20 can be prevented, and degradation of image quality can be avoided.

6. Sixth Embodiment

This embodiment suggests a cover glass that is used in an imaging apparatus 1 of one of the embodiments described above.

[Material of a Cover Glass]

The cover glass 70 described above with reference to FIG. 3 may be glass of a material suitable for the purpose of use of the imaging apparatus 1. For example, infrared absorbing glass is used, so that the occurrence of ghosts and flares in images can be reduced, and the color balance in the images can be adjusted. Phosphate-based glass, fluorophosphate-based glass, and silicate-based glass can be used as such infrared absorbing glass. Note that fluorophosphate-based glass can also block either near-ultraviolet light or near-infrared light. In a case where infrared light blocking glass with an ultraviolet light transmittance of 50% or higher is used, an ultraviolet cure adhesive can be used as the adhesive 14 that bonds the cover glass 70 to the frame 60, and the process of manufacturing the imaging apparatus 1 can be simplified. Note that, to prevent the unhardened adhesive 14 from moving toward the central portion of the cover glass 70 at this stage, a groove or a step may be formed in the cover glass 70. Further, borosilicate-based glass containing an alkali metal oxide may be used, to improve light resistance. Also, inorganic oxide glass may be used, to improve light resistance and increase strength.

[Shape of a Cover Glass]

Figure 21A:
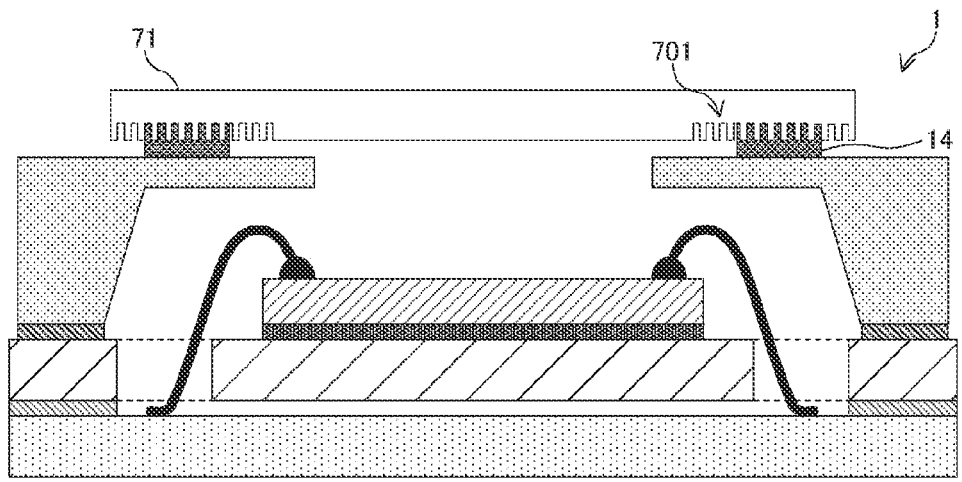
FIGS. 21A, 21B, and 21C are cross-sectional views showing example configurations of imaging apparatuses according to a sixth embodiment of the present disclosure.
Figure 21B:
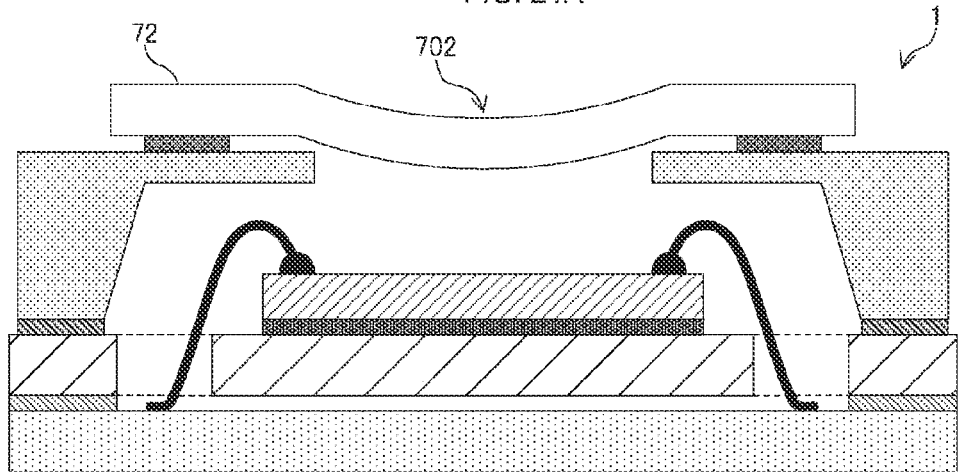
Figure 21C:
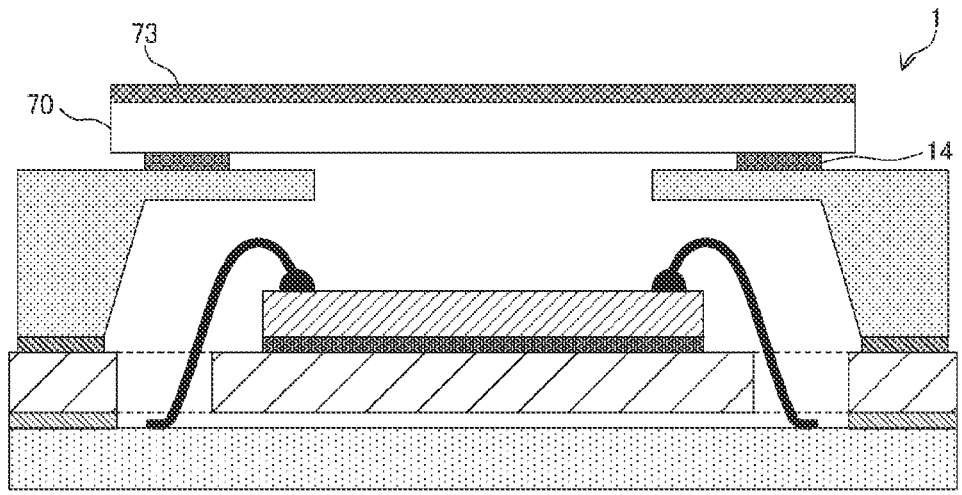

FIGS. 21A, 21B, and 21C are cross-sectional views showing example configurations of imaging apparatuses according to a sixth embodiment of the present disclosure. This drawing is diagrams showing example configurations of the cover glass of the imaging device 20. An imaging apparatus 1 in FIG. 21A in the drawing includes a cover glass 71 in place of the cover glass 70. This cover glass 71 is a cover glass in which roughened portions 701 are formed in the regions to be bonded to the frame 60. The roughened portions 701 can increase the adhesive strength with the frame 60. The roughened portions 701 can be formed by performing etching on a surface of the cover glass, for example. In a case where the fluorophosphate-based glass mentioned above is used as the glass of the cover glass 71, hardness can be increased by the etching, and vibration resistance can be improved. In a case where the phosphate-based glass is adopted, on the other hand, a chromium (Cr) film may be formed, to form the roughened portions 701.

An imaging apparatus 1 in FIG. 21B in the drawing includes a cover glass 72 in place of the cover glass 70. This cover glass 72 has a concave portion 702 that is curved toward the inside of the imaging apparatus 1. This concave portion 702 can reduce the occurrence of ghosts and flares in images.

In the drawing, FIG. 21C shows an example case where a film 73 is disposed on the surface of the cover glass 70. The film 73 may be a film 73 that blocks alpha rays, for example. With this arrangement, errors in image signals can be reduced. Also, a film 73 including a hygroscopic resin may be used, to prevent dew condensation on the cover glass 70, for example. A film 73 formed with a transparent conductive film may be used, and the film 73 may be energized and heated, to prevent dew condensation. In this case, the generation of static electricity can also be prevented. Further, in a case where a film 73 having a light blocking effect is used, entrance of light reflected by a housing or the like can be prevented. As the cover glass 70 having such a film 73 disposed thereon is used, productivity can be made higher than that in a case where the film 73 is provided after the imaging apparatus 1 is manufactured.

Note that a heat-resistant protective film is disposed on the surface of the cover glass 70, so that the surface of the cover glass 70 can be thermally protected. Also, a microlens may be formed on the surface of the cover glass 70 so that the process of manufacturing the imaging device 20 can be simplified. Further, an optical low-pass filter and an infrared light blocking filter may be stacked on the surface of the cover glass 70 so that reflection from the surface of the cover glass 70 can be prevented. In this case, the distance between the cover glass 70 and the imaging device 20 can be shortened. Also, a Cr film may be formed on the surface of the cover glass 70 so that the surface of the cover glass 70 can be smoothed, and dust can be prevented from adhering to the surface. Further, the outer circumferences of the cover glass 70 and the frame 60 may be molded with a resin or the like so that dust can be prevented from entering.

[Adhesive]

As a sealing resin having a low reflectance is used as the adhesive 14 that bonds the cover glass 70 to the frame 60, reflection by the adhesive 14 can be prevented, and ghosts and flares in images can be reduced. Two adhesives having different low elasticities may be used as the adhesive 14 so that the stress on the cover glass 70 can be reduced. Further, a moisture-proof seal may be provided on the outer circumference of the adhesive 14 so that moisture can be prevented from entering the imaging apparatus 1. An ultraviolet cure adhesive having a high glass transition point and a relatively low elastic modulus may be used as the adhesive 14 so that the generation of stress due to temperature changes can be reduced. Further, when the thickness of the adhesive 14 is adjusted, the spacer may be dispersed in the adhesive 14 so that the thickness can be adjusted.

7. Seventh Embodiment

In the imaging apparatus 1 of the first embodiment described above, the conductive wires 50 are wire-bonded to the pads 401 disposed on the circuit board 40. On the other hand, an imaging apparatus 1 of a seventh embodiment of the present disclosure differs from the first embodiment described above, in that the conductive wires 50 are wire-bonded to thickened pads.

In the imaging apparatus 1 described above with reference to FIG. 3, the heat releasing plate 30 is disposed between the imaging device 20 and the circuit board 40, and the conductive wires 50 are wire-bonded to the imaging device 20 and the circuit board 40 via the openings 301 in the heat releasing plate 30. Therefore, the conductive wires 50 are longer than those in a case without the heat releasing plate 30. Since the resistance and the inductance of the conductive wires 50 become higher, the image quality is degraded due to a propagation delay of a control signal or a change in the waveform of an image signal. Further, the conductive wires 50 might sag and come into contact with the heat releasing plate 30 in some cases. Therefore, shortening of the conductive wires 50 is suggested herein.

[Configuration of an Imaging Apparatus]

Figure 22:
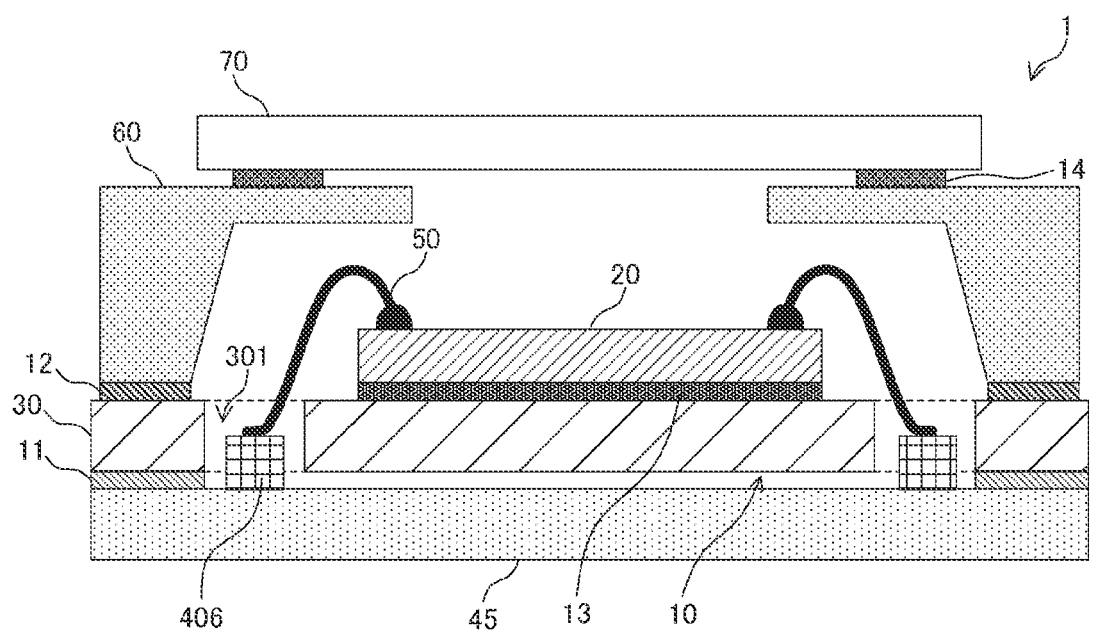
FIG. 22 is a cross-sectional view showing an example configuration of an imaging apparatus according to a seventh embodiment of the present disclosure.

FIG. 22 is a cross-sectional view showing an example configuration of an imaging apparatus according to the seventh embodiment of the present disclosure. The imaging apparatus 1 in this drawing differs from the imaging apparatus 1 described above with reference to FIG. 3 in including a circuit board 45 in place of the circuit board 40.

The circuit board 45 is a circuit board on which pads 406 are disposed in place of the pads 401. The pads 406 are pads in the form of thick films, and are formed in a shape protruding from the surface of the circuit board 45. As the conductive wires 50 are wire-bonded to these pads 406, the conductive wires 50 can be shortened. The pads 406 can be formed by thick-film plating, for example. Alternatively, to form the pads 406, substrate posts or bumps including Cu may be soldered to the wiring layer on the surface of the circuit board 45, for example. Further, to form the pads 406, the portions of the surface of the circuit board other than the pad portions may be ground and thinned, for example. Note that the pads 406 are an example of the thick-film pad disclosed in the claims.

The other components of the imaging apparatus 1 are similar to the components of the imaging apparatus 1 described in the first embodiment of the present disclosure, and therefore, explanation of them is not made herein.

As described above, in the imaging apparatus 1 of the seventh embodiment of the present disclosure, the pads 406 having a shape protruding from the surface of the circuit board are disposed on the circuit board, and the conductive wires 50 are wire-bonded to these pads 406, so that the conductive wires 50 can be shortened. Thus, degradation of the signal waveform and sagging of the conductive wires 50 can be prevented.

8. Eighth Embodiment

In the imaging apparatus 1 of the first embodiment described above, the imaging device 20 and the circuit board 40 are connected to each other by the conductive wires 50. This embodiment suggests an imaging apparatus that increases the mechanical strength of the conductive wires 50.

In the imaging apparatus 1 described above with reference to FIG. 3, the conductive wires 50 are wire-bonded to the imaging device 20 and the circuit board 40 via the openings 301 in the heat releasing plate 30. Therefore, there is a problem that the conductive wires 50 become longer, and the mechanical strength decreases. There is also a problem that, when the movable semiconductor chip placement region moves, stress concentrates on the wire bonding portions of the conductive wires 50, resulting in damage. Therefore, an increase in the strength of the conductive wires 50 is suggested herein.

[Configuration of an Imaging Apparatus]

Figure 23:
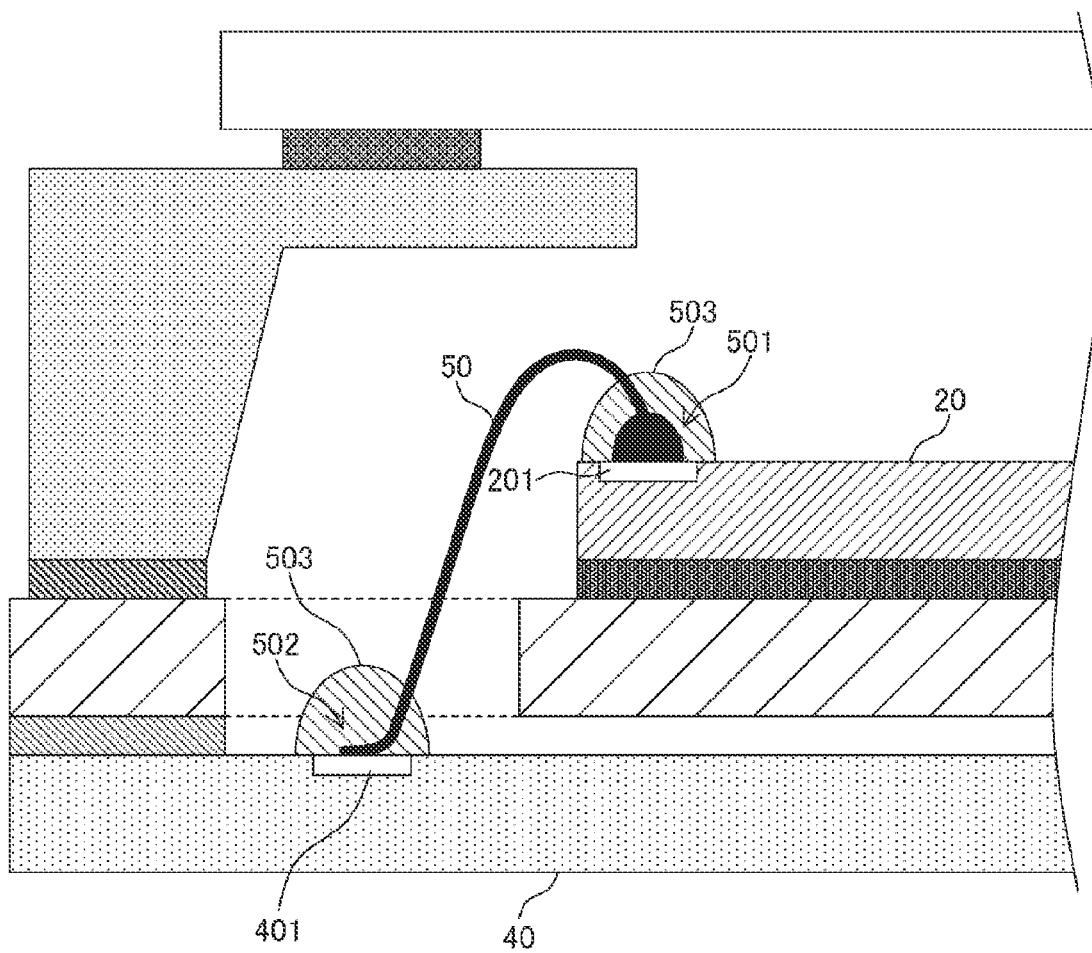
FIG. 23 is a cross-sectional view showing an example configuration of an imaging apparatus according to an eighth embodiment of the present disclosure.

FIG. 23 is a cross-sectional view showing an example configuration of an imaging apparatus according to an eighth embodiment of the present disclosure. This drawing is an enlarged view of regions connected by a conductive wire 50. The imaging apparatus 1 in the drawing differs from the imaging apparatus 1 described above with reference to FIG. 3, in that protective portions 503 are formed at the bonding portions between the conductive wires 50, and the imaging device 20 and the circuit board 40.

A conductive wire 50 is connected by a device called a capillary. This capillary is a device that inserts a metallic wire including Au or the like, which is the material of the conductive wire 50, into a hole formed at the central portion, heats the metallic wire, and applies ultrasonic waves while pressing the imaging device 20 and the like. The conductive wire 50 can be formed by the capillary in the following order. First, the capillary is heated to a high temperature, to melt the metallic wire inserted into the capillary and form a spherical ball. This ball is pressed against a pad 201 of the imaging device 20, and heating and ultrasonic wave application are performed, following by connecting (ball bonding). Next, the capillary is moved to the position of a pad 401 of the circuit board 40 while pushing out the metallic wire. At this stage, the capillary is moved in a loop-like form, so that a loop of the metallic wire can be formed. Next, the metallic wire is pressed against the pad 401, and ultrasonic waves are applied, to perform connecting (wedge bonding). After that, the metallic wire is cut, so that the conductive wire 50 is formed.

In the drawing, the portions at which the conductive wire 50 is connected to the pads 201 and 401 are represented by connecting portions 501 and 502, respectively. The connecting portions 501 and 502 correspond to the connecting portions formed by ball bonding and wedge bonding, respectively.

Protective portions 503 are disposed at these connecting portions 501 and 502. The protective portions 503 include a resin or the like, and are disposed so as to cover the connecting portions 501 and 502, to reinforce the connecting portions 501 and 502. Note that the protective portions 503 can be disposed at both the connecting portions 501 and 502, as shown in the drawing. Alternatively, the protective portions 503 may be disposed at either the connecting portions 501 or 502.

Note that wires of a metal having a higher rigidity than that of Au may be used as the conductive wires 50, so that the strength of the conductive wires 50 can be increased.

The other components of the imaging apparatus 1 are similar to the components of the imaging apparatus 1 described in the first embodiment of the present disclosure, and therefore, explanation of them is not made herein.

As described above, in the imaging apparatus 1 of the eighth embodiment of the present disclosure, the protective portions are disposed at the connecting portions of the conductive wires 50, so that the strength of the conductive wires 50 can be increased. Thus, it is possible to prevent breaking and the like of the conductive wires 50 in a case where the semiconductor chip placement region moves.

9. Ninth Embodiment

In the imaging apparatus 1 of the eighth embodiment described above, the conductive wires 50 are connected to the imaging device 20 and the circuit board 40 in this order. On the other hand, an imaging apparatus 1 of a ninth embodiment of the present disclosure differs from the eighth embodiment described above, in that the connecting order of the conductive wires 50 is changed.

[Configuration of an Imaging Apparatus]

Figure 24:
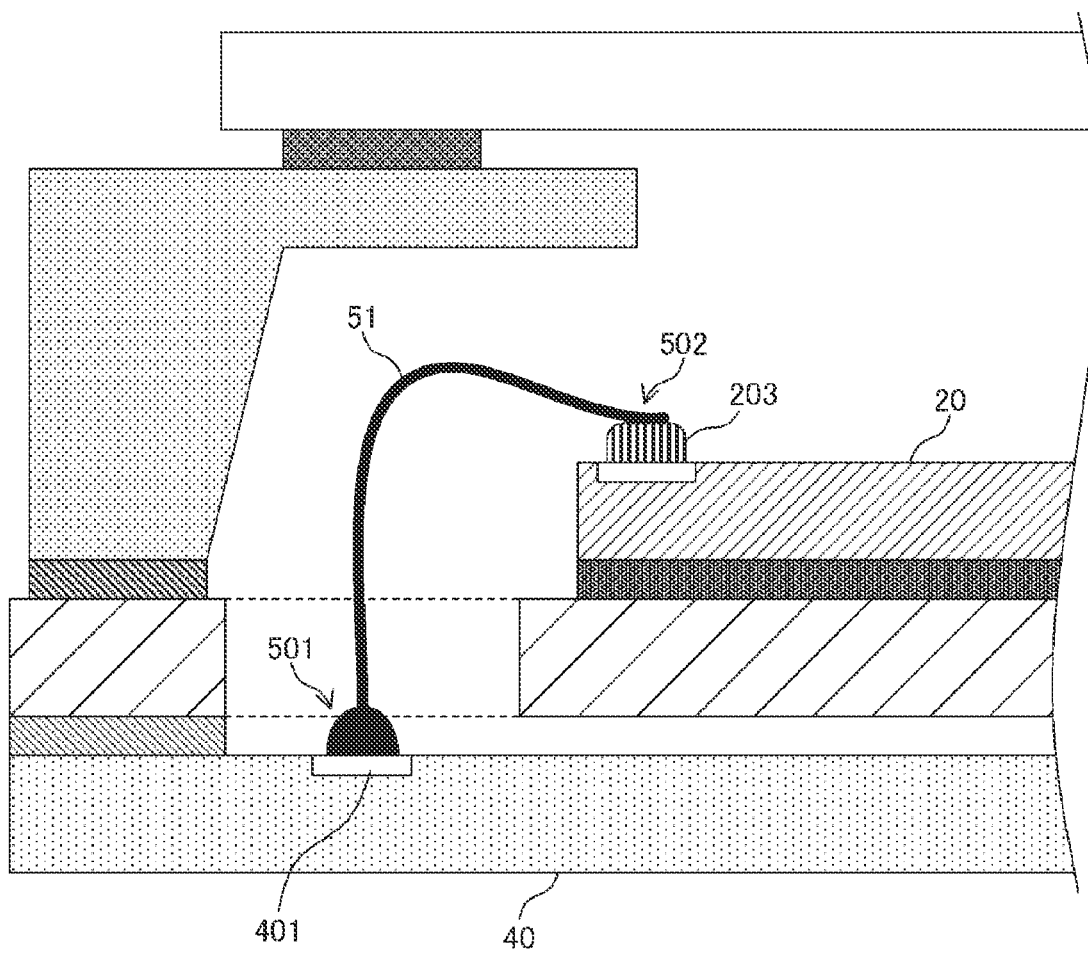
FIG. 24 is a cross-sectional view showing an example configuration of an imaging apparatus according to a ninth embodiment of the present disclosure.

FIG. 24 is a cross-sectional view showing an example configuration of an imaging apparatus according to the ninth embodiment of the present disclosure. The imaging apparatus 1 in this drawing differs from the imaging apparatus 1 described above with reference to FIG. 23, in that the protective portions 503 are eliminated, and conductive wires 51 are provided in place of the conductive wires 50. Further, bumps 203 are disposed on the pads 201 of the imaging device 20.

In a conductive wire 51, a connecting portion 501 formed by ball bonding and a connecting portion 502 formed by wedge bonding are formed on a pad 401 of the circuit board 40 and a bump 203 of the imaging device 20, respectively. That is, the conductive wire 51 is connected to the bump 203 of the imaging device 20 after being connected to the pad 401 of the circuit board 40. As a result, the loop of the conductive wire 51 can be shortened, and the curvature of the line in the vicinities of the connecting portions 501 and 502 can be made smaller. Thus, the stress concentration can be reduced. Note that the protective portions 503 described above with reference to FIG. 23 can also be disposed at the connecting portions 501 and 502.

Note that the bump 203 is a bump that is provided so that the surface to be connected to the conductive wire 51 is located higher than the surface of the imaging device 20. Even in a case where the pad 201 is formed at a deeper position than the surface of the imaging device 20, the top of the connecting portion 501 formed by ball bonding can be located at a higher position than the surface of the imaging device 20 by virtue of a height increasing effect of the ball. On the other hand, the bump 203 is provided at the connecting portion 502 formed by wedge bonding, which does not form a ball. As bonding is performed via the bump 203, the pad 201 formed deep in the imaging device 20 and the conductive wire 51 can be connected.

The other components of the imaging apparatus 1 are similar to the components of the imaging apparatus 1 described in the first embodiment of the present disclosure, and therefore, explanation of them is not made herein.

As described above, in the imaging apparatus 1 of the ninth embodiment of the present disclosure, the connection starting position at the time of connection of a conductive wire to the circuit board 40 and the like is changed, so that the strength of the conductive wires 51 can be increased. Thus, it is possible to prevent breaking and the like of the conductive wires 50 in a case where the semiconductor chip placement region moves.

10. Tenth Embodiment

In the imaging apparatus 1 of the first embodiment described above, the semiconductor chip placement region is designed to be movable. On the other hand, an imaging apparatus 1 of a tenth embodiment of the present disclosure differs from the first embodiment described above, in that the semiconductor chip placement region is hooked on the circuit board 40.

[Configuration of an Imaging Apparatus]

Figure 25:
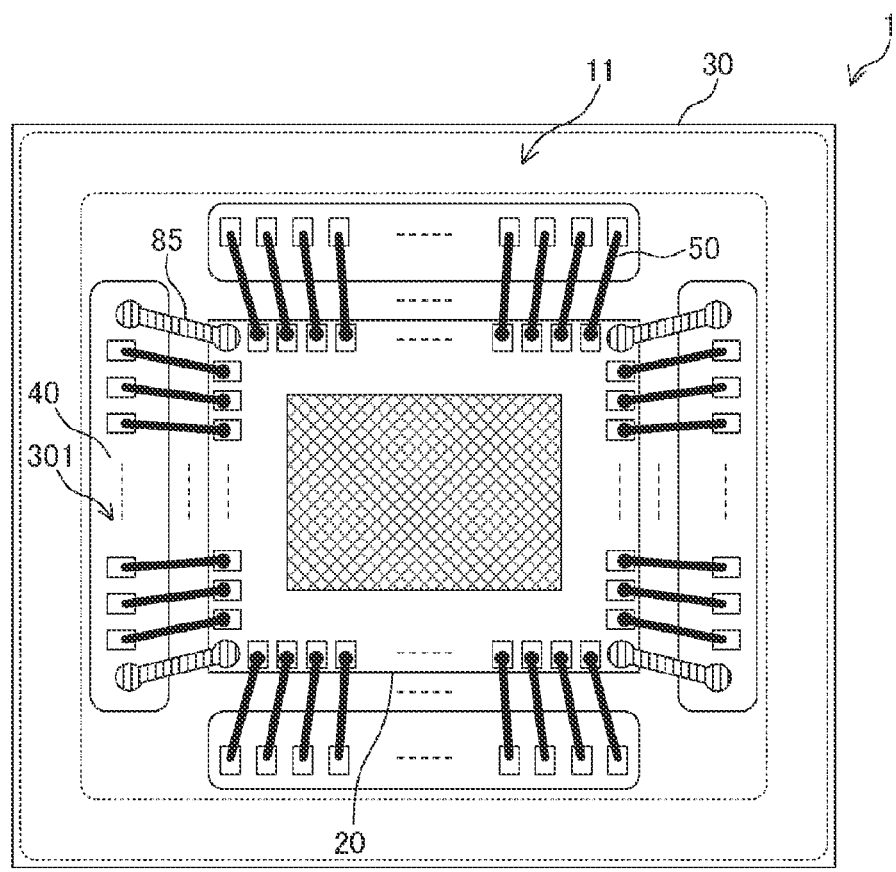
FIG. 25 is a plan view showing an example configuration of an imaging apparatus according to a tenth embodiment of the present disclosure.

FIG. 25 is a plan view showing an example configuration of an imaging apparatus according to the tenth embodiment of the present disclosure. The imaging apparatus 1 in this drawing differs from the imaging apparatus 1 described above with reference to FIG. 2 in including locking portions 85. The locking portions 85 are disposed between the heat releasing plate 30 and the circuit board 40 via the openings 301, and hooks the semiconductor chip placement region to the circuit board 40. This drawing shows an example in which the locking portions 85 are disposed at the four corners of the semiconductor chip placement region.

[Configuration of Locking Portions]

Figure 26A:
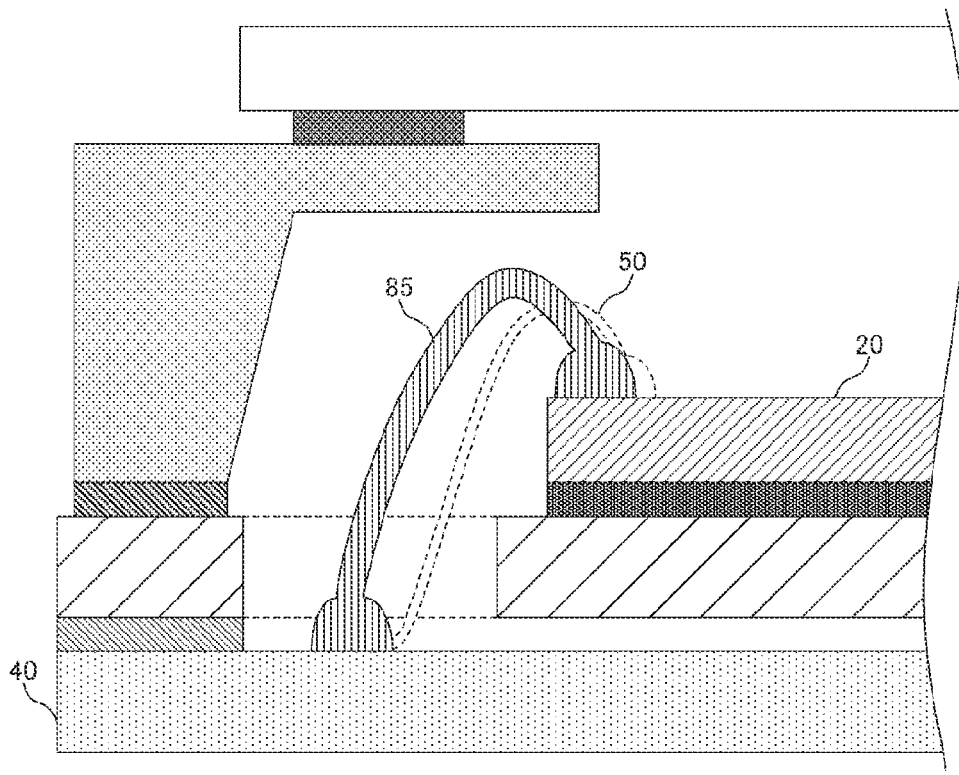
FIGS. 26A and 26B are cross-sectional views showing example configurations of locking portions according to the tenth embodiment of the present disclosure.
Figure 26B:
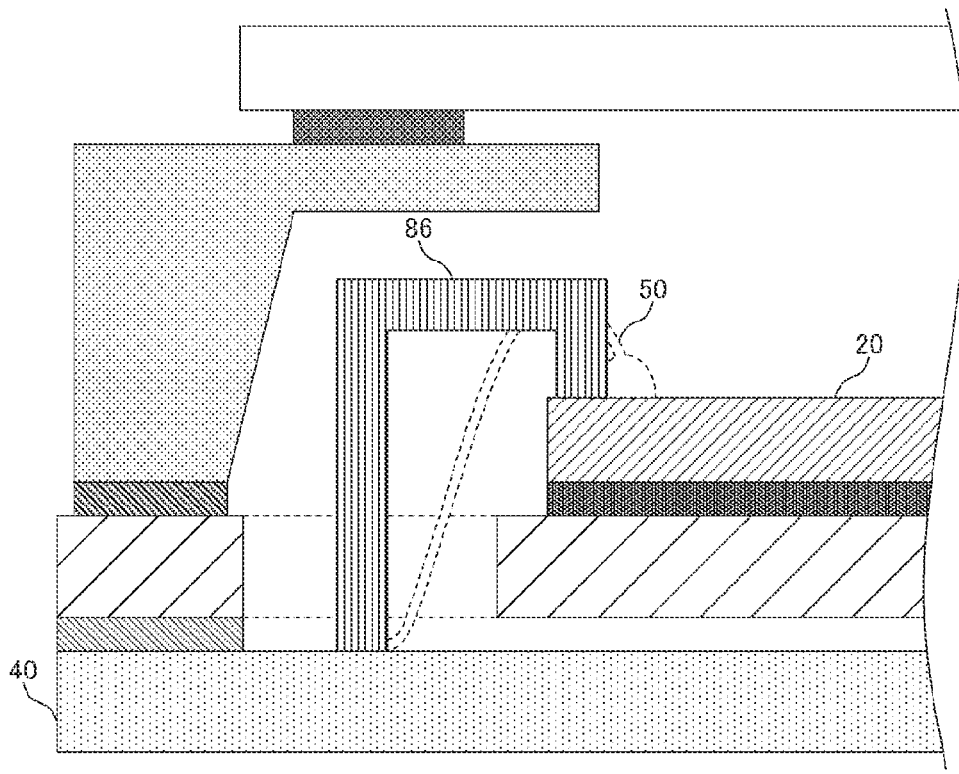

FIGS. 26A and 26B are cross-sectional views showing example configurations of locking portions according to the tenth embodiment of the present disclosure. In the drawing, FIG. 26A shows an example of a locking portion 85 formed with a highly rigid metallic wire. Meanwhile, FIG. 26B in the drawing shows an example of a pillar-like locking portion 86. As such locking portions are provided, movement of the semiconductor chip placement region is restricted, and the stress on the conductive wires 50 can be reduced. Note that the locking portions 85 and 86 are examples of the circuit board locking portion disclosed in the claims.

The other components of the imaging apparatus 1 are similar to the components of the imaging apparatus 1 described in the first embodiment of the present disclosure, and therefore, explanation of them is not made herein.

As described above, in the imaging apparatus 1 of the tenth embodiment of the present disclosure, the semiconductor chip placement region is hooked to the circuit board 40 with the locking portions 85 and 86. Thus, the stress on the conductive wires 50 can be reduced, and breaking and the like of the conductive wires 50 can be prevented.

11. Eleventh Embodiment

In the imaging apparatus 1 of the first embodiment described above, the imaging device 20 and the circuit board 40 are connected to each other with the conductive wires 50. On the other hand, an imaging apparatus 1 of an eleventh embodiment of the present disclosure differs from the first embodiment described above, in that the connection is performed with flexible wiring plates.

[Configuration of an Imaging Apparatus]

Figure 27:
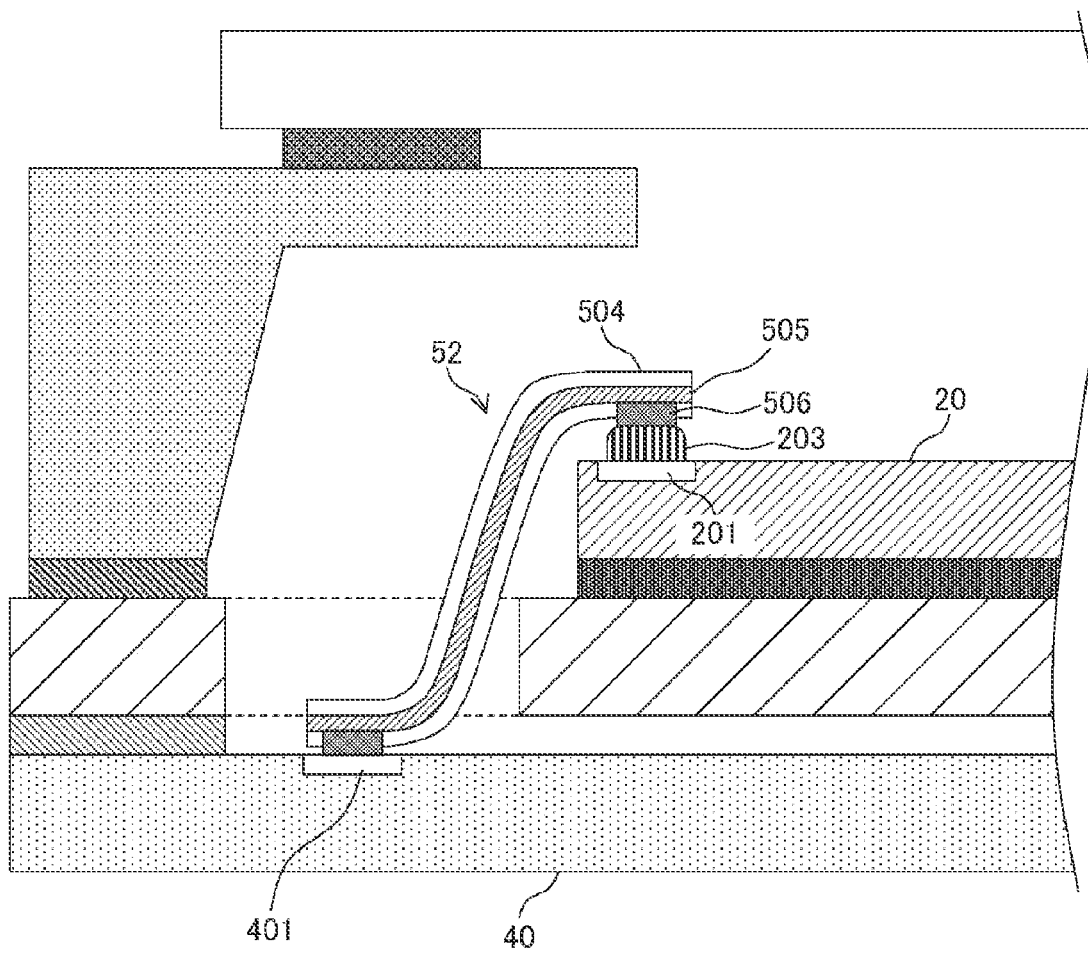
FIG. 27 is a cross-sectional view showing an example configuration of an imaging apparatus according to an eleventh embodiment of the present disclosure.

FIG. 27 is a cross-sectional view showing an example configuration of an imaging apparatus according to the eleventh embodiment of the present disclosure. The imaging apparatus 1 in this drawing differs from the imaging apparatus 1 described above with reference to FIG. 3, in including flexible wiring plates 52 in place of the conductive wires 50. The flexible wiring plates 52 are flexible wiring plates that are formed by stacking film-like insulating layers 504 on both surfaces of each wiring layer 505 including a metal such as Cu. Each wiring layer 505 is formed in the shape of a band for each corresponding one of the pads 201 (bump 203) and 401, and the plurality of band-like wiring layers 505 is arranged like a blind, to transmit signals. Note that pads 506 are provided for the wiring layers 505, and are connected to the bumps 203 and the pads 401 by soldering, for example.

As the flexible wiring plates 52 are highly flexible and are reinforced by the insulating layers 504, signals can be transmitted without causing damage such as breaking of a wire even in a case where the semiconductor chip placement region moves. Further, in a case where the conductive wires 50 are used, stress concentrates on a single conductive wire 50. On the other hand, the flexible wiring plates 52 have a configuration in which a plurality of wiring layers 505 is provided and connected simultaneously to a plurality of pads 201 of the imaging device 20. Thus, stress concentration can be reduced. Note that the flexible wiring plates 52 are an example of the conductive member disclosed in the claims.

The bumps 203 are also disposed on the pads 201 of the imaging device 20, and the connecting portions are raised above the surface of the imaging device 20. These bumps 203 may be bumps formed by plating, or stud bumps. Alternatively, the bumps 203 may be bumps that are disposed in multiple heights.

[Other Configuration of Imaging Apparatuses]

Figure 28A:
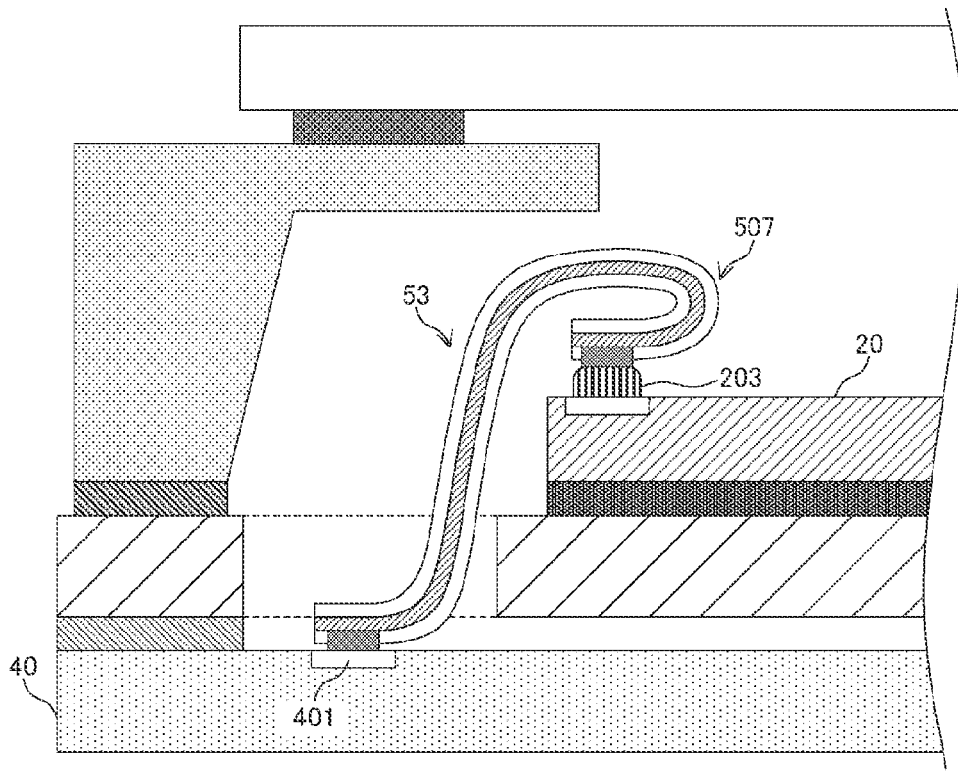
FIGS. 28A and 28B are cross-sectional views showing other example configurations of imaging apparatuses according to the eleventh embodiment of the present disclosure.
Figure 28B:
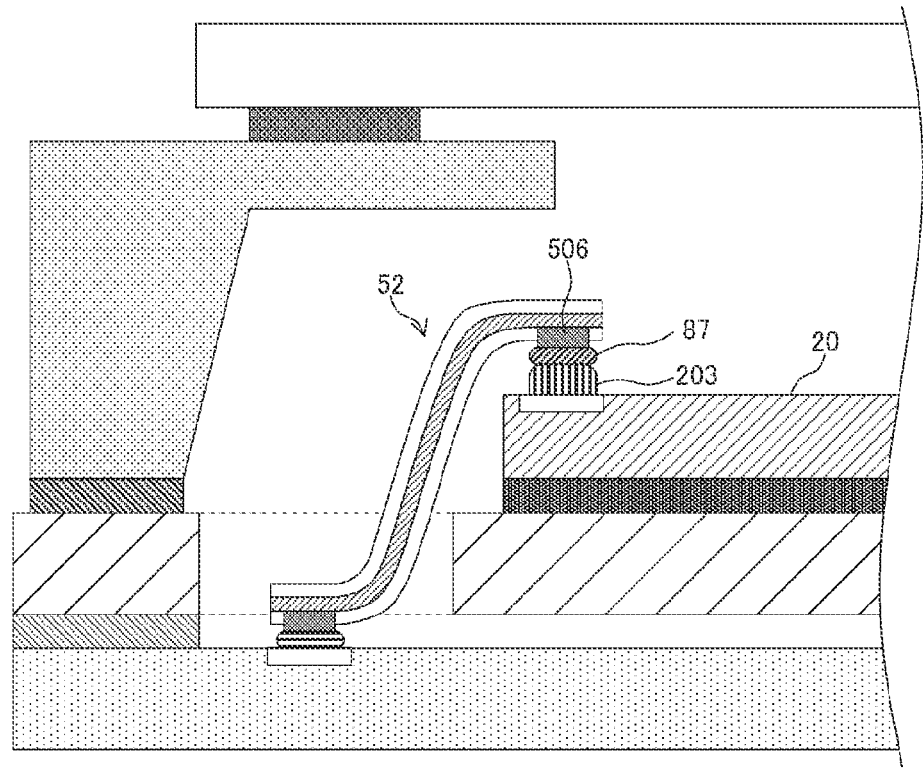

FIGS. 28A and 28B are cross-sectional views showing other example configurations of imaging apparatuses according to the eleventh embodiment of the present disclosure. In this drawing, FIG. 28A shows an example in which flexible wiring plates 53 are provided in place of the flexible wiring plates 52. The flexible wiring plates 53 are flexible wiring plates that are folded back after performing connection in the direction reverse from that in FIG. 27 at the portions connected to the imaging device 20. With such folded-back portions, it is possible to reduce stress in a case where stress in the tensile direction is applied to the flexible wiring plates 53 due to the expansion/contraction difference between the heat releasing plate 30 and the circuit board 40.

In the drawing, FIG. 28B shows an example in which the flexible wiring plates 52 are connected to the bumps 203 by the anisotropic conductive films (ACFs) 87. As shown in FIG. 28B in the drawing, the ACFs 87 can be used for connection to both the imaging device 20 and the circuit board 40. Alternatively, the ACFs 87 can be used for either the imaging device 20 or the circuit board 40, for example.

The other components of the imaging apparatus 1 are similar to the components of the imaging apparatus 1 described in the first embodiment of the present disclosure, and therefore, explanation of them is not made herein.

As described above, in the imaging apparatus 1 of the eleventh embodiment of the present disclosure, the imaging device 20 and the circuit board 40 are connected by the flexible wiring plates. Thus, breaking and the like of the connecting portions of the imaging device 20 and the circuit board 40 can be prevented.

12. Twelfth Embodiment

In the imaging apparatus 1 of the eleventh embodiment described above, the pads 201 are disposed in the upper surface of the imaging device 20. On the other hand, an imaging apparatus 1 of a twelfth embodiment of the present disclosure differs from the eleventh embodiment described above, in that an imaging device 20 having the pads 201 in its lower surface is connected to the circuit board 40.

[Configuration of an Imaging Apparatus]

Figure 29:
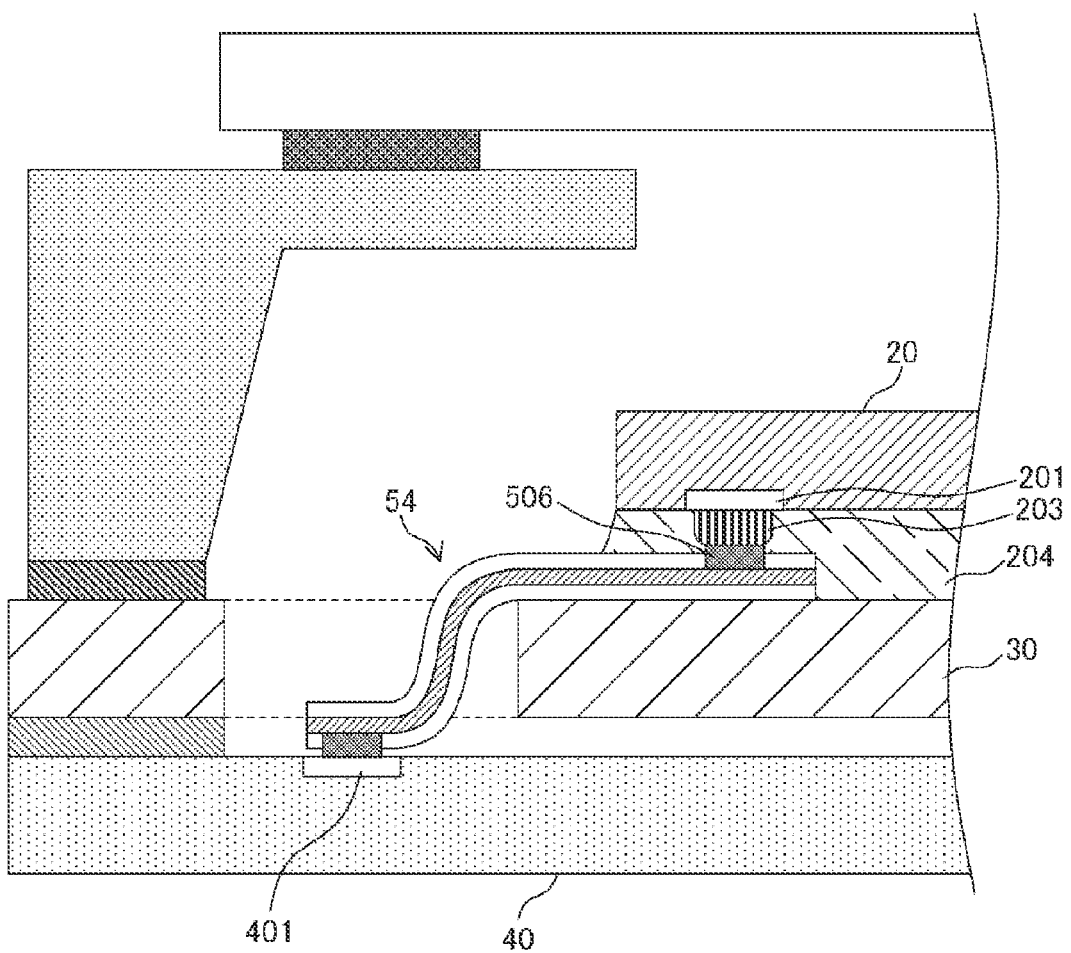
FIG. 29 is a cross-sectional view showing an example configuration of an imaging apparatus according to a twelfth embodiment of the present disclosure.

FIG. 29 is a cross-sectional view showing an example configuration of an imaging apparatus according to the twelfth embodiment of the present disclosure. The imaging apparatus 1 in this drawing differs from the imaging apparatus 1 described above with reference to FIG. 27, in that the pads 201 and the bumps 203 are disposed on the lower surface of the imaging device 20, and the flexible wiring plates 54 are provided in place of the flexible wiring plates 52.

The flexible wiring plate 54 in this drawing is disposed along the heat releasing plate 30. The imaging device 20 is connected to this flexible wiring plate 54 by flip-chip bonding. This connection may be direct connection of the bump 203 and the pad 506, or connection with an ACF. After this connection, a liquid adhesive 204 is applied between the imaging device 20 and the heat releasing plate 30, and is hardened. Thus, the imaging device 20 can be bonded to the heat releasing plate 30. This adhesive 204 is referred to as underfill.

[Another Configuration of an Imaging Apparatus]

Figure 30:
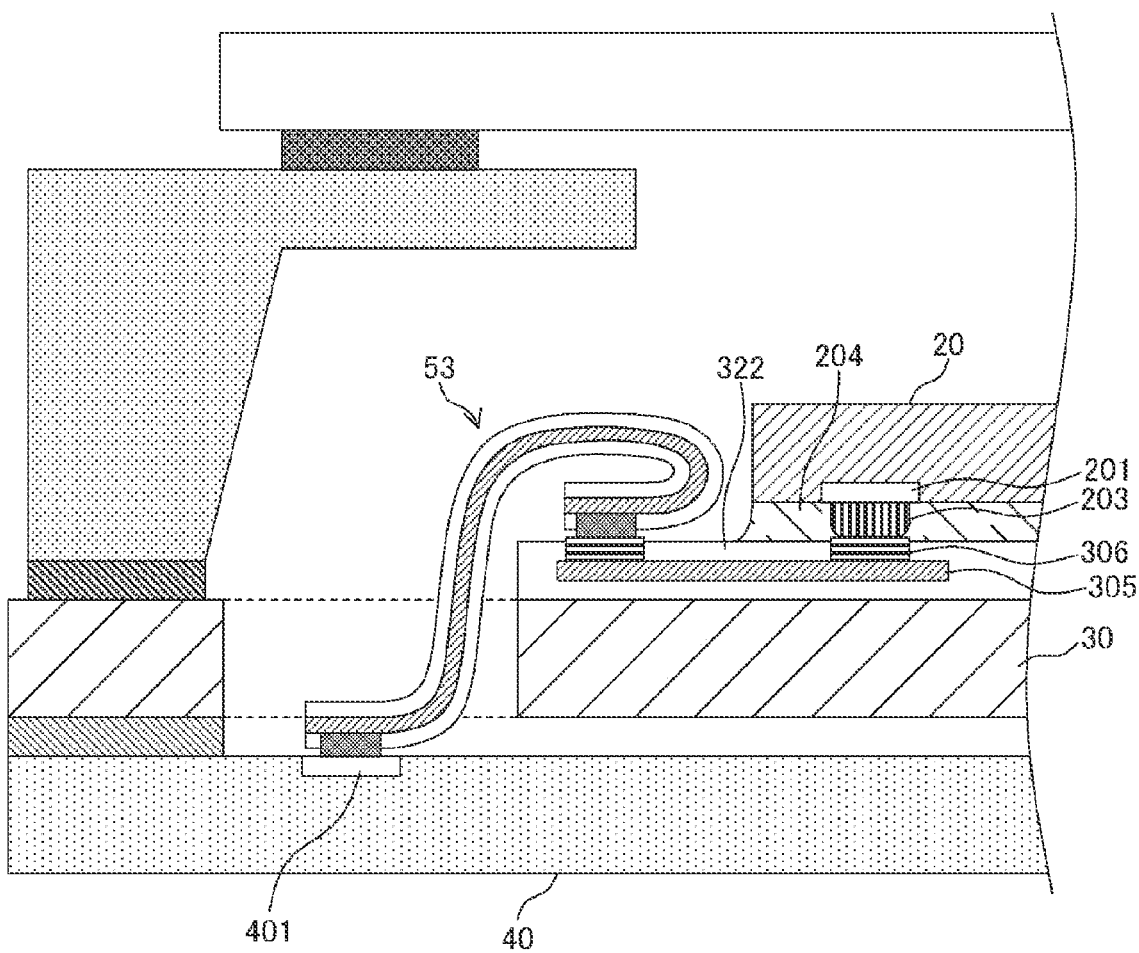
FIG. 30 is a cross-sectional view showing another example configuration of an imaging apparatus according to the twelfth embodiment of the present disclosure.

FIG. 30 is a cross-sectional view showing another example configuration of an imaging apparatus according to the twelfth embodiment of the present disclosure. The heat releasing plate in this drawing differs from that of the imaging apparatus 1 described above with reference to FIG. 29, in that a wiring region is formed on the surface on which the imaging device 20 is disposed.

In the heat releasing plate 30 in this drawing, a wiring region including an insulating layer 322 and a wiring layer 305 is formed on the surface on which the imaging device 20 is disposed. Further, pads 306 are formed on the wiring layer 305. The bumps 203 of the imaging device 20 are connected to the wiring layer 305 via the pads 306. Further, the flexible wiring plates 53 are connected between the circuit board 40 and the wiring layer 305. Note that the wiring layer 305 is an example of the conductive member disclosed in the claims.

The other components of the imaging apparatus 1 are similar to the components of the imaging apparatus 1 described in the first embodiment of the present disclosure, and therefore, explanation of them is not made herein.

As described above, in the imaging apparatus 1 of the twelfth embodiment of the present disclosure, in a case where an imaging device 20 having the pads 201 and the bumps 203 disposed on the lower surface is used, the imaging device 20 is mounted by flip-chip bonding. Thus, the imaging device 20 can be connected to the circuit board 40.

13. Thirteenth Embodiment

In the imaging apparatus 1 of the first embodiment described above, the imaging device 20 is bonded to the flat heat releasing plate 30. On the other hand, an imaging apparatus 1 of a thirteenth embodiment of the present disclosure differs from the first embodiment described above, in that the imaging device 20 is bonded to a heat releasing plate 30 having recesses.

In the imaging apparatus 1, an image of the object is formed on the pixel array unit 202 by an imaging lens disposed outside. At that stage, the distance from the imaging lens differs between the central portion and the edge portion of the pixel array unit 202, and the peripheral portion is blurred, resulting in degradation of image quality. Therefore, the imaging device 20 is curved, so that the distances from the imaging lens to the central portion and the edge portion of the pixel array unit 202 can be made substantially equal.

[Configurations of Imaging Apparatuses]

Figure 31A:
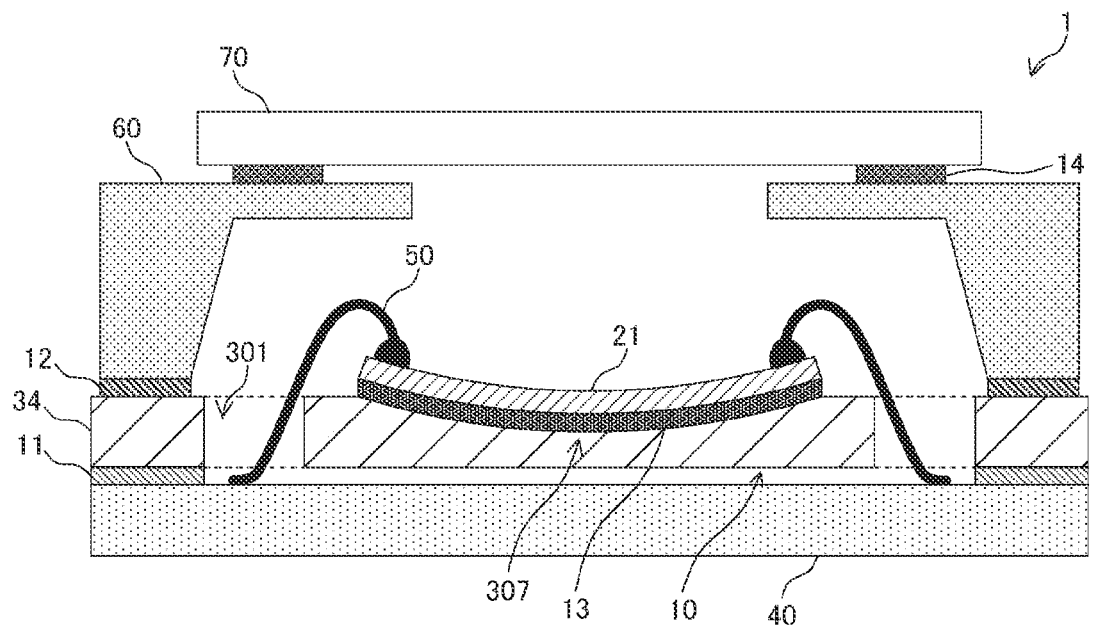
FIGS. 31A and 31B are cross-sectional views showing example configurations of imaging apparatuses according to a thirteenth embodiment of the present disclosure.
Figure 31B:
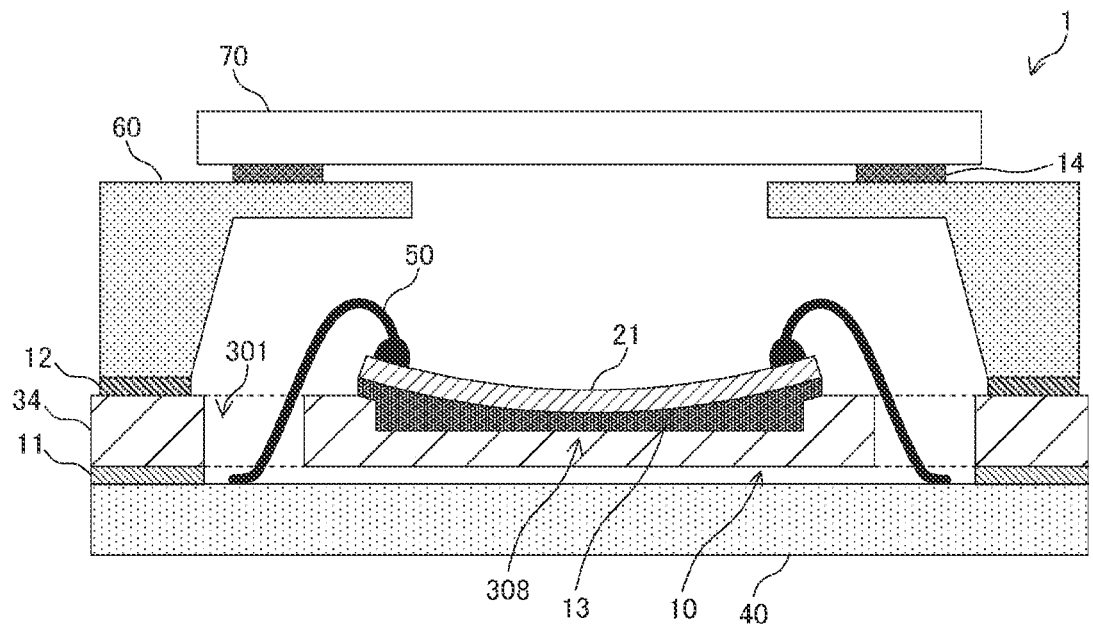

FIGS. 31A and 31B are cross-sectional views showing example configurations of imaging apparatuses according to the thirteenth embodiment of the present disclosure. In the imaging apparatus 1 in this drawing differs from the imaging apparatus 1 described above with reference to FIG. 3, in that a heat releasing plate 34 is used in place of the heat releasing plate 30, and an imaging device 21 is used in place of the imaging device 20.

In the heat releasing plate 34 in the drawing, a recess 307 is formed in the region to which the imaging device 20 is to be bonded. This recess 307 is a concave portion curved in a spherical shape. Further, the imaging device 21 in the drawing is an imaging device that is thinned by grinding the imaging device 20. As the thinned imaging device 21 is bonded to the recess 307, the shape of the recess 307 can be transferred to the imaging device 21, so that the imaging device 21 can be curved. As the spherically curved recess 307 is used, the accuracy of the curvature of the imaging device 21 can be increased. Note that the recess 307 can be formed as a concave portion curved in a cylindrical shape.

In the drawing, FIG. 31B shows an example of a heat releasing plate 34 including a recess 308 having a rectangular cross-section. With the recess 308 having a rectangular shape, the manufacture of the heat releasing plate 34 can be simplified.

[Method for Manufacturing an Imaging Apparatus]

Figure 32A:
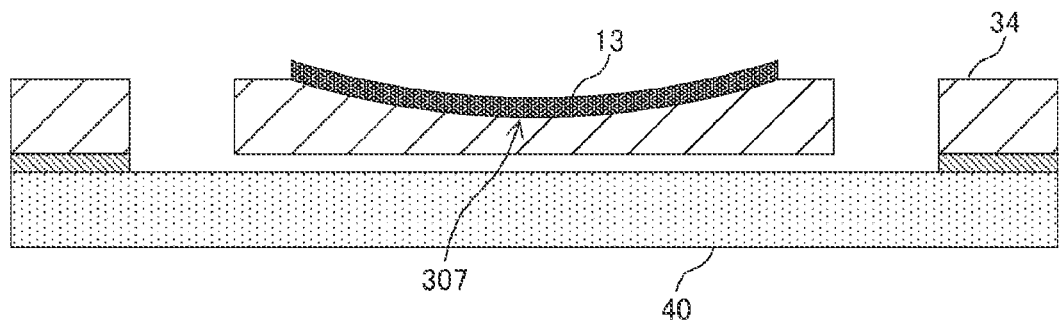
FIGS. 32A, 32B, and 32C are diagrams showing an example of a method for manufacturing an imaging apparatus according to the thirteenth embodiment of the present disclosure.
Figure 32B:
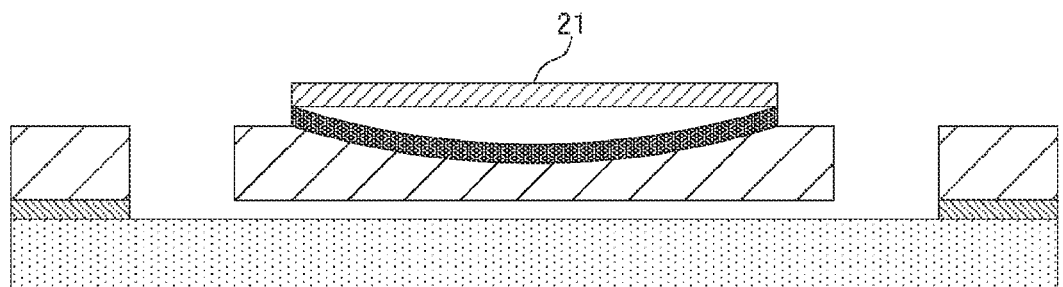
Figure 32C:
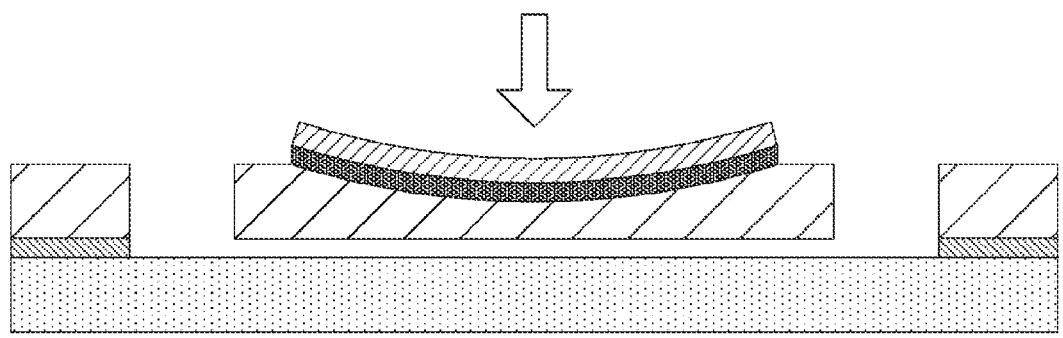

FIGS. 32A, 32B, and 32C are diagrams showing an example of a method for manufacturing an imaging apparatus according to the thirteenth embodiment of the present disclosure. This drawing shows the process of bonding the imaging device 20 to the heat releasing plate 34. The manufacturing process is now described, with the imaging apparatus 1 in FIG. 31A being an example. First, the die bond material 13 is applied to the recess 307 of the heat releasing plate 34 bonded to the circuit board 40 (FIG. 32A). Next, the imaging device 20 is placed on the die bond material 13 (FIG. 32B). Next, air is blown onto the imaging device 21 to harden the die bond material 13, while the imaging device 21 is pressed against the recess 307 (FIG. 32C). Note that the white arrow in FIG. 32C in the drawing indicates the air to be blown. Thus, the imaging device 21 can be curved.

[Another Configuration of an Imaging Apparatus]

Figure 33:
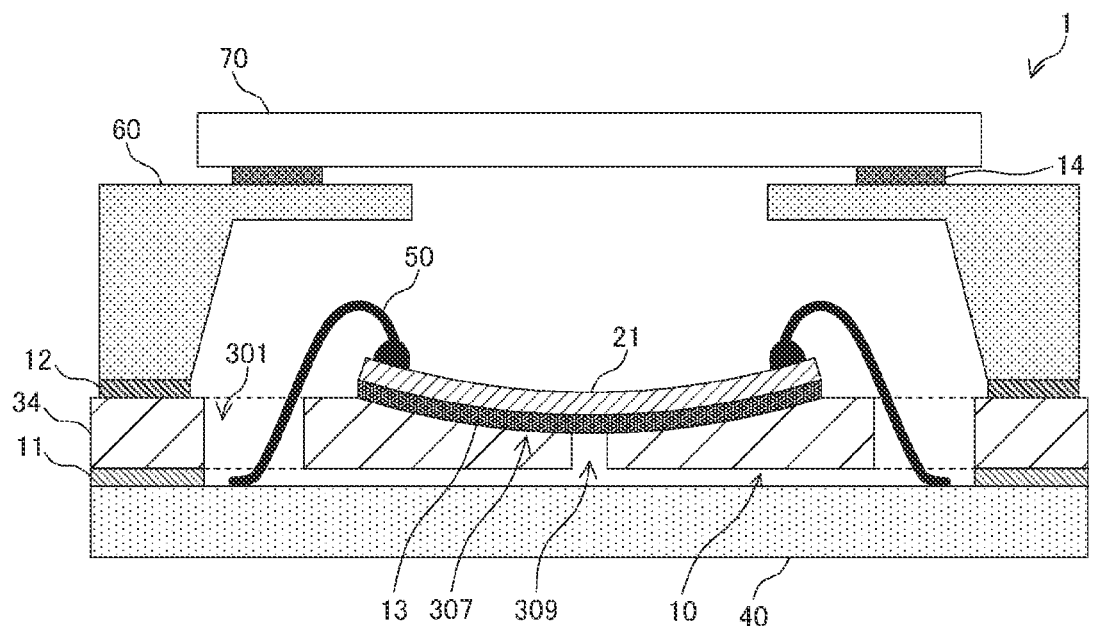
FIG. 33 is a diagram showing another example configuration of an imaging apparatus according to the thirteenth embodiment of the present disclosure.

FIG. 33 is a diagram showing another example configuration of an imaging apparatus according to the thirteenth embodiment of the present disclosure. The heat releasing plate 34 in this drawing differs from the heat releasing plate 34 described above with reference to FIG. 31A, in that a hole 309 is formed. The hole 309 is a hole for sucking the imaging device 21. When the imaging device 21 is bonded to the heat releasing plate 34, the imaging device 21 is sucked through the hole 309, so that the imaging device 21 can be pressed against the recess 307 of the heat releasing plate 34.

The other components of the imaging apparatus 1 are similar to the components of the imaging apparatus 1 described in the first embodiment of the present disclosure, and therefore, explanation of them is not made herein.

As described above, in the imaging apparatus 1 of the thirteenth embodiment of the present disclosure, the heat releasing plate 34 having a recess is used to curve the imaging device 21. Thus, degradation of image quality can be reduced.

14. Fourteenth Embodiment

In the imaging apparatus 1 of the first embodiment described above, the imaging device 20 is bonded to the heat releasing plate 30. On the other hand, an imaging apparatus 1 of a thirteenth embodiment of the present disclosure differs from the first embodiment described above, in that the heat release properties of the heat releasing plate are improved.

As the air gap 10 is formed between the heat releasing plate 30 having the imaging device 20 disposed thereon and the circuit board 40, heat conduction from the heat releasing plate to the circuit board 40 is hindered, and the heat release properties of the imaging device 20 are degraded. Therefore, a heat releasing plate that improves heat release properties is suggested herein.

[Configurations of Imaging Apparatuses]

Figure 34A:
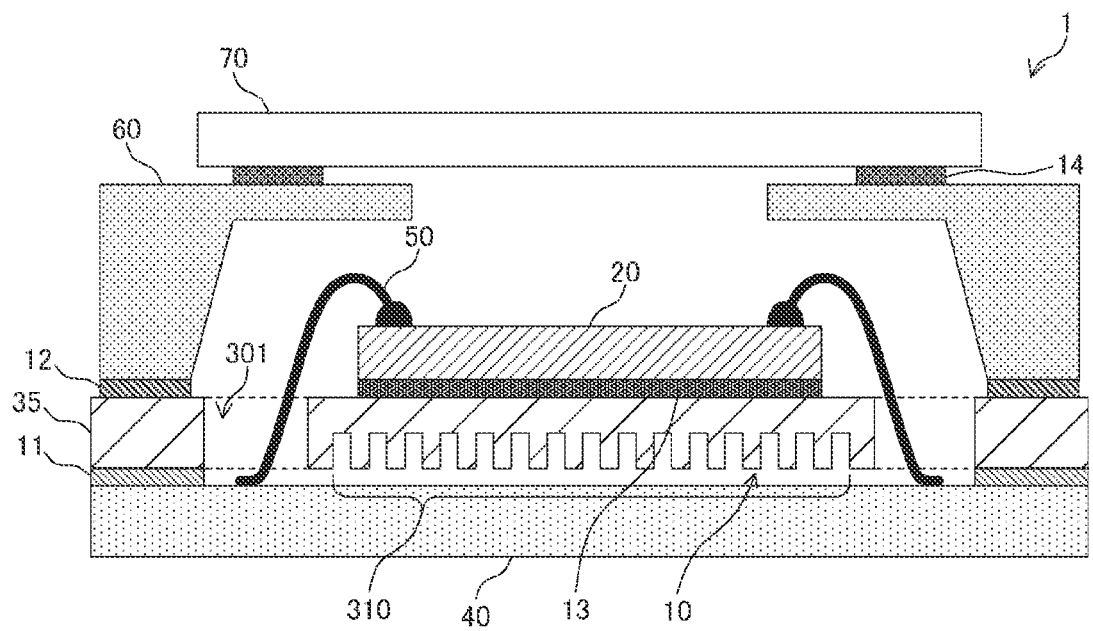
FIGS. 34A and 34B are cross-sectional views showing example configurations of imaging apparatuses according to a fourteenth embodiment of the present disclosure.
Figure 34B:
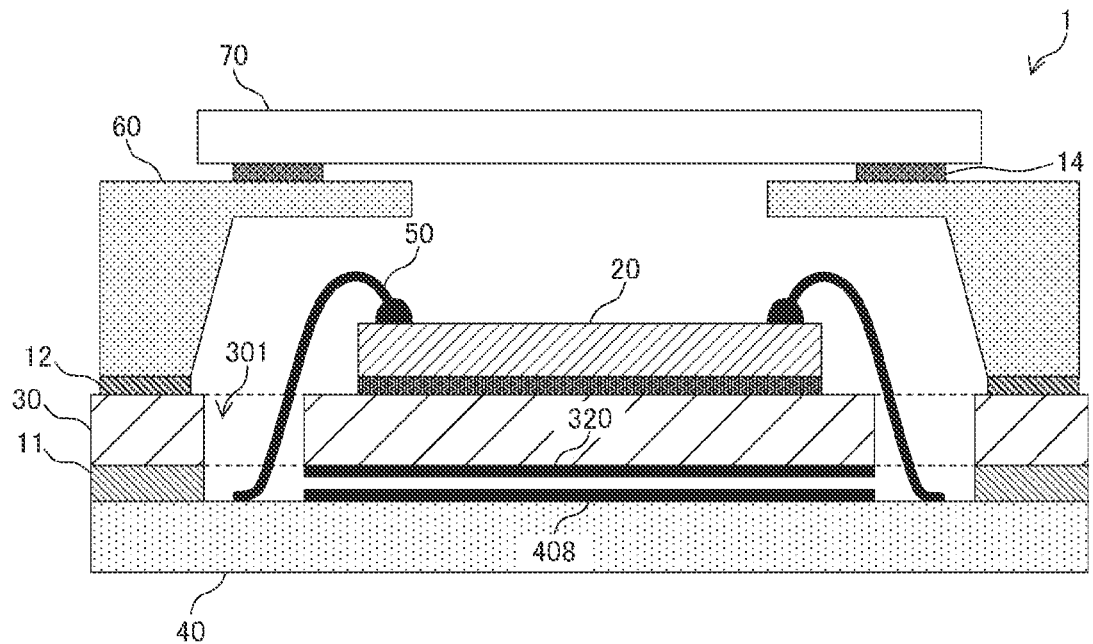

FIGS. 34A and 34B are cross-sectional views showing example configurations of imaging apparatuses according to the fourteenth embodiment of the present disclosure. The imaging apparatus 1 in FIG. 34A in the drawing differs from the imaging apparatus 1 described above with reference to FIG. 3, in that a heat releasing plate 35 is used in place of the heat releasing plate 30.

The heat releasing plate 35 in FIG. 34A in the drawing has a heat releasing portion 310 on a different surface from the surface to which the imaging device 20 is bonded in the semiconductor chip placement region. The heat releasing portion 310 widens the area of contact with the gas (air) enclosed in the imaging apparatus 1, to improve the heat release properties of the heat releasing plate 35, and reduce the increase in the temperature of the imaging device 20. The heat releasing portion 310 can be formed by performing etching on the surface of the heat releasing plate 35 and form irregularities in the surface, for example. Alternatively, the surface of the heat releasing plate 35 may be roughened by sandblasting or the like, for example, to form the heat releasing portion 310.

In the drawing, FIG. 34B shows an example in which blackened portions 320 and 408 are formed on the surfaces of the heat releasing plate 30 and the circuit board 40, respectively. Heat release and radiation is facilitated by the blackened portions 320 and 408, so that the heat release properties of the heat releasing plate 30 can be improved. The blackened portions 320 and 408 can be formed by blackening the surfaces, for example. Alternatively, the blackened portions 320 and 408 can be formed by applying a black paint to the surfaces, for example.

The other components of the imaging apparatus 1 are similar to the components of the imaging apparatus 1 described in the first embodiment of the present disclosure, and therefore, explanation of them is not made herein.

As described above, the imaging apparatus 1 according to the fourteenth embodiment of the present disclosure improves the heat release properties of the heat releasing plate 30. Thus, the increase in the temperature of the imaging device 20 can be reduced.

15. Fifteenth Embodiment

In the imaging apparatus 1 of the first embodiment described above, the semiconductor chip placement region is designed to be movable. On the other hand, a fifteenth embodiment of the present disclosure suggests a configuration that restricts vibration of the semiconductor chip placement region.

As the semiconductor chip placement region is designed to be movable, an imaging apparatus 1 vibrates due to external impact. This vibration causes damage such as breaking of the conductive wires 50. Therefore, the vibration of the semiconductor chip placement region is reduced, to prevent damage to the conductive wires 50.

[Configurations of Heat Releasing Plates]

Figure 35A:
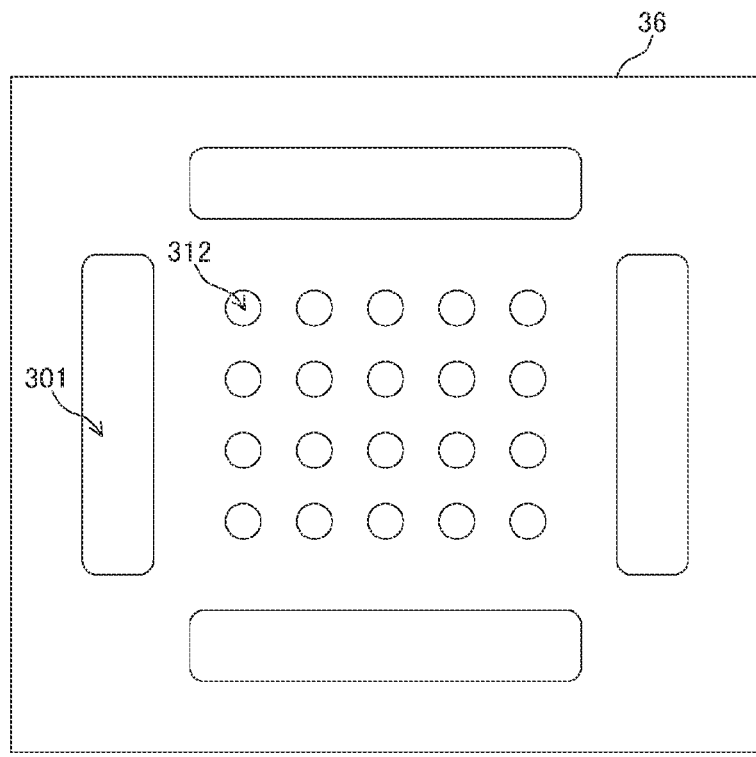
FIGS. 35A and 35B are plan views showing example configurations of heat releasing plates according to a fifteenth embodiment of the present disclosure.
Figure 35B:
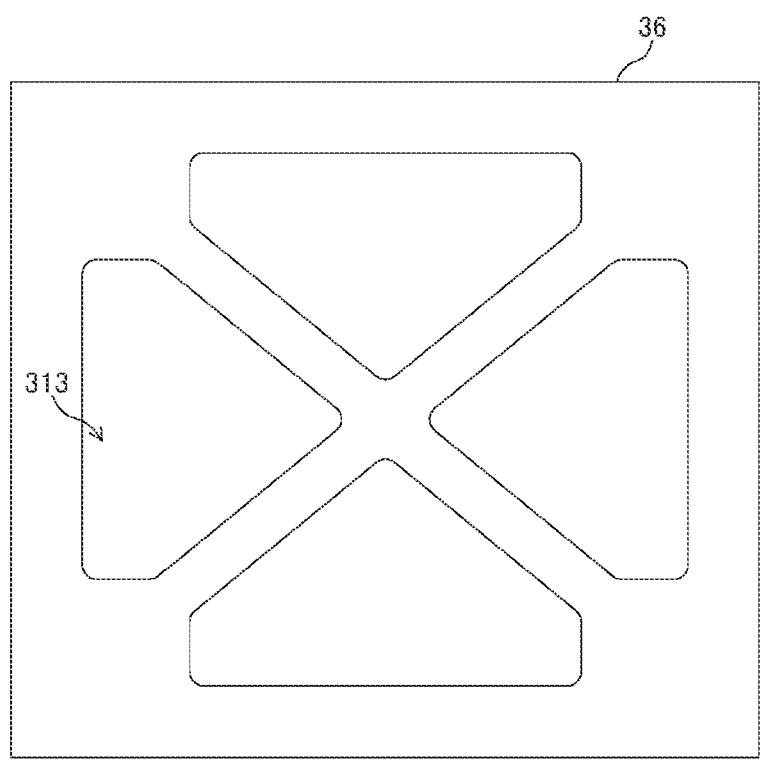

FIGS. 35A and 35B are plan views showing example configurations of heat releasing plates according to the fifteenth embodiment of the present disclosure. Heat releasing plates 36 in the drawing have openings in the semiconductor chip placement region. The heat releasing plate 36 in FIG. 35A in the drawing has a plurality of openings 312 in the semiconductor chip placement region. Further, the heat releasing plate 36 in FIG. 35B in the drawing has openings 313. The openings 313 are combinations of the openings 301 described above with reference to FIG. 3 and openings formed in the semiconductor chip placement region. By virtue of such openings 312 or the like formed in the semiconductor chip placement region, the heat releasing plate 36 can be made lighter. Thus, vibration of the heat releasing plate 36 can be reduced. Note that the openings 312 or the like increase the thermal resistances of the imaging device 20 and the heat releasing plate 36. Therefore, the size and the number of the openings 312 need to be adjusted in accordance with the amount of heat generated from the imaging device 20. Also, the openings 312 or the like may be arranged in a non-uniform manner, to prevent the occurrence of resonance of the semiconductor chip placement region, and reduce vibration of the semiconductor chip placement region. Alternatively, the heat releasing plate in the semiconductor chip placement region may be ground, to be thinner and lighter, for example.

Figure 36:
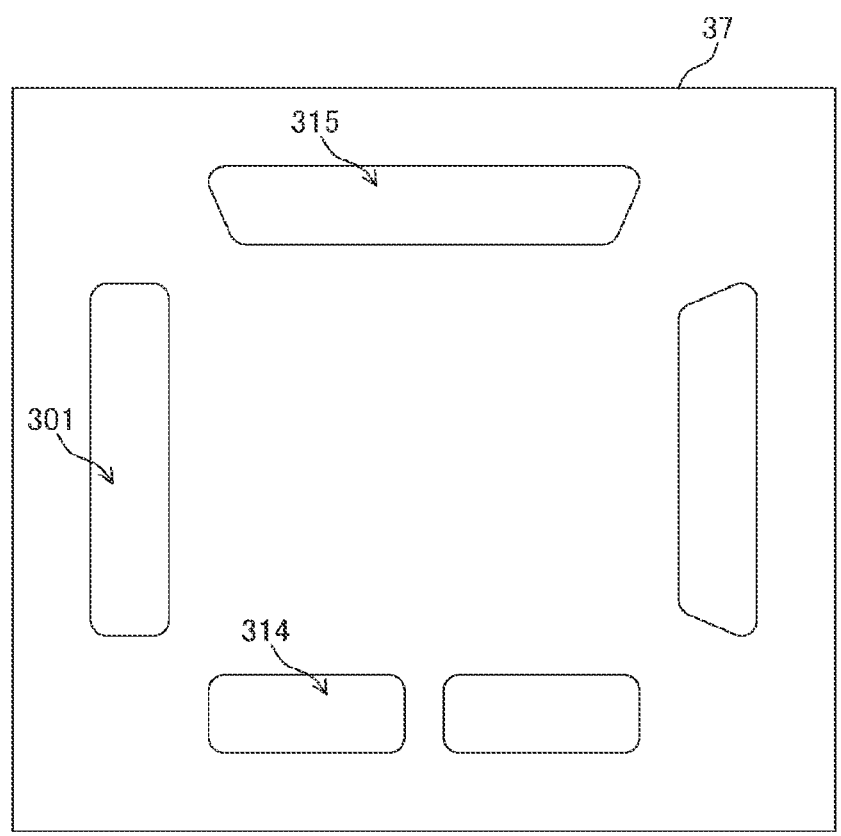
FIG. 36 is a plan view showing another example configuration of a heat releasing plate according to the fifteenth embodiment of the present disclosure.

FIG. 36 is a plan view showing another example configuration of a heat releasing plate according to the fifteenth embodiment of the present disclosure. A heat releasing plate 37 in the drawing is a heat releasing plate that has the openings 301, and openings 314 and 315 in different shapes from that of the openings 301. The opening 315 is an opening formed in a trapezoidal shape. As the opening 315 is formed in a trapezoidal shape, the areas of the beam portions between the openings can be widened, while the regions for wire bonding of the conductive wires 50 are secured. Thus, vibration of the semiconductor chip placement region can be reduced. Meanwhile, the openings 314 are miniaturized openings formed by dividing an opening formed in the vicinity of one side of the imaging device 20. Thus, beam portions can be formed in regions other than those in the vicinities of the four corners of the imaging device 20, and vibration can be reduced. Note that, in a case where a plurality of such beam portions is formed, the beam portions are arranged asymmetrically, so that resonance in the semiconductor chip placement region can be prevented.

Figure 37A:
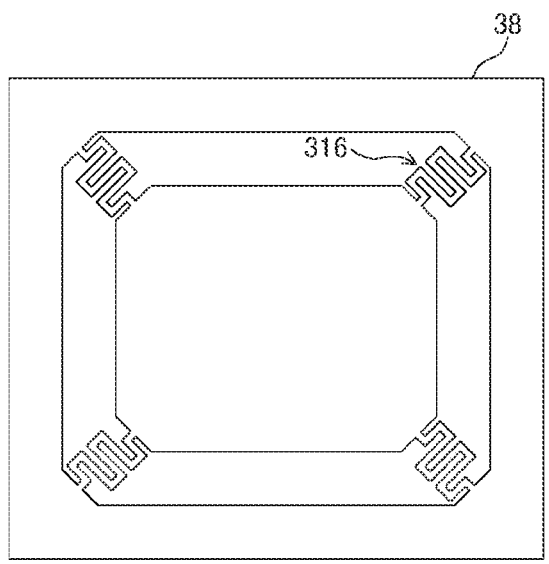
FIGS. 37A, 37B, and 37C are plan views showing other example configurations of heat releasing plates according to the fifteenth embodiment of the present disclosure.
Figure 37B:
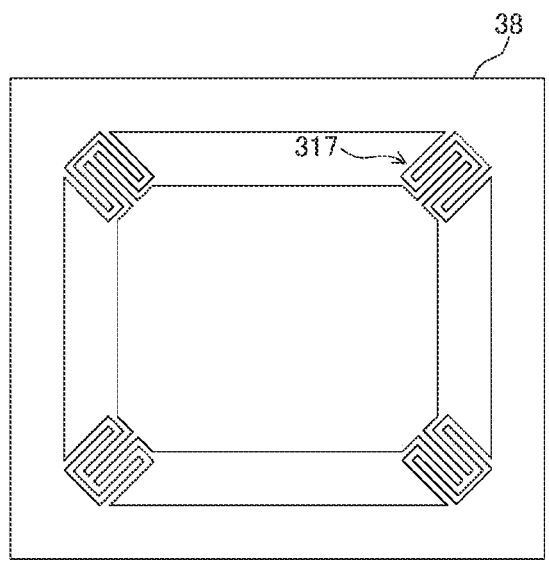
Figure 37C:
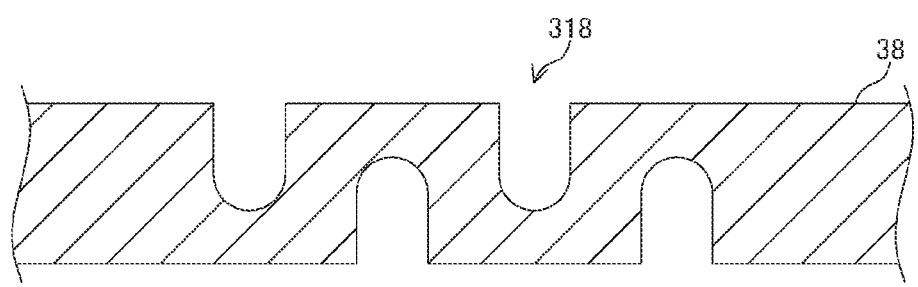

FIGS. 37A, 37B, and 37C are plan views showing other example configurations of heat releasing plates according to the fifteenth embodiment of the present disclosure. Heat releasing plates 38 in this drawing include vibration damping portions that reduce vibration of the semiconductor chip placement region. Vibration damping portions are disposed at beam portions that suspend the semiconductor chip placement region. In the drawing, FIGS. 37A and 37B show examples in which vibration damping portions 316 and 317 formed in meander shapes are adopted, respectively. Further, FIG. 37C in the drawing shows an example of a vibration damping portion 318 that is formed by creating recesses in the beam portions on the front and back surfaces, the recesses extending in the thickness direction. With such vibration damping portions 316 to 318, vibration of the semiconductor chip placement region can be reduced.

Figure 38:
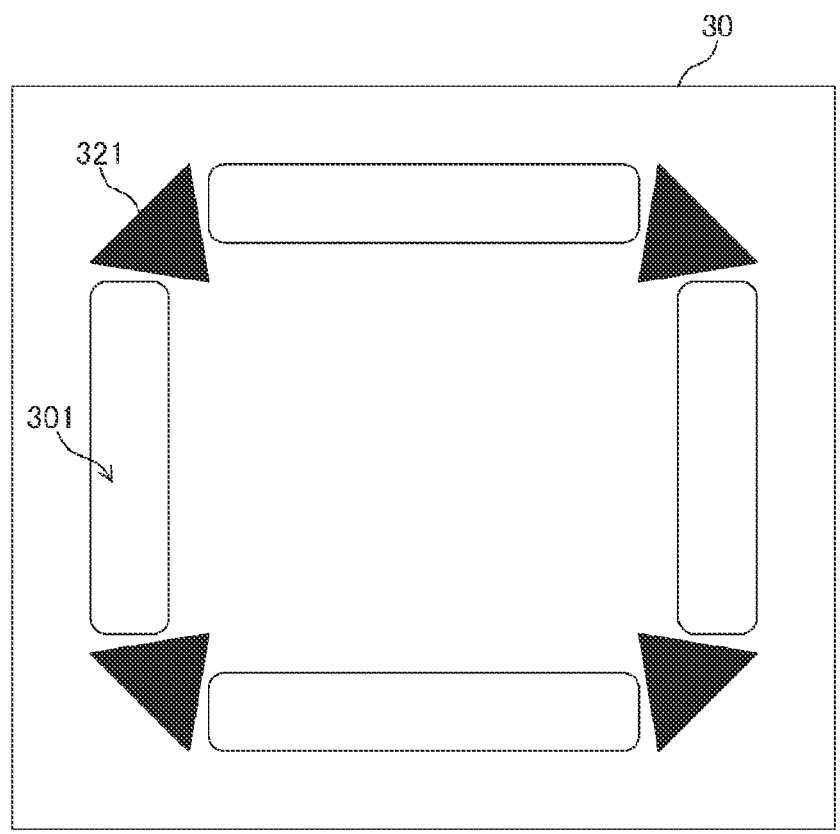
FIG. 38 is a plan view showing another example configuration of a heat releasing plate according to the fifteenth embodiment of the present disclosure.

FIG. 38 is a plan view showing another example configuration of a heat releasing plate according to the fifteenth embodiment of the present disclosure. In the heat releasing plate 30 shown in this drawing, vibration damping portions 321 are disposed at the beam portions. The vibration damping portions 321 include an elastic material such as rubber, and are disposed at the beam portions of the heat releasing plate 30, to reduce vibration of the semiconductor chip placement region. The vibration damping portions 321 can be formed in a sheet-like shape, for example, and be bonded to the beam portions. Alternatively, gel-like vibration damping portions 321 may be applied onto the beam portions. The vibration damping portions 321 can be disposed on either the front surface or the back surface, or on both surfaces of the heat releasing plate 30. Further, the vibration damping portions 321 can be used in conjunction with the vibration damping portions 316 or the like described above with reference to FIGS. 37A, 37B, and 37C.

The other components of the imaging apparatus 1 are similar to the components of the imaging apparatus 1 described in the first embodiment of the present disclosure, and therefore, explanation of them is not made herein.

As described above, the imaging apparatus 1 of the fifteenth embodiment of the present disclosure reduces vibration of the semiconductor chip placement region. Thus, damage to the conductive wires 50 can be prevented.

16. Sixteenth Embodiment

In the imaging apparatus 1 of the first embodiment described above, the frame 60 is bonded to the heat releasing plate 30. On the other hand, a sixteenth embodiment of the present disclosure suggests a configuration that improves heat release properties in the frame 60.

The frame 60 includes a metal such as Cu, and the surfaces thereof are blackened. For example, black plating is performed. Thus, heat release properties can be improved. Further, by the blackening, reflection of incident light on the frame 60 can be reduced. For example, in a case where the reflectance is reduced to 1% or lower by the blackening, the occurrence of flares and the like can be prevented. Further, a solder or a metal-containing paste is used as the adhesive 12 that bonds the frame to the heat releasing plate 30, so that the heat from the heat releasing plate 30 and the circuit board 40 can be effectively transferred to the frame 60. To reduce the thermal resistance at this stage, the plating or the like on the surfaces of the frame 60 is preferably removed. Note that, in a case where a solder or the like is used as the adhesive 12, a paste-like solder is applied to the heat releasing plate 30, and the frame 60 is placed. After that, reflow soldering is performed, so that bonding can be performed.

[Configuration of a Frame]

Figure 39:
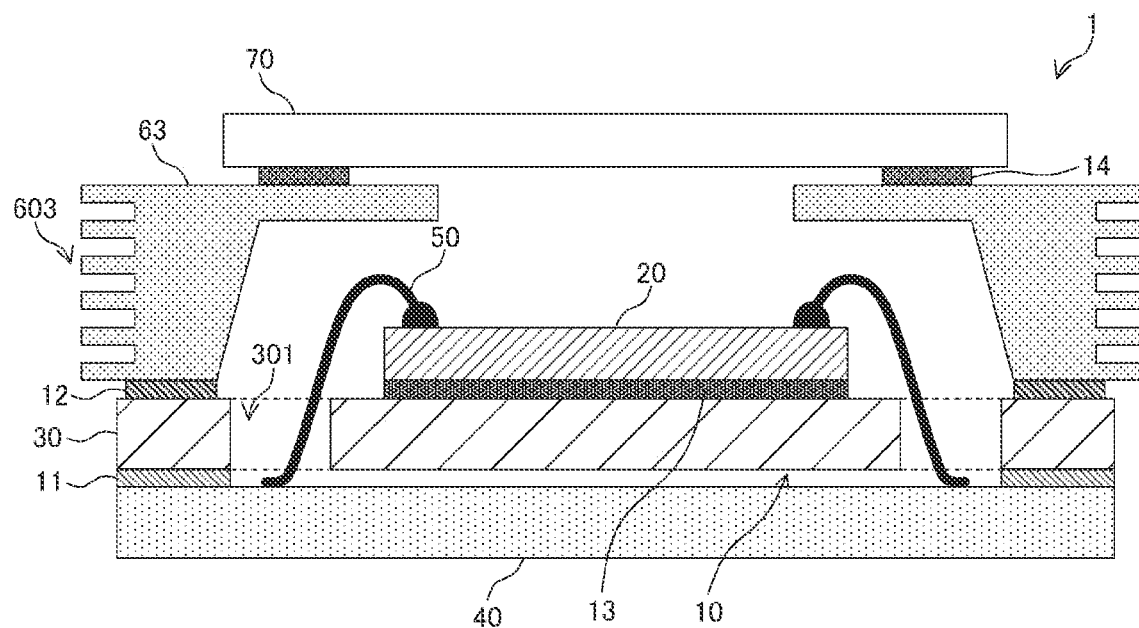
FIG. 39 is a cross-sectional view showing an example configuration of a frame according to a sixteenth embodiment of the present disclosure.

FIG. 39 is a cross-sectional view showing an example configuration of a frame according to the sixteenth embodiment of the present disclosure. A frame 63 in this drawing has heat releasing fins 603 formed on the side surfaces. Irregularities are formed in the side surfaces of the frame 63, so that the heat releasing fins 603 can be formed. The heat releasing fins 603 can improve the heat release properties of the frame 63.

[Configuration of a Heat Releasing Plate]

Figure 40:
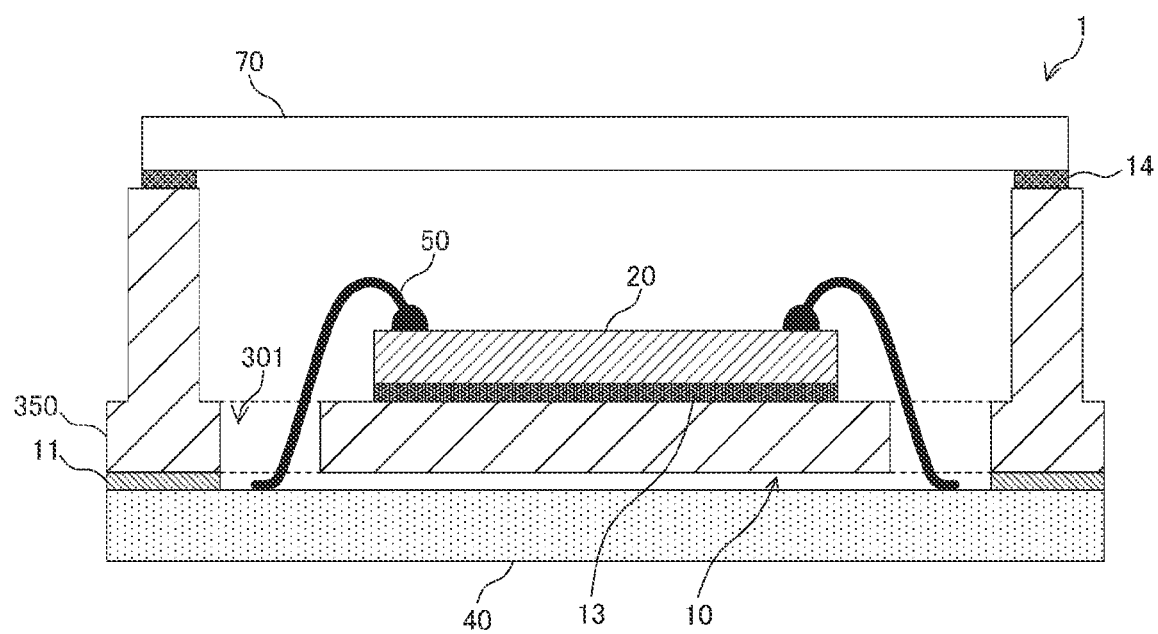
FIG. 40 is a cross-sectional view showing an example configuration of a heat releasing plate according to the sixteenth embodiment of the present disclosure.

FIG. 40 is a cross-sectional view showing an example configuration of a heat releasing plate according to the sixteenth embodiment of the present disclosure. A heat releasing plate 350 in this drawing is a heat releasing plate that has a wall portion surrounding the imaging device 20, and is integrally formed with the frame. As the heat releasing plate 350 is integrally formed with the frame, thermal resistance can be lowered, and heat release properties can be improved.

[Another Configuration of a Frame]

Figure 41:
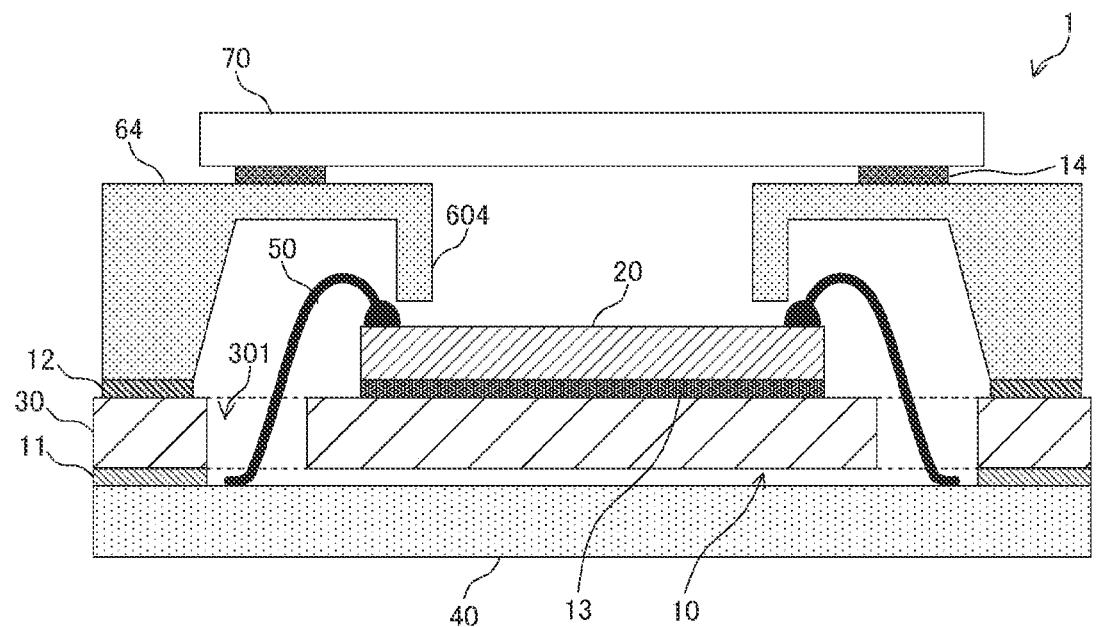
FIG. 41 is a cross-sectional view showing another example configuration of a frame according to the sixteenth embodiment of the present disclosure.

FIG. 41 is a cross-sectional view showing another example configuration of a frame according to the sixteenth embodiment of the present disclosure. A frame 64 in this drawing has a protrusion 604 at the brim portion of the upper surface. This protrusion 604 prevents emission of incident light onto the regions in which the conductive wires 50 are connected to the imaging device 20. This protrusion 604 can prevent reflection of incident light by the conductive wires 50, and reduce the occurrence of flares and the like.

The other components of the imaging apparatus 1 are similar to the components of the imaging apparatus 1 described in the first embodiment of the present disclosure, and therefore, explanation of them is not made herein.

As described above, the imaging apparatus 1 according to the sixteenth embodiment of the present disclosure improves the heat release properties of the frame. Thus, the increase in the temperature of the imaging device 20 can be reduced.

17. Seventeenth Embodiment

In the imaging apparatus 1 of the first embodiment described above, the air gap 10 is formed between the heat releasing plate 30 having the imaging device 20 disposed thereon and the circuit board 40. On the other hand, a seventeenth embodiment of the present disclosure differs from the first embodiment described above, in that a heat storage portion is provided in the air gap.

Since the power consumption of the imaging device 20 fluctuates, the amount of heat generated by the imaging device also changes. At this stage, in a case where a heat release capacity is set in accordance with the maximum power consumption of the imaging device 20 in the imaging apparatus 1, there is a problem, for example, that a cooling mechanism such as the heat releasing plate 30 of the imaging apparatus 1 becomes larger than necessary. Therefore, the amount of heat generated from the imaging device 20 is leveled, so that a cooling mechanism having a necessary and sufficient capacity can be formed.

[Configuration of an Imaging Apparatus]

Figure 42:
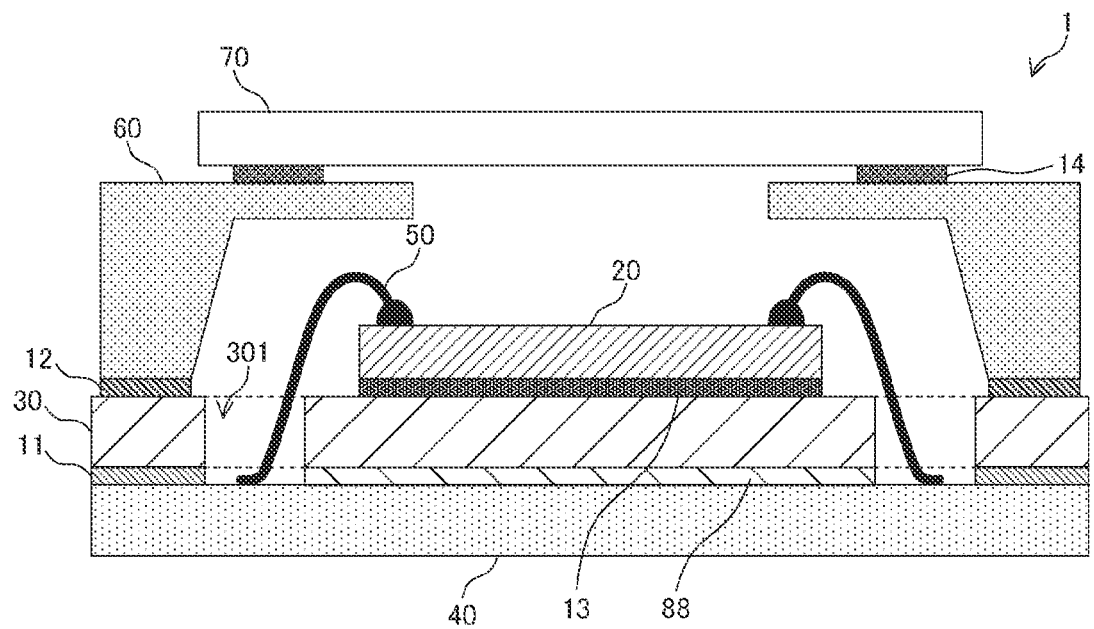
FIG. 42 is a cross-sectional view showing an example configuration of an imaging apparatus according to a seventeenth embodiment of the present disclosure.

FIG. 42 is a cross-sectional view showing an example configuration of an imaging apparatus according to the seventeenth embodiment of the present disclosure. The imaging apparatus 1 in this drawing differs from the imaging apparatus 1 described above with reference to FIG. 3, in including a heat storage portion 88 between the semiconductor chip placement region and the circuit board 40.

The heat storage portion 88 stores heat from the imaging device 20. As the heat storage portion 88 is disposed between the semiconductor chip placement region and the circuit board the heat generated in the imaging device 20 and transferred to the heat releasing plate 30 is temporarily stored in the heat storage portion 88. The heat stored in the heat storage portion 88 is leveled when the heat is transferred to the circuit board 40. The heat storage portion 88 needs to be configured by a low-elasticity material, so as not to affect warpage of the heat releasing plate 30. For example, the heat storage portion 88 can be formed by dispersing heat storage microcapsules containing paraffin or inorganic hydrated salt coated with a polymer in an epoxy-based or acrylic-based resin having a low elastic modulus. Alternatively, a composite material containing particles of vanadium oxide, tin alloy, or the like can also be used.

Further, as the heat storage portion 88 is provided, it is possible to reduce warpage of the imaging device 20 due to expansion and contraction of the components disposed below the imaging device 20, during the process of manufacturing the imaging apparatus 1.

The other components of the imaging apparatus 1 are similar to the components of the imaging apparatus 1 described in the first embodiment of the present disclosure, and therefore, explanation of them is not made herein.

As described above, in the imaging apparatus 1 of the seventeenth embodiment of the present disclosure, the heat storage portion 88 is provided, so that the cooling mechanism such as the heat releasing plate 30 can be optimized (miniaturized).

18. Eighteenth Embodiment

In the imaging apparatus 1 of the first embodiment described above, the air gap 10 is formed between the heat releasing plate 30 having the imaging device 20 disposed thereon and the circuit board 40. On the other hand, an eighteenth embodiment of the present disclosure differs from the first embodiment described above, in that a buffer portion is provided in the air gap.

[Configuration of an Imaging Apparatus]

Figure 43:
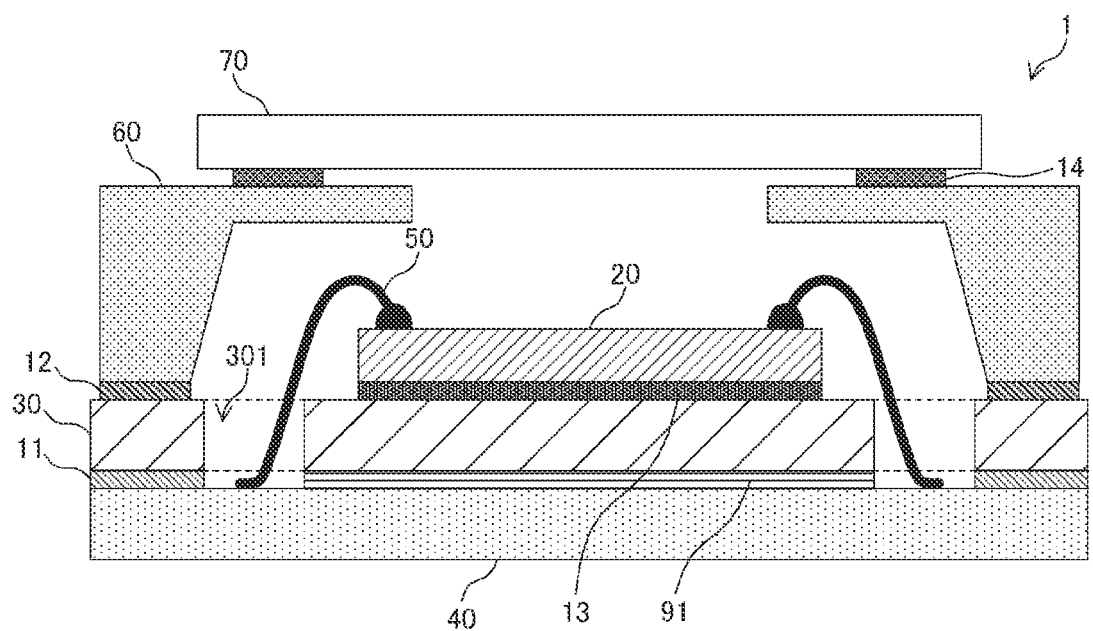
FIG. 43 is a cross-sectional view showing an example configuration of an imaging apparatus according to an eighteenth embodiment of the present disclosure.

FIG. 43 is a cross-sectional view showing an example configuration of an imaging apparatus according to the eighteenth embodiment of the present disclosure. The imaging apparatus 1 in this drawing differs from the imaging apparatus 1 described above with reference to FIG. 3, in including a buffer portion 91 between the semiconductor chip placement region and the circuit board 40.

The buffer portion 91 alleviates vibrational impact on the semiconductor chip placement region. As the buffer portion 91 is provided, the vibrational impact at the time of wire bonding of the conductive wires 50 can be alleviated, for example, and damage to the conductive wires 50 can be prevented. The buffer portion 91 can be formed with urethane rubber or natural rubber, for example. Also, the buffer portion 91 can be formed with a gel-like acrylic or urethane resin, for example. Further, the buffer portion 91 can be formed with a material having thixotropic properties. Also, silicon-based thermal grease can be used, to improve heat release properties as well as buffering properties. Further, a magnetic sheet can be provided, to use the magnetic repulsive force for alleviating vibrational impact.

[Configurations of Buffer Portions]

Figure 44A:
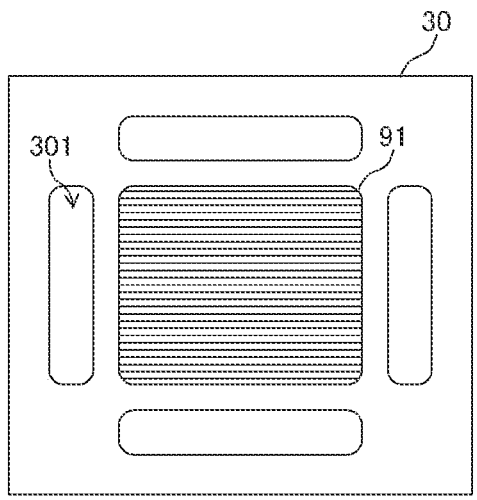
FIGS. 44A, 44B, 44C, 44D, 44E, and 44F are plan views showing example configurations of buffer portions according to the eighteenth embodiment of the present disclosure.
Figure 44B:
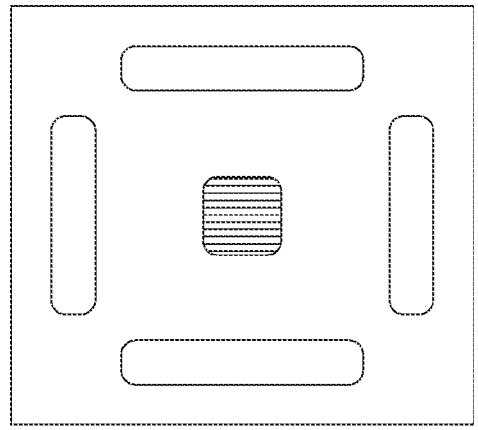
Figure 44C:
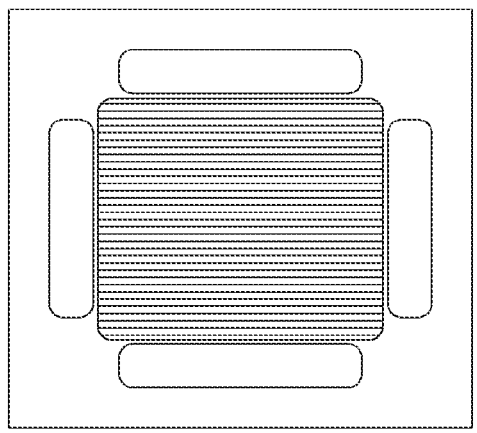
Figure 44D:
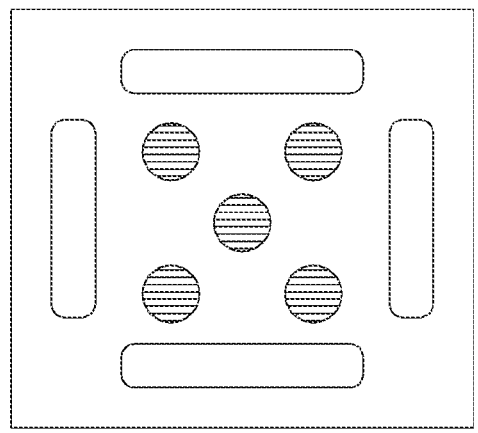
Figure 44E:
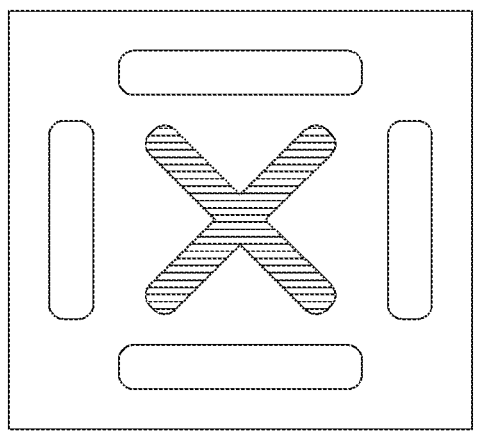
Figure 44F:
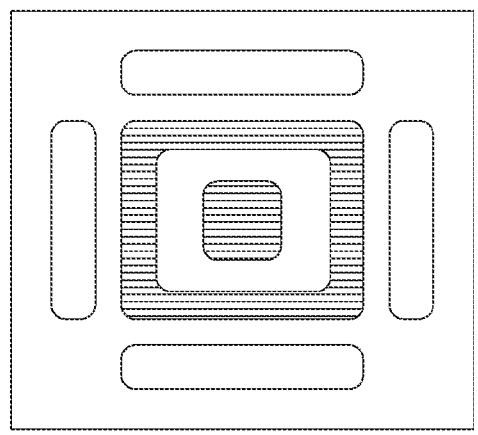

FIGS. 44A, 44B, 44C, 44D, 44E, and 44F are plan views showing example configurations of buffer portions according to the eighteenth embodiment of the present disclosure. This drawing is diagrams showing the shapes of buffer portions 91 provided in heat releasing plates 30. In the drawing, FIG. 44A shows an example of a buffer portion 91 that is disposed in substantially the same area as the imaging device 20. In the drawing, FIGS. 44B and 44C show examples in which a buffer portion 91 is formed in a smaller area and a larger area than the imaging device 20, respectively. In the drawing, FIG. 44D shows an example in which a plurality of circular buffer portions 91 is provided. In the drawing, FIG. 44E shows an example in which a buffer portion 91 is formed along the diagonal lines of the imaging device 20. In the drawing, FIG. 44F shows an example in which buffer portions 91 are provided at the central portion and an outer circumferential portion of the imaging device 20.

A rubber buffer portion 91 can be placed on the circuit board 40 before the heat releasing plate 30 is bonded to the circuit board 40, for example. Alternatively, a gel-like buffer portion 91 can be injected into the air gap 10 through the hole 409 described above with reference to FIG. 6, after the conductive wires 50 are wire-bonded to the imaging device 20.

The other components of the imaging apparatus 1 are similar to the components of the imaging apparatus 1 described in the first embodiment of the present disclosure, and therefore, explanation of them is not made herein.

As described above, in the imaging apparatus 1 of the eighteenth embodiment of the present disclosure, the buffer portion 91 is provided, so that vibrational impact on the semiconductor chip placement region can be alleviated.

19. Nineteenth Embodiment

The imaging apparatus 1 of the eighteenth embodiment described above has the buffer portion 91 disposed therein. On the other hand, a nineteenth embodiment of the present disclosure differs from the nineteenth embodiment described above, in that buffer portions are disposed on the heat releasing plate.

[Configuration of a Heat Releasing Plate]

Figure 45:
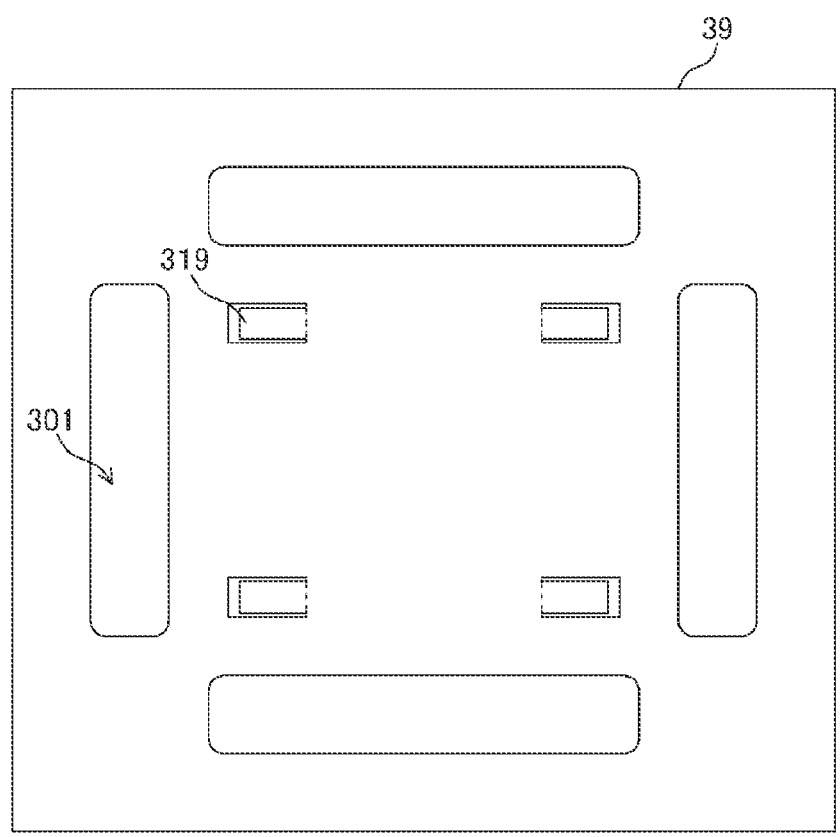
FIG. 45 is a plan view showing an example configuration of a heat releasing plate according to a nineteenth embodiment of the present disclosure.

FIG. 45 is a plan view showing an example configuration of a heat releasing plate according to the nineteenth embodiment of the present disclosure. A heat releasing plate 39 in this drawing has spring portions 319 formed in part of the semiconductor chip placement region.

[Configuration of an Imaging Apparatus]

Figure 46:
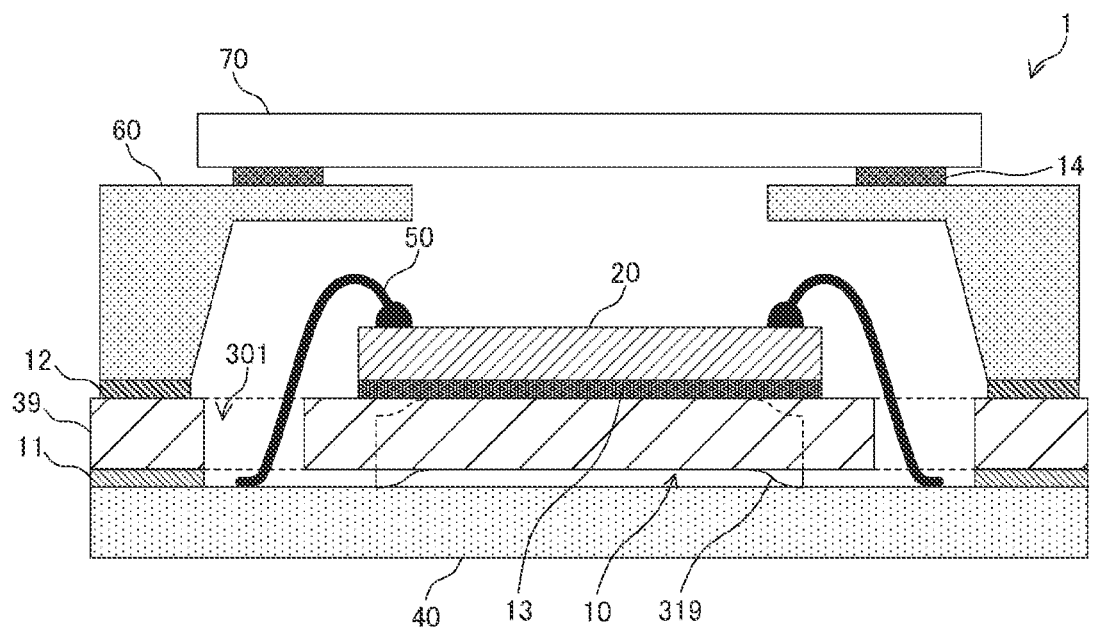
FIG. 46 is a cross-sectional view showing an example configuration of an imaging apparatus according to the nineteenth embodiment of the present disclosure.

FIG. 46 is a cross-sectional view showing an example configuration of an imaging apparatus according to the nineteenth embodiment of the present disclosure. The imaging apparatus 1 in this drawing differs from the imaging apparatus 1 described above with reference to FIG. 3, in including the above heat releasing plate 39 in place of the heat releasing plate 30.

As shown in the drawing, the spring portions 319 are bent toward the circuit board 40, and the tips of the bent portions are brought into contact with the circuit board 40, so that buffer portions can be formed. As a result, the configuration can be made simpler than the imaging apparatus 1 described above with reference to FIG. 43.

The other components of the imaging apparatus 1 are similar to the components of the imaging apparatus 1 described in the first embodiment of the present disclosure, and therefore, explanation of them is not made herein.

As described above, in the imaging apparatus 1 of the nineteenth embodiment of the present disclosure, buffer portions are disposed on the heat releasing plate, so that vibrational impact on the semiconductor chip placement region can be alleviated.

<20. Example Configuration of an Imaging Device>

[Configuration of an Imaging Device]

Figure 47:
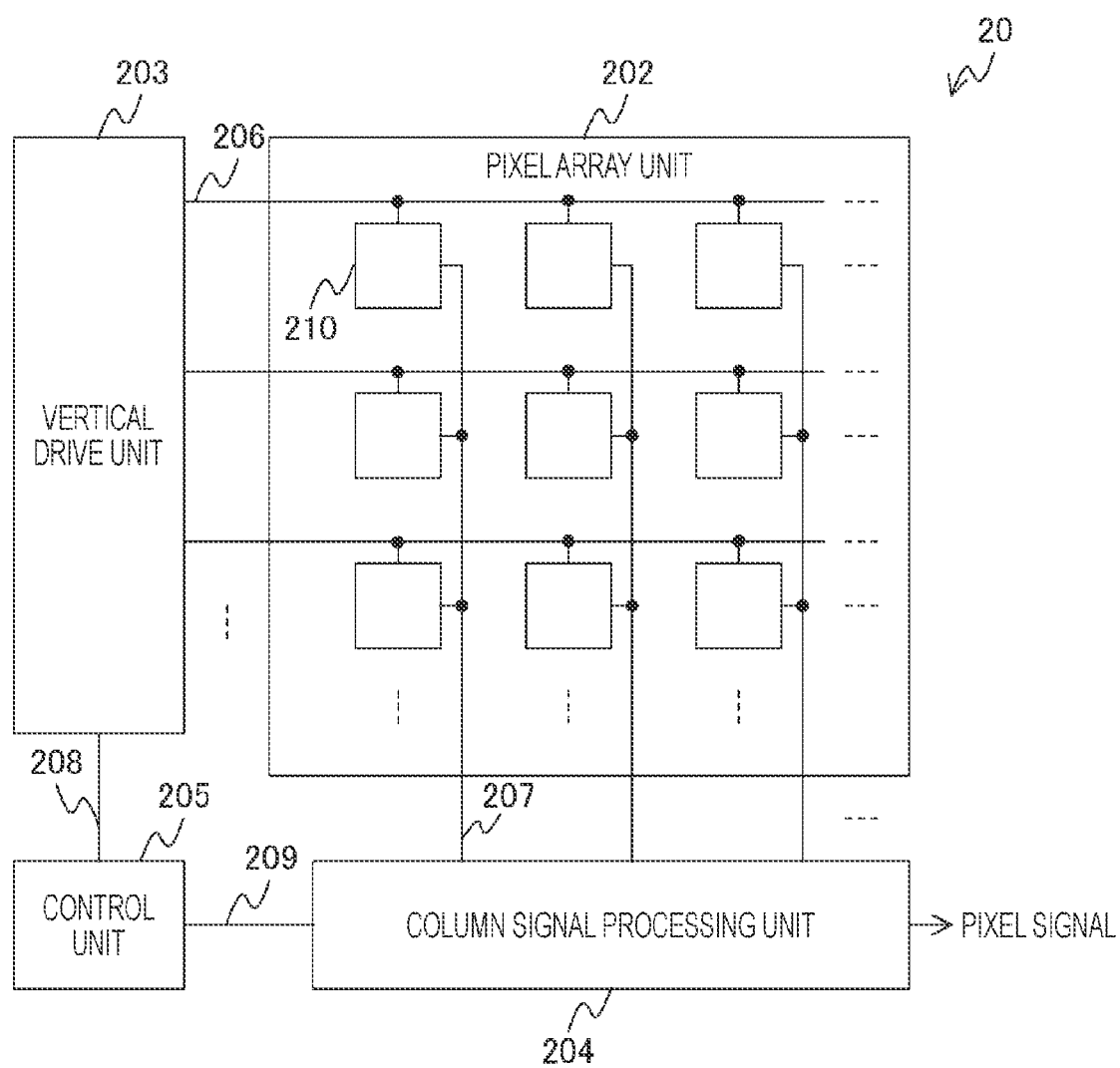
FIG. 47 is a diagram showing an example configuration of an imaging device according to an embodiment of the present disclosure.

FIG. 47 is a diagram showing an example configuration of an imaging device according to an embodiment of the present disclosure. The imaging device 20 in this drawing includes a pixel array unit 202, a vertical drive unit 203, a column signal processing unit 204, and a control unit 205.

The pixel array unit 202 is formed with pixels 210 arranged in a two-dimensional grid pattern. Here, a pixel 210 generates an image signal in accordance with emitted light. The pixel 210 includes a photoelectric conversion unit that generates an electric charge in accordance with the emitted light. The pixel 210 further includes a pixel circuit. This pixel circuit generates an image signal based on the electric charge generated by the photoelectric conversion unit. The generation of the image signal is controlled by a control signal generated by the vertical drive unit 203 described later. In the pixel array unit 202, signal lines 206 and 207 are arranged in an X-Y matrix. The signal lines 206 are signal lines that transmit control signals for the pixel circuits in the pixels 210, are provided for the respective rows in the pixel array unit 202, and are designed to be shared by the pixels 210 aligned in each row. The signal lines 207 are signal lines that transmit image signals generated by the pixel circuits of the pixels 210, are provided for the respective columns in the pixel array unit 202, and are designed to be shared by the pixels 210 aligned in each column. These photoelectric conversion units and pixel circuits are formed in a semiconductor substrate.

The vertical drive unit 203 generates control signals for the pixel circuits of the pixels 210. This vertical drive unit 203 transmits the generated control signals to the pixels 210 via the signal lines 206 in the drawing. The column signal processing unit 204 processes image signals generated by the pixels 210. This column signal processing unit 204 processes the image signals transmitted from the pixels 210 via the signal lines 207 in the drawing. The processing at the column signal processing unit 204 corresponds to analog-to-digital conversion for converting analog image signals generated in the pixels 210 into digital image signals, for example. The image signals processed by the column signal processing unit 204 are output as image signals of the imaging apparatus 1. The control unit 204 controls the entire imaging apparatus 1. This control unit 205 generates and outputs control signals for controlling the vertical drive unit 203 and the column signal processing unit 204, to control the imaging device 20. The control signals generated by the control unit 205 are transmitted to the vertical drive unit 203 and the column signal processing unit 204 through signal lines 208 and 209, respectively.

<21. Example Application to a Camera>

The technology (the present technology) according to the present disclosure can be applied to various products. For example, the present technology may be embodied as an imaging device mounted in an imaging apparatus such as a camera.

Figure 48A:
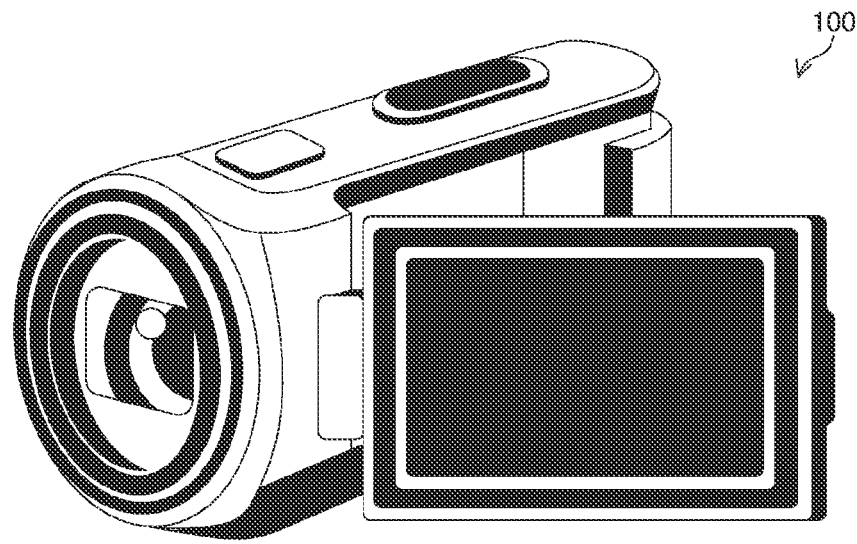
FIGS. 48A and 48B are diagrams showing a schematic example configuration of a camera that is an example of an imaging apparatus to which the present technology can be applied.
Figure 48B:
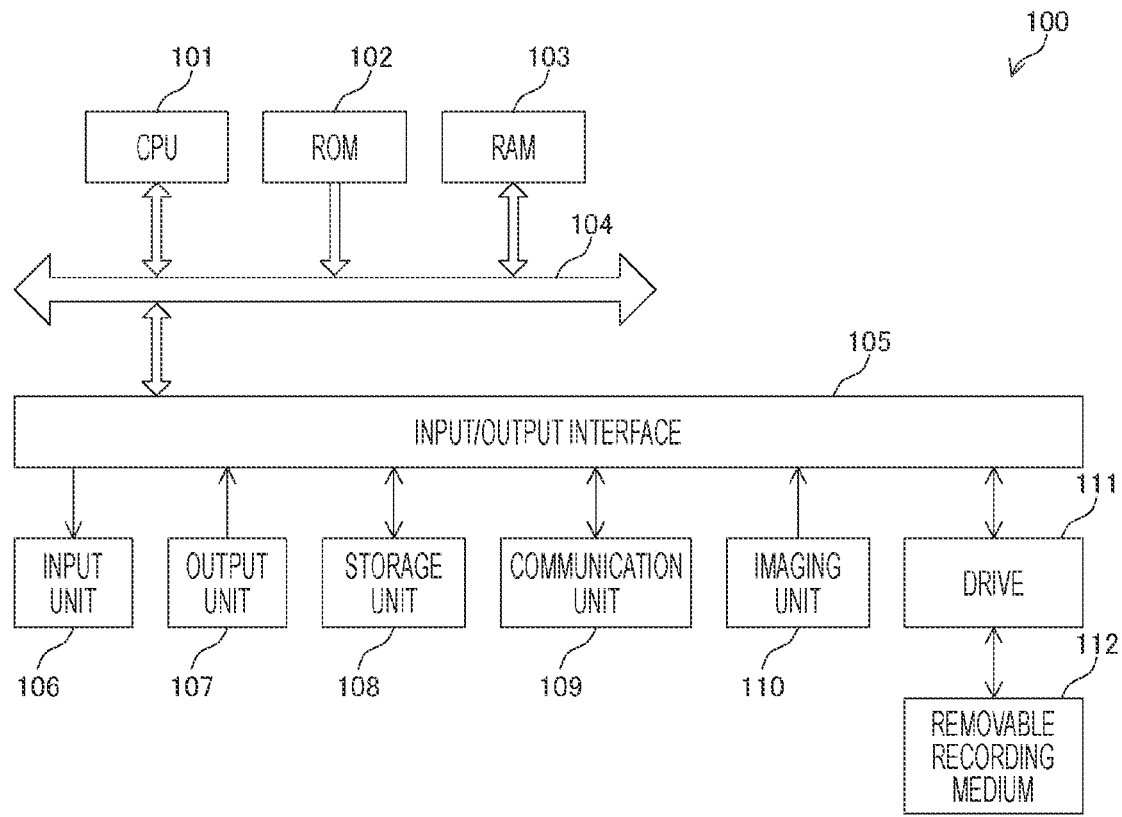

FIGS. 48A and 48B are diagrams showing a schematic example configuration of a camera that is an example of an imaging apparatus to which the present technology can be applied. In this drawing, FIG. 48A is a diagram showing the exterior of a camera 100. Further, FIG. 48B in the drawing is a block diagram showing an example configuration of the camera 100. The camera 100 includes a CPU 101, a ROM 102, a RAM 103, an input/output interface 105, an input unit 106, an output unit 107, a storage unit 108, a communication unit 109, an imaging unit 110, a drive 111, and a removable storage medium 112.

The CPU 101, the ROM 102, and the RAM 103 are connected to one another by a bus 104. Also, the input/output interface 105 is further connected to the bus 104. The input unit 106, the output unit 107, the storage unit 108, the communication unit 109, the imaging unit 110, and the drive 111 are further connected to the input/output interface 105.

The input unit 106 is formed with a keyboard and a mouse. The output unit 107 is formed with a display, a speaker, and the like. The storage unit 108 is formed with a hard disk and a semiconductor memory. The communication unit 109 is formed with a network interface or the like, for example. A plurality of imaging apparatuses 1 described with reference to FIG. 1 can be included in the imaging unit 110. An image generated by the imaging unit 110 is supplied to the CPU 101 via the input/output interface 105. The drive 111 drives the removable storage medium 112 such as a semiconductor memory.

In a system configured as above, the CPU 101 loads a program stored in the storage unit 108 into the RAM 103 via the input/output interface 105 and the bus 104, for example, and executes the program, so that the above described series of processes is performed. Also, the program can be installed into the storage unit 108 via the input/output interface 105 when the removable recording medium 112 is mounted on the drive 111. Alternatively, the program can also be received by the communication unit 109 via a wired or wireless transmission medium, such as a local area network, the Internet, or digital satellite broadcasting, and be then installed into the storage unit 108. Other than the above, the program can be installed beforehand into the ROM 102 or the storage unit 108.

Lastly, the explanation of each embodiment described above is an example of the present disclosure, and the present disclosure is not limited to the embodiments described above. Accordingly, other than the respective embodiments described above, various changes may of course be made depending on the design and the like, without departing from the technical idea according to the present disclosure.

Note that the present technology may also be embodied in the configurations described below.

(1) A semiconductor device including:
a semiconductor chip;
a circuit board that transmits a signal of the semiconductor chip;
a heat releasing plate on which the semiconductor chip is disposed, the heat releasing plate having an opening in a region on an outer side of a semiconductor chip placement region, the semiconductor chip placement region being a region in which the semiconductor chip is disposed;
an adhesive member that bonds the circuit board and the heat releasing plate to each other, the adhesive member being disposed in a region on an outer side of the opening on a surface of the heat releasing plate, the surface of the heat releasing plate being different from a surface on which the semiconductor chip is disposed; and
a conductive member that connects the semiconductor chip and the circuit board to each other via the opening.

(2) The semiconductor device according to (1), in which an air gap is formed between the heat releasing plate and the circuit board.

(3) The semiconductor device according to (1), in which the circuit board includes an electronic circuit that receives and transmits the transmitted signal.

(4) The semiconductor device according to (2), in which the circuit board contains an element forming the electronic circuit.

(5) The semiconductor device according to (2), in which the circuit board has a recess in which an element forming the electronic circuit is disposed.

(6) The semiconductor device according to (5), in which the circuit board has the recess having an opening in a surface close to the heat releasing plate.

(7) The semiconductor device according to any one of (1) to (6), further including a lid unit that is bonded to the heat releasing plate and covers the semiconductor chip.

(8) The semiconductor device according to (7), further including a lid locking portion that locks the semiconductor chip placement region to the lid unit.

(9) The semiconductor device according to any one of (1) to (8), in which the heat releasing plate has the semiconductor chip placement region in contact with the circuit board.

(10) The semiconductor device according to (9), further including:
a lid unit that is bonded to the heat releasing plate and covers the semiconductor chip; and
an elastic member that is disposed between the lid unit and the heat releasing plate, and presses the heat releasing plate, to bring the semiconductor chip placement region into contact with the circuit board.

(11) The semiconductor device according to (9), in which the heat releasing plate has a beam portion that is a region connecting a region on an outer side of the opening and a region on an inner side of the opening, the beam portion being obliquely positioned to bring the semiconductor chip placement region into contact with the circuit board.

(12) The semiconductor device according to (9), in which the heat releasing plate includes a protrusion that locks the semiconductor chip placement region to the circuit board, to bring the semiconductor chip placement region into contact with the circuit board.

(13) The semiconductor device according to any one of (1) to (12), in which the circuit board has a thick-film pad having a shape protruding from a surface, and the conductive member is connected to the thick-film pad.

(14) The semiconductor device according to any one of (1) to (13), in which the conductive member is formed with a metallic wire.

(15) The semiconductor device according to (14), further including a protective portion disposed on at least one of a connecting portion between the conductive member and the semiconductor chip, or a connecting portion between the conductive member and the circuit board.

(16) The semiconductor device according to (14), in which the conductive member is connected to the semiconductor chip after being connected to the circuit board.

(17) The semiconductor device according to any one of (1) to (15), in which the conductive member is formed with a flexible wiring plate.

(18) The semiconductor device according to (1), further including a circuit board locking portion that locks the semiconductor chip placement region to the circuit board.

(19) The semiconductor device according to any one of (1) to (17), in which the heat releasing plate has a heat releasing portion disposed on a different surface from a surface on which the semiconductor chip is disposed in the semiconductor chip placement region.

(20) The semiconductor device according to (19), in which the heat releasing portion is formed with a plurality of irregularities formed on the heat releasing plate.

(21) The semiconductor device according to (19), in which the heat releasing portion is formed by roughening a surface of the heat releasing plate.

(22) The semiconductor device according to any one of (1) to (21), in which the heat releasing plate has a blackened portion formed on a surface.

(23) The semiconductor device according to any one of (1) to (22), in which the circuit board has a blackened portion formed on a surface facing the heat releasing plate.

(24) The semiconductor device according to any one of (1) to (23), in which the heat releasing plate further has a second opening in a region in which the semiconductor chip is disposed.

(25) The semiconductor device according to any one of (1) to (24), in which the heat releasing plate further includes a vibration damping portion that reduces vibration of the semiconductor chip placement region.

(26) The semiconductor device according to any one of (1) to (25), further including a buffer portion disposed between the semiconductor chip placement region and the circuit board.

(27) An imaging apparatus including:
an imaging device;
a circuit board that transmits a signal of the imaging device;
a heat releasing plate on which the imaging device is disposed, the heat releasing plate having an opening in a region on an outer side of a semiconductor chip placement region, the semiconductor chip placement region being a region in which the imaging device is disposed;
an adhesive member that bonds the circuit board and the heat releasing plate to each other, the adhesive member being disposed in a region on an outer side of the opening on a surface of the heat releasing plate, the surface of the heat releasing plate being different from a surface on which the imaging device is disposed; and
a conductive member that connects the imaging device and the circuit board to each other via the opening.

(28) A method for manufacturing a semiconductor device, the method including:
a bonding step of bonding a circuit board and a heat releasing plate with an adhesive member, the circuit board exchanging signals with a semiconductor chip, the semiconductor chip being disposed on the heat releasing plate, the heat releasing plate having an opening in a region on an outer side of a region in which the semiconductor chip is disposed, the adhesive member being disposed in a region on an outer side of the opening on a different surface of the heat releasing plate from a surface on which the semiconductor chip is disposed;
a semiconductor chip placing step of placing the semiconductor chip on the bonded heat releasing plate; and
a connecting step of connecting the semiconductor chip and the circuit board with a conductive member via the opening.

REFERENCE SIGNS LIST

1 Imaging apparatus
10 Air gap
11 Adhesive member
12, 14, 204 Adhesive
13 Die bond material
15 Solder ball
20, 21 Imaging device
30 to 39 Heat releasing plate
40 to 45 Circuit board
50, 51 Conductive wire
52 Flexible wiring plate
60 to 64 Frame
70 to 72 Cover glass
81, 82, 85, 86 Locking portion
83, 303 Protrusion
84 Elastic member
87 ACF
88 Heat storage portion
91 Buffer portion
100 Camera
110 Imaging unit
202 Pixel array unit
203 Bump
210 Pixel
301, 312 to 315 Opening
302 Beam portion
304, 307, 308, 403, 702 Recess
309, 311, 405, 409, 611 Hole
310 Heat releasing portion
316, 318, 321 Vibration damping portion
319 Spring portion
320, 408 Blackened portion
350 Heat releasing plate
406 Pad
410 Sealing resin
501, 502 Connecting portion
503 Protective portion
603 Heat releasing fin
604 Protrusion
701 Roughened portion

The invention claimed is:
1. A semiconductor device, comprising:
a semiconductor chip;
a circuit board configured to transmit a signal of the semiconductor chip;
a heat releasing plate, wherein
the semiconductor chip is on the heat releasing plate, and
the heat releasing plate includes:
a semiconductor chip placement region and a first opening in a first region on an outer side of the semiconductor chip placement region, wherein
the semiconductor chip placement region is in contact with the circuit board, and
the semiconductor chip is on the semiconductor chip placement region; and
a protrusion configured to lock the semiconductor chip placement region to the circuit board so as to bring the semiconductor chip placement region into contact with the circuit board;
an adhesive member configured to bond the circuit board and the heat releasing plate, wherein
the adhesive member is in a region on an outer side of the first opening on a first surface of the heat releasing plate,
the first surface of the heat releasing plate is different from a second surface of the heat releasing plate, and
the semiconductor chip is on the second surface of the heat releasing plate; and
a conductive member configured to connect the semiconductor chip with the circuit board via the first opening.

2. The semiconductor device according to claim 1, further comprising an air gap, wherein the air gap is between the heat releasing plate and the circuit board.

3. The semiconductor device according to claim 1, wherein the circuit board includes an electronic circuit that is configured to receive and transmit the signal.

4. The semiconductor device according to claim 3, wherein the circuit board includes an element forming the electronic circuit.

5. The semiconductor device according to claim 3, wherein
the circuit board includes a recess, and
an element forming the electronic circuit is in the recess.

6. The semiconductor device according to claim 5, wherein the recess includes an opening in a surface adjacent to the heat releasing plate.

7. The semiconductor device according to claim 1, further comprising a lid unit that is bonded to the heat releasing plate and configured to cover the semiconductor chip.

8. The semiconductor device according to claim 7, further comprising a lid locking portion configured to lock the semiconductor chip placement region to the lid unit.

9. The semiconductor device according to claim 1, further comprising:
a lid unit that is bonded to the heat releasing plate and configured to cover the semiconductor chip; and
an elastic member between the lid unit and the heat releasing plate, wherein the elastic member is configured to press the heat releasing plate so as to bring the semiconductor chip placement region into contact with the circuit board.

10. The semiconductor device according to claim 1, wherein the heat releasing plate has a beam portion that is a specific region that connects the region on the outer side of the first opening and a region on an inner side of the opening, and the beam portion is obliquely positioned to bring the semiconductor chip placement region into contact with the circuit board.

11. The semiconductor device according to claim 1, wherein the circuit board has a thick-film pad having a shape protruding from a surface of the circuit board, and the conductive member is connected to the thick-film pad.

12. The semiconductor device according to claim 1, wherein the conductive member is a metallic wire.

13. The semiconductor device according to claim 12, further comprising a protective portion on at least one of a connecting portion between the conductive member and the semiconductor chip, or a connecting portion between the conductive member and the circuit board.

14. The semiconductor device according to claim 12, wherein the conductive member is connected to the semiconductor chip, and the connection of the semiconductor chip is based on connection of the semiconductor chip with the circuit board.

15. The semiconductor device according to claim 1, wherein the conductive member is a flexible wiring plate.

16. The semiconductor device according to claim 1, further comprising a circuit board locking portion configured to lock the semiconductor chip placement region to the circuit board.

17. The semiconductor device according to claim 1, wherein the heat releasing plate has a heat releasing portion on a different surface from the second surface on which the semiconductor chip is in the semiconductor chip placement region.

18. The semiconductor device according to claim 17, wherein the heat releasing portion includes a plurality of irregularities that is on the heat releasing plate.

19. The semiconductor device according to claim 17, wherein the heat releasing portion is based on roughening of the second surface of the heat releasing plate.

20. The semiconductor device according to claim 1, further comprising a blackened portion, wherein the blackened portion is on the first surface of the heat releasing plate.

21. The semiconductor device according to claim 1, wherein the circuit board has a blackened portion on a surface that faces the heat releasing plate.

22. The semiconductor device according to claim 1, wherein the heat releasing plate further includes a second opening in a second region, and the semiconductor chip is in the second region.

23. The semiconductor device according to claim 1, wherein the heat releasing plate further includes a vibration damping portion configured to reduce vibration of the semiconductor chip placement region.

24. The semiconductor device according to claim 1, further comprising a buffer portion between the semiconductor chip placement region and the circuit board.

25. An imaging apparatus, comprising:

an imaging device;

a circuit board configured to transmit a signal of the imaging device;

a heat releasing plate, wherein the imaging device is on the heat releasing plate, and the heat releasing plate includes:

a semiconductor chip placement region and an opening in a first region on an outer side of the semiconductor chip placement region, wherein the semiconductor chip placement region is in contact with the circuit board, and the imaging device is on the semiconductor chip placement region; and a protrusion configured to lock the semiconductor chip placement region to the circuit board so as to bring the semiconductor chip placement region into contact with the circuit board;

an adhesive member configured to bond the circuit board and the heat releasing plate, wherein the adhesive member is in a region on an outer side of the opening on a first surface of the heat releasing plate, the first surface of the heat releasing plate is different from a second surface of the heat releasing plate, and the imaging device is on the second surface; and a conductive member configured to connect the imaging device with the circuit board via the opening.

26. A method for manufacturing a semiconductor device, the method comprising:

bonding a circuit board and a heat releasing plate with an adhesive member;

exchanging signals, by the circuit board, with a semiconductor chip, wherein the semiconductor chip being disposed on the heat releasing plate, the heat releasing plate includes a first region and an opening in a second region on an outer side of the first region, the semiconductor chip is disposed in the first region, the first region is in contact with the circuit board, and the adhesive member being disposed in a region on an outer side of the opening on a different surface of the heat releasing plate from a surface on which the semiconductor chip is disposed;

locking the first region to the circuit board so as to bring the first region into contact with the circuit board;

placing the semiconductor chip on the bonded heat releasing plate; and connecting the semiconductor chip and the circuit board with a conductive member via the opening.

* * * * *